US011444106B2

(12) United States Patent
Kimura

(10) Patent No.: US 11,444,106 B2
(45) Date of Patent: Sep. 13, 2022

(54) SEMICONDUCTOR DEVICE, DISPLAY DEVICE, AND ELECTRONIC APPLIANCE

(71) Applicant: Semiconductor Energy Laboratory Co., Ltd., Atsugi (JP)

(72) Inventor: Hajime Kimura, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 45 days.

(21) Appl. No.: 17/151,750

(22) Filed: Jan. 19, 2021

(65) Prior Publication Data

US 2021/0249444 A1 Aug. 12, 2021

Related U.S. Application Data

(63) Continuation of application No. 16/291,080, filed on Mar. 4, 2019, now Pat. No. 10,903,244, which is a
(Continued)

(30) Foreign Application Priority Data

Jun. 30, 2005 (JP) .................... 2005-191145

(51) Int. Cl.
*H01L 27/12* (2006.01)
*G09G 3/3241* (2016.01)
(Continued)

(52) U.S. Cl.
CPC ......... *H01L 27/124* (2013.01); *G09G 3/3233* (2013.01); *G09G 3/3241* (2013.01);
(Continued)

(58) Field of Classification Search
CPC combination set(s) only.
See application file for complete search history.

(56) References Cited

U.S. PATENT DOCUMENTS 6,229,506 B1 5/2001 Dawson et al.
6,281,634 B1 8/2001 Yokoyama
(Continued)

FOREIGN PATENT DOCUMENTS

CN 001500226 A 5/2004
CN 001508612 A 6/2004
(Continued)

OTHER PUBLICATIONS

Shirasaki.T et al., "57.4L: Late-News Paper: Full-Color Polymer AM-OLED Using Ink-Jet and A-SI TFT Technologies", SID Digest '04 : SID International Symposium Digest of Technical Papers, 2004, vol. 35, pp. 1516-1519.
(Continued)

*Primary Examiner* — Tony Tran
(74) *Attorney, Agent, or Firm* — Fish & Richardson P.C.

(57) ABSTRACT

In case the size of the transistor is enlarged, power consumption of the transistor is increased. Thus, the present invention provides a display device capable of preventing a current from flowing to a display element in signal writing operation without varying potentials of power source lines for supplying a current to the display element per row. In setting a gate-source voltage of a transistor by applying a predetermined current to the transistor, a potential of a gate terminal of the transistor is adjusted so as to prevent a current from flowing to a load connected to a source terminal of the transistor. Therefore, a potential of a wire connected to the gate terminal of the transistor is differentiated from a potential of a wire connected to a drain terminal of the transistor.

18 Claims, 49 Drawing Sheets

Related U.S. Application Data continuation of application No. 15/496,092, filed on Apr. 25, 2017, now Pat. No. 10,224,347, which is a continuation of application No. 14/644,384, filed on Mar. 11, 2015, now Pat. No. 9,640,558, which is a continuation of application No. 12/716,840, filed on Mar. 3, 2010, now Pat. No. 8,981,443, which is a continuation of application No. 11/425,242, filed on Jun. 20, 2006, now Pat. No. 7,679,585.

(51) Int. Cl.
*G09G 3/3233* (2016.01)
*H01L 27/32* (2006.01)
*G09G 3/3266* (2016.01)
*G09G 3/36* (2006.01)

(52) U.S. Cl.
CPC ...... *H01L 27/1225* (2013.01); *H01L 27/1255* (2013.01); *H01L 27/3206* (2013.01); *H01L 27/3276* (2013.01); *G09G 3/3266* (2013.01); *G09G 3/3648* (2013.01); *G09G 2300/0842* (2013.01); *G09G 2310/0248* (2013.01); *G09G 2310/0262* (2013.01); *G09G 2310/08* (2013.01); *H01L 27/3244* (2013.01)

(56) References Cited

U.S. PATENT DOCUMENTS

| | | | |
|---|---|---|---|
| 6,346,730 B1 | 2/2002 | Kitakado et al. | |
| 6,429,599 B1 | 8/2002 | Yokoyama | |
| 6,433,486 B1 | 8/2002 | Yokoyama | |
| 6,476,419 B1 | 11/2002 | Yasuda | |
| 6,633,270 B2 | 10/2003 | Hashimoto | |
| 6,690,117 B2 | 2/2004 | Komiya | |
| 6,690,118 B2 | 2/2004 | Yokoyama | |
| 6,777,249 B2 | 8/2004 | Yamazaki | |
| 6,777,888 B2 | 8/2004 | Kondo | |
| 6,781,153 B2 | 8/2004 | Anzai | |
| 6,784,454 B2 | 8/2004 | Anzai | |
| 6,791,129 B2 | 9/2004 | Inukai | |
| 6,794,675 B1 | 9/2004 | Suzuki et al. | |
| 6,798,405 B2 | 9/2004 | Anzai | |
| 6,809,706 B2 | 10/2004 | Shimoda | |
| 6,825,496 B2 | 11/2004 | Yamazaki et al. | |
| 6,828,950 B2 | 12/2004 | Koyama | |
| 6,876,346 B2 | 4/2005 | Anzai et al. | |
| 6,885,146 B2 | 4/2005 | Yamazaki et al. | |
| 6,954,194 B2 | 10/2005 | Matsumoto et al. | |
| 6,989,805 B2 | 1/2006 | Inukai | |
| 6,995,517 B2 | 2/2006 | Yokoyama | |
| 6,995,520 B2 | 2/2006 | Inukai | |
| 6,998,788 B2 | 2/2006 | Sun | |
| 7,061,014 B2 | 6/2006 | Hosono et al. | |
| 7,064,346 B2 | 6/2006 | Kawasaki et al. | |
| 7,102,163 B2 | 9/2006 | Anzai | |
| 7,167,190 B2 | 1/2007 | Ito et al. | |
| 7,173,311 B2 | 2/2007 | Sato et al. | |
| 7,195,499 B2 | 3/2007 | Yamazaki | |
| 7,238,806 B2 | 7/2007 | Inoue et al. | |
| 7,242,024 B2 | 7/2007 | Yamazaki et al. | |
| 7,248,237 B2 | 7/2007 | Yamada et al. | |
| 7,256,421 B2 | 8/2007 | Yamazaki et al. | |
| 7,274,345 B2 | 9/2007 | Imamura et al. | |
| 7,282,782 B2 | 10/2007 | Hoffman et al. | |
| 7,286,122 B2 | 10/2007 | Jo | |
| 7,315,131 B2 | 1/2008 | Yokoyama | |
| 7,317,429 B2 | 1/2008 | Shirasaki et al. | |
| 7,323,356 B2 | 1/2008 | Hosono et al. | |
| 7,330,168 B2 | 2/2008 | Anzai | |
| 7,339,559 B2 | 3/2008 | Yokoyama | |
| 7,358,936 B2 | 4/2008 | Kobayashi et al. | |
| 7,378,882 B2 | 5/2008 | Kimura | |
| 7,382,342 B2 | 6/2008 | Uchino et al. | |
| 7,417,606 B2 | 8/2008 | Shirasaki | |
| 7,417,607 B2 | 8/2008 | Miyazawa | |
| 7,435,992 B2 | 10/2008 | Choi et al. | |
| 7,436,474 B2 | 10/2008 | Kim | |
| 7,528,812 B2 | 5/2009 | Tsuge et al. | |
| 7,611,779 B2 | 11/2009 | Kanno et al. | |
| 7,679,585 B2 | 3/2010 | Kimura | |
| 7,723,721 B2 | 5/2010 | Udagawa et al. | |
| 7,768,601 B2 | 8/2010 | Kim | |
| 7,808,002 B2 | 10/2010 | Yamazaki et al. | |
| 7,843,408 B2 | 11/2010 | Yamazaki et al. | |
| 7,868,331 B2 | 1/2011 | Ono et al. | |
| 7,875,889 B2 | 1/2011 | Choi et al. | |
| 7,915,409 B2 | 3/2011 | Inoue et al. | |
| 8,039,853 B2 | 10/2011 | Yamazaki et al. | |
| 8,059,068 B2 | 11/2011 | Kimura | |
| 8,120,031 B2 | 2/2012 | Yamazaki et al. | |
| 8,154,015 B2 | 4/2012 | Udagawa et al. | |
| 8,159,479 B2 | 4/2012 | Uchino et al. | |
| 8,237,179 B2 | 8/2012 | Yamazaki et al. | |
| 8,242,986 B2 | 8/2012 | Kimura | |
| 8,242,988 B2 | 8/2012 | Yamazaki et al. | |
| 8,278,444 B2 | 10/2012 | Inoue et al. | |
| 8,324,618 B2 | 12/2012 | Udagawa et al. | |
| 8,373,696 B2 | 2/2013 | Miyazawa | |
| 8,508,443 B2 | 8/2013 | Kimura | |
| 8,546,825 B2 | 10/2013 | Yamazaki et al. | |
| 8,569,486 B2 | 10/2013 | Inoue et al. | |
| 8,570,256 B2 | 10/2013 | Yamazaki et al. | |
| 8,648,338 B2 | 2/2014 | Udagawa et al. | |
| 8,779,431 B2 | 7/2014 | Yamazaki et al. | |
| 8,836,678 B2 | 9/2014 | Uchino et al. | |
| 8,952,385 B1 | 2/2015 | Yamazaki et al. | |
| 8,981,443 B2 | 3/2015 | Kimura | |
| 9,054,199 B2 | 6/2015 | Udagawa et al. | |
| 9,076,384 B2 | 7/2015 | Uchino et al. | |
| 9,147,358 B2 | 9/2015 | Uchino et al. | |
| 9,171,896 B2 | 10/2015 | Yamazaki et al. | |
| 9,219,236 B2 | 12/2015 | Inoue et al. | |
| 9,269,826 B2 | 2/2016 | Hosono et al. | |
| 9,324,775 B2 | 4/2016 | Yamazaki et al. | |
| 9,366,930 B2 | 6/2016 | Yamazaki et al. | |
| 9,570,007 B2 | 2/2017 | Uchino et al. | |
| 9,577,016 B2 | 2/2017 | Udagawa et al. | |
| 9,640,558 B2 | 5/2017 | Kimura | |
| 9,679,955 B2 | 6/2017 | Yamazaki et al. | |
| 9,905,624 B2 | 2/2018 | Udagawa et al. | |
| 9,911,383 B2 | 3/2018 | Uchino et al. | |
| 9,911,801 B2 | 3/2018 | Yamazaki et al. | |
| 9,947,803 B2 | 4/2018 | Hosono et al. | |
| 10,032,930 B2 | 7/2018 | Hosono et al. | |
| 10,032,931 B2 | 7/2018 | Hosono et al. | |
| 10,133,139 B2 | 11/2018 | Yamazaki et al. | |
| 10,170,041 B2 | 1/2019 | Uchino et al. | |
| 10,224,347 B2 | 3/2019 | Kimura | |
| 10,263,059 B2 | 4/2019 | Yamazaki et al. | |
| 10,527,903 B2 | 1/2020 | Yamazaki et al. | |
| 10,903,244 B2 | 1/2021 | Kimura | |
| 2002/0130827 A1 | 9/2002 | Maurice | |
| 2003/0015703 A1 | 1/2003 | Yamazaki et al. | |
| 2003/0016190 A1 | 1/2003 | Kondo | |
| 2003/0090481 A1 | 5/2003 | Kimura | |
| 2004/0012548 A1 | 1/2004 | Anzai | |
| 2004/0113873 A1 | 6/2004 | Shirasaki et al. | |
| 2004/0178720 A1 | 9/2004 | Lee et al. | |
| 2004/0246212 A1 | 12/2004 | Kobayashi et al. | |
| 2004/0246241 A1 | 12/2004 | Sato et al. | |
| 2004/0256617 A1* | 12/2004 | Yamada | G09G 3/3283 |
| | | | 315/169.3 |
| 2004/0257353 A1 | 12/2004 | Imamura et al. | |
| 2005/0007398 A1 | 1/2005 | Hirai | |
| 2005/0030264 A1 | 2/2005 | Tsuge et al. | |
| 2005/0035932 A1 | 2/2005 | Nishikawa et al. | |
| 2005/0039670 A1 | 2/2005 | Hosono et al. | |
| 2005/0041002 A1 | 2/2005 | Takahara et al. | |
| 2005/0052367 A1 | 3/2005 | Miyazawa | |
| 2005/0057459 A1 | 3/2005 | Miyazawa | |
| 2005/0057580 A1 | 3/2005 | Yamano et al. | |
| 2005/0104814 A1 | 5/2005 | Choi et al. | |

(56) References Cited

U.S. PATENT DOCUMENTS

| | | |
|---|---|---|
| 2005/0116967 A1 | 6/2005 | Shirasaki et al. |
| 2005/0253531 A1 | 11/2005 | Matsumoto et al. |
| 2006/0091793 A1 | 5/2006 | Baude et al. |
| 2006/0244107 A1 | 11/2006 | Sugihara et al. |
| 2007/0166843 A1 | 7/2007 | Yamazaki |
| 2007/0194379 A1 | 8/2007 | Hosono et al. |
| 2007/0296652 A1 | 12/2007 | Imamura et al. |
| 2009/0200556 A1 | 8/2009 | Hong et al. |
| 2009/0280600 A1 | 11/2009 | Hosono et al. |
| 2011/0063275 A1 | 3/2011 | Imamura et al. |
| 2013/0228783 A1 | 9/2013 | Kimura |
| 2018/0190745 A1 | 7/2018 | Udagawa et al. |
| 2019/0130829 A1 | 5/2019 | Uchino et al. |
| 2020/0150471 A1 | 5/2020 | Yamazaki et al. |

FOREIGN PATENT DOCUMENTS

| | | |
|---|---|---|
| CN | 001541035 A | 10/2004 |
| CN | 001551059 A | 12/2004 |
| CN | 001552050 A | 12/2004 |
| CN | 001578975 A | 2/2005 |
| EP | 1006586 A | 6/2000 |
| EP | 1006588 A | 6/2000 |
| EP | 1134811 A | 9/2001 |
| EP | 1150273 A | 10/2001 |
| EP | 1193676 A | 4/2002 |
| EP | 1237143 A | 9/2002 |
| EP | 1310937 A | 5/2003 |
| EP | 1310997 A | 5/2003 |
| EP | 1424674 A | 6/2004 |
| EP | 1434193 A | 6/2004 |
| EP | 1443130 A | 8/2004 |
| EP | 1450341 A | 8/2004 |
| EP | 1619570 A | 1/2006 |
| EP | 1690866 A | 8/2006 |
| EP | 1737044 A | 12/2006 |
| EP | 1459126 B | 1/2007 |
| EP | 1816634 A | 8/2007 |
| EP | 2226847 A | 9/2010 |
| EP | 2246894 A | 11/2010 |
| EP | 2302614 A | 3/2011 |
| EP | 2309479 A | 4/2011 |
| EP | 2336143 A | 6/2011 |
| EP | 2372684 A | 10/2011 |
| EP | 2413366 A | 2/2012 |
| JP | 05-251705 A | 9/1993 |
| JP | 2000-044236 A | 2/2000 |
| JP | 2000-150900 A | 5/2000 |
| JP | 2000-227771 A | 8/2000 |
| JP | 2000-231347 A | 8/2000 |
| JP | 2000-259349 A | 9/2000 |
| JP | 2000-276078 A | 10/2000 |
| JP | 2002-023697 A | 1/2002 |
| JP | 2002-032057 A | 1/2002 |
| JP | 2002-040961 A | 2/2002 |
| JP | 2002-076356 A | 3/2002 |
| JP | 2002-082644 A | 3/2002 |
| JP | 2002-175029 A | 6/2002 |
| JP | 2002-251167 A | 9/2002 |
| JP | 2002-289859 A | 10/2002 |
| JP | 2002-311857 A | 10/2002 |
| JP | 2003-022049 A | 1/2003 |
| JP | 2003-051384 A | 2/2003 |
| JP | 2003-058106 A | 2/2003 |
| JP | 2003-084686 A | 3/2003 |
| JP | 2003-108066 A | 4/2003 |
| JP | 2003-137692 A | 5/2003 |
| JP | 2003-173154 A | 6/2003 |
| JP | 2003-195810 A | 7/2003 |
| JP | 2003-208110 A | 7/2003 |
| JP | 2003-216110 A | 7/2003 |
| JP | 2003-224437 A | 8/2003 |
| JP | 2003-241687 A | 8/2003 |
| JP | 2003-323133 A | 11/2003 |
| JP | 2004-021219 A | 1/2004 |
| JP | 2004-029247 A | 1/2004 |
| JP | 2004-079509 A | 3/2004 |
| JP | 2004-103957 A | 4/2004 |
| JP | 2004-119219 A | 4/2004 |
| JP | 2004-258172 A | 9/2004 |
| JP | 2004-302319 A | 10/2004 |
| JP | 2004-311420 A | 11/2004 |
| JP | 2004-361424 A | 12/2004 |
| JP | 2004-361585 A | 12/2004 |
| JP | 2004-361753 A | 12/2004 |
| JP | 2005-004173 A | 1/2005 |
| JP | 2005-019353 A | 1/2005 |
| JP | 2005-033172 A | 2/2005 |
| JP | 2005-038661 A | 2/2005 |
| JP | 2005-077802 A | 3/2005 |
| JP | 2005-099714 A | 4/2005 |
| JP | 2005-099764 A | 4/2005 |
| JP | 2005-148418 A | 6/2005 |
| JP | 2005-164634 A | 6/2005 |
| JP | 2005-164894 A | 6/2005 |
| JP | 2005-172917 A | 6/2005 |
| JP | 2005-518557 | 6/2005 |
| JP | 2005-227562 A | 8/2005 |
| JP | 2005-354035 A | 12/2005 |
| JP | 2006-013433 A | 1/2006 |
| JP | 2006-066863 A | 3/2006 |
| JP | 2006-165527 A | 6/2006 |
| JP | 2004/112440 | 7/2006 |
| JP | 2018-036658 A | 3/2018 |
| JP | 6743203 | 8/2020 |
| KR | 2003-0040056 A | 5/2003 |
| KR | 2004-0023781 A | 3/2004 |
| KR | 2004-0051611 A | 6/2004 |
| KR | 2004-0084814 A | 10/2004 |
| TW | 200405257 | 4/2004 |
| TW | I233077 | 5/2005 |
| TW | I234127 | 6/2005 |
| WO | WO-2002/075709 | 9/2002 |
| WO | WO-2003/040441 | 5/2003 |
| WO | WO-2003/058328 | 7/2003 |
| WO | WO-2003/071511 | 8/2003 |
| WO | WO-2004/019314 | 3/2004 |
| WO | WO-2004/097543 | 11/2004 |
| WO | WO-2004/112440 | 12/2004 |
| WO | WO-2004/114391 | 12/2004 |
| WO | WO-2005/054261 | 6/2005 |
| WO | WO-2005/088726 | 9/2005 |

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Kamiya.T et al., "1a-F-5 Room temperature fabrication and carrier transport of amorphous semiconductor exhibiting large electron Hall mobilities > 10 cm2/Vs", (The 65th Autumn Meeting, 2004) The Japan Society of Applied Physics, Sep. 1, 2004, No. 2, p. 791.

Nomura.K et al., "31a-ZA-6 Carrier Transport in Transparent Amorphous Oxide Semiconductor InGaZnO4", (The 51st Spring Meeting,2004); The Japan Society of Applied Physics and Related Societies, Mar. 28, 2004, No. 2, p. 669.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

(56) References Cited

OTHER PUBLICATIONS

Chinese Office Action (Application No. 201010157048.5) dated Aug. 11, 2011.
Korean Office Action (Application No. 2011-0065240) dated Mar. 8, 2012.
Chinese Office Action (Application No. 201010157048.5) dated Jun. 13, 2012.
Chinese Office Action (Application No. 201010157048.5) dated Feb. 28, 2013.
Taiwanese Office Action (Application No. 95121428) dated May 22, 2013.
Korean Office Action (Application No. 2006-0060605) dated Jun. 22, 2013.
Chinese Office Action (Application No. 201010157048.5) dated Jul. 22, 2014.
Korean Office Action (Application No. 2015-0165489) dated Jan. 21, 2016.

* cited by examiner

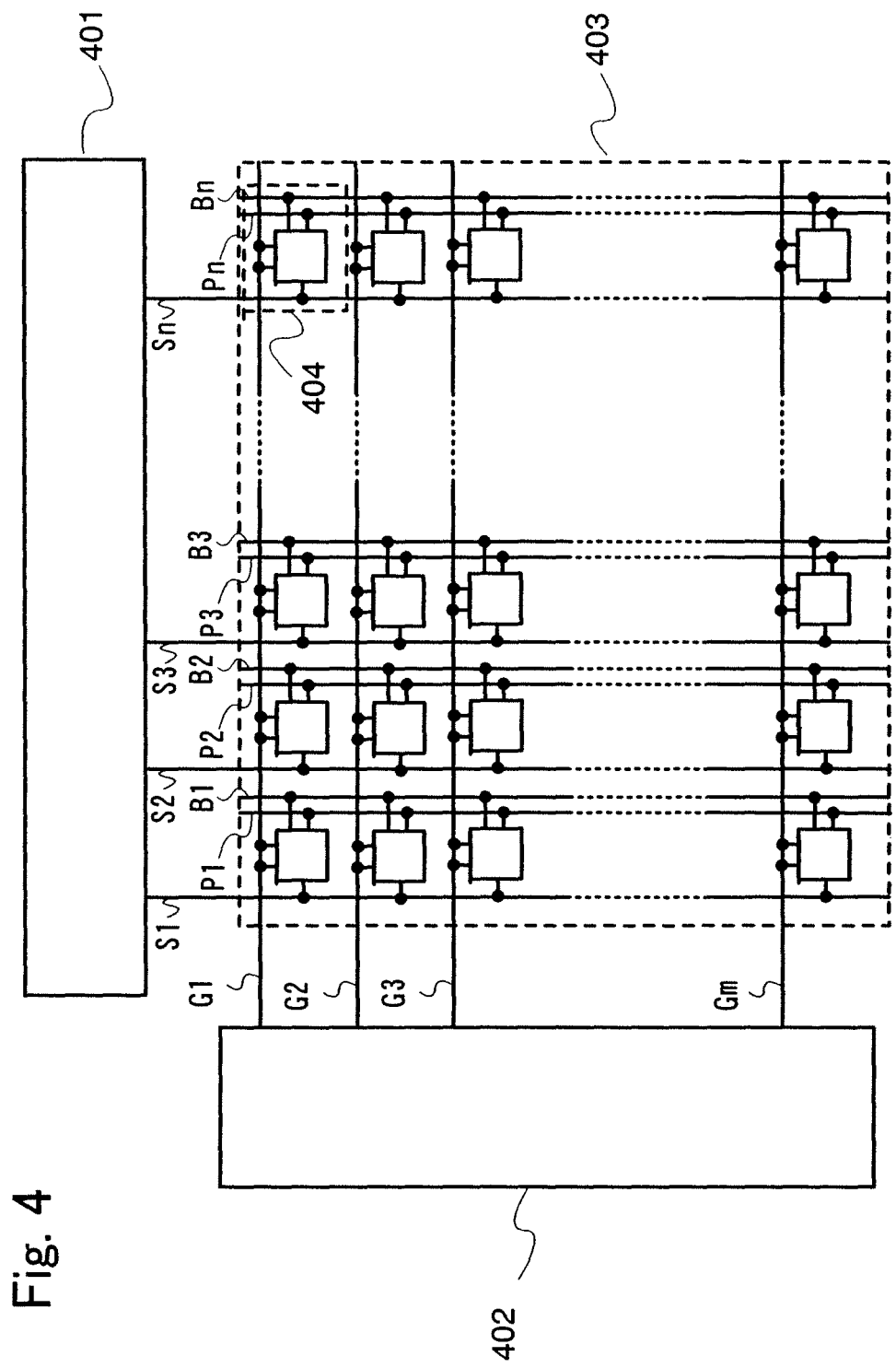

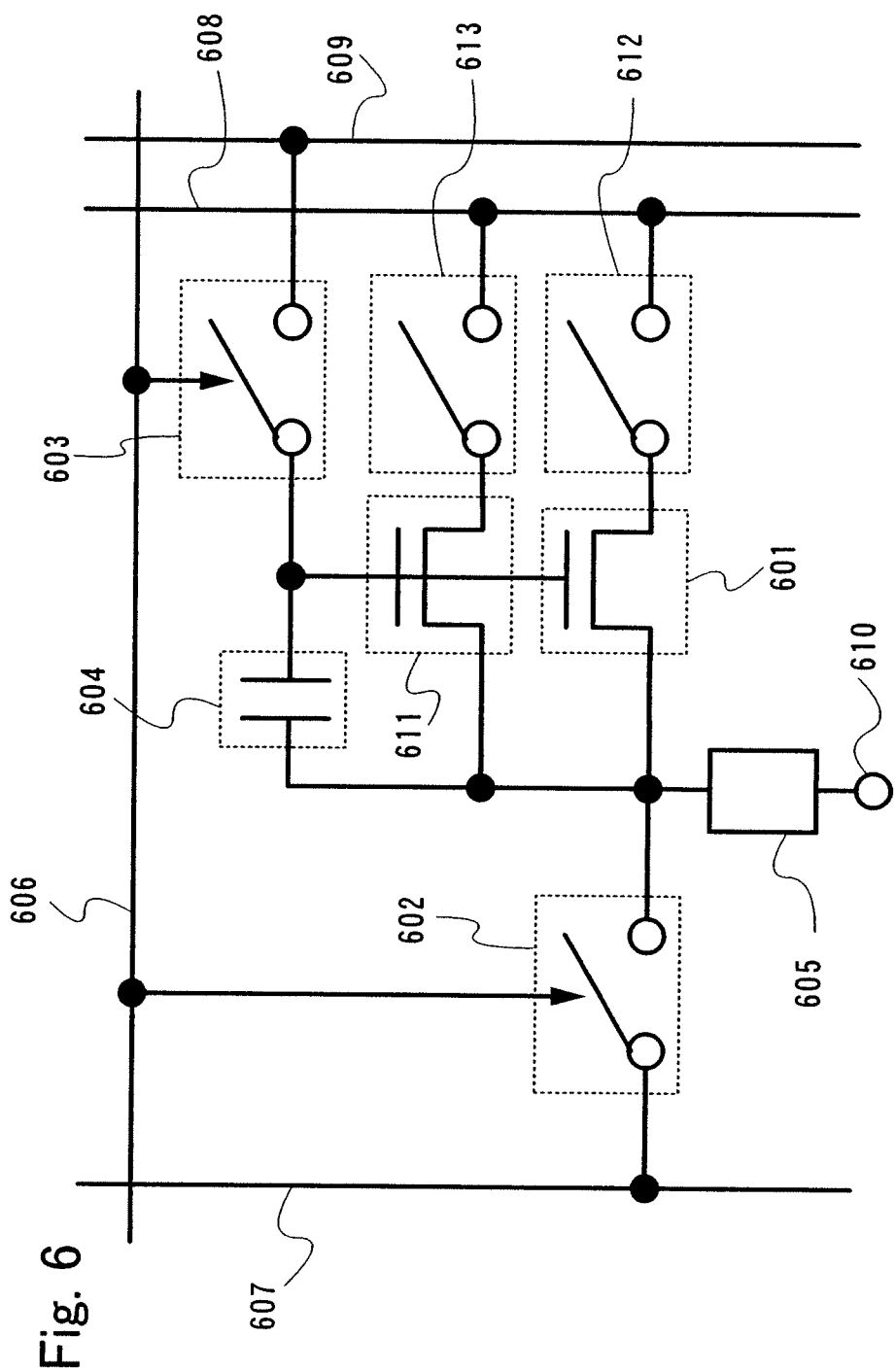

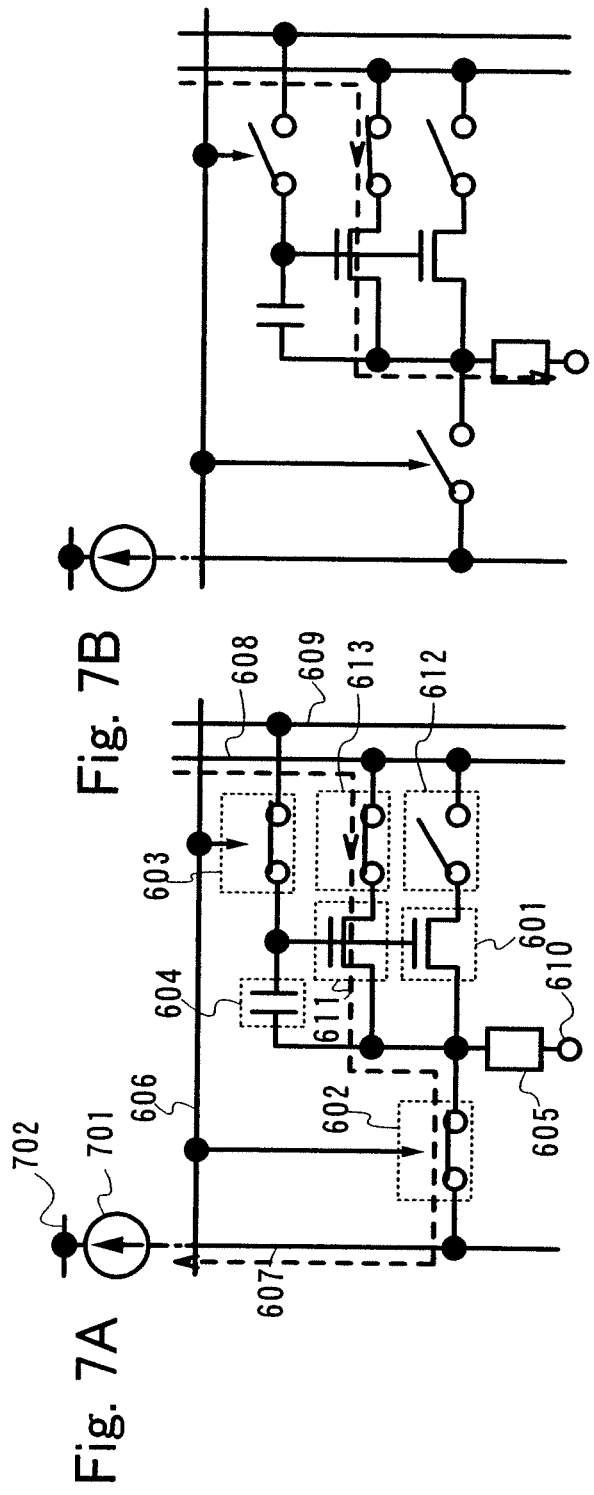
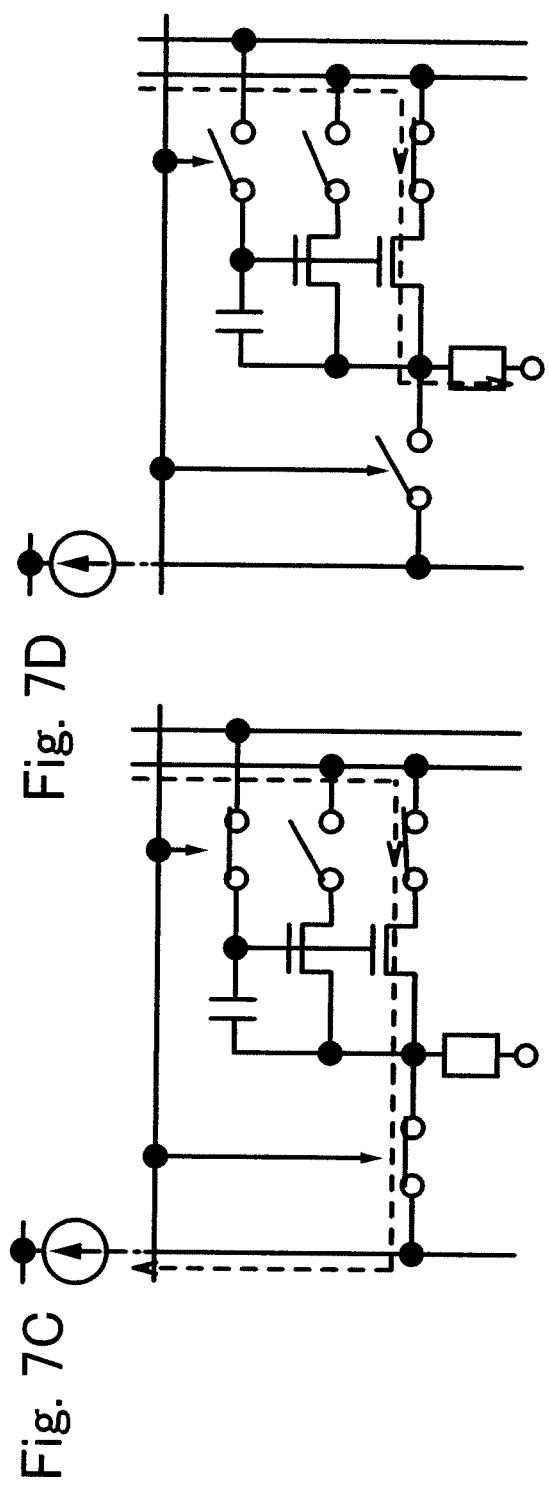
Fig. 7A
Fig. 7B
Fig. 7C
Fig. 7D

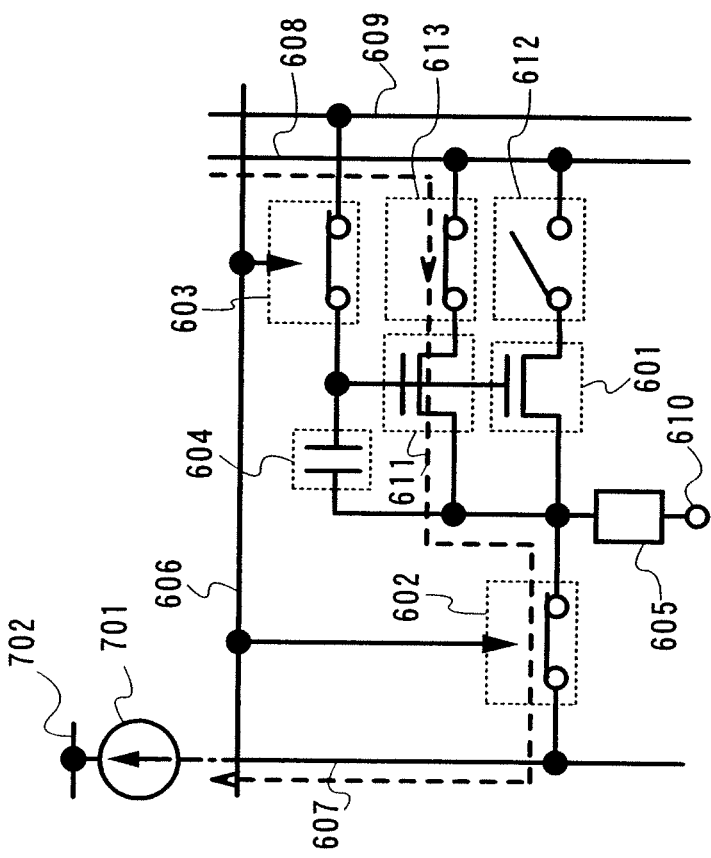
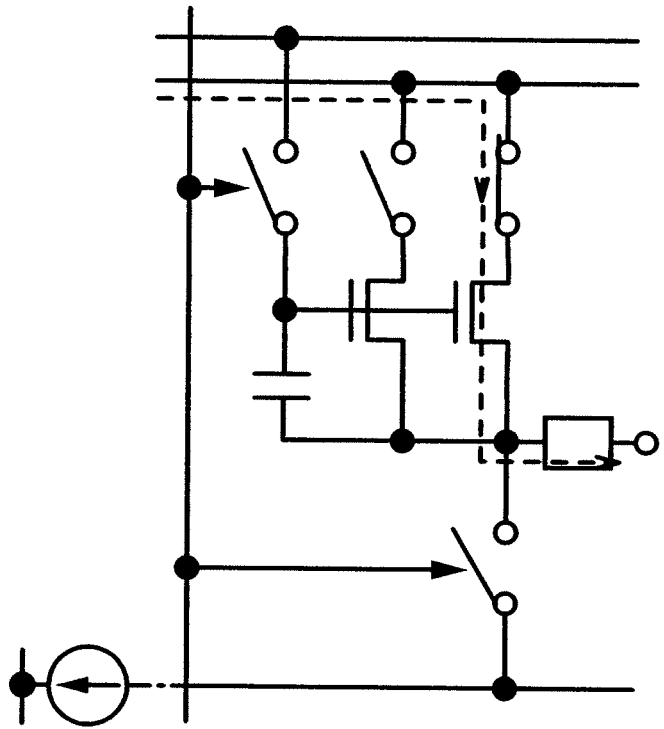
Fig. 9B
Fig. 9A

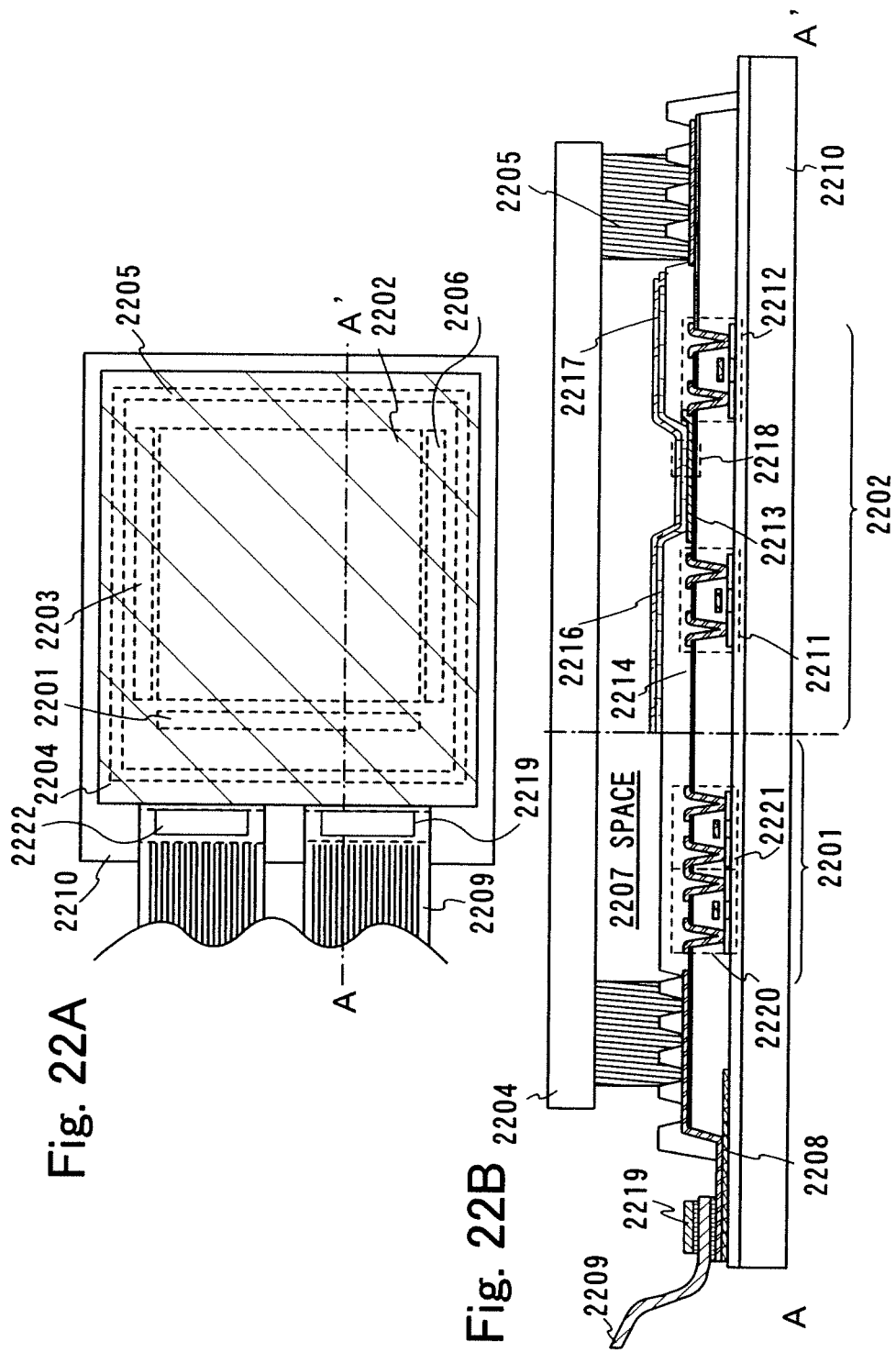

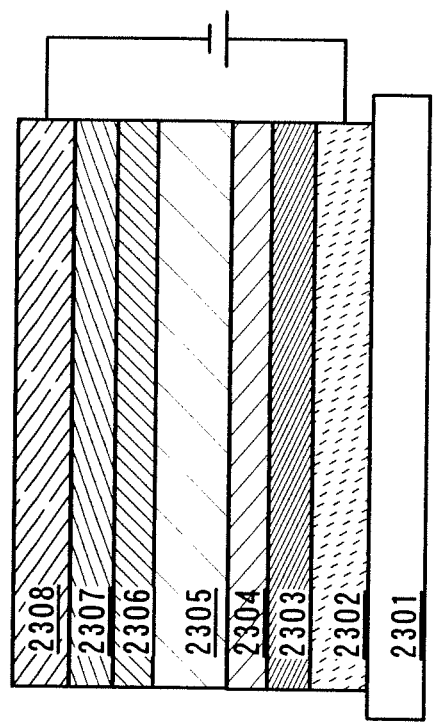
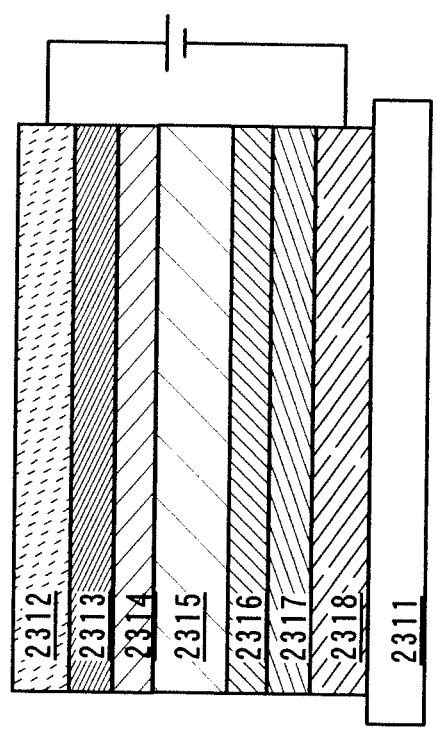
Fig. 23A
Fig. 23B

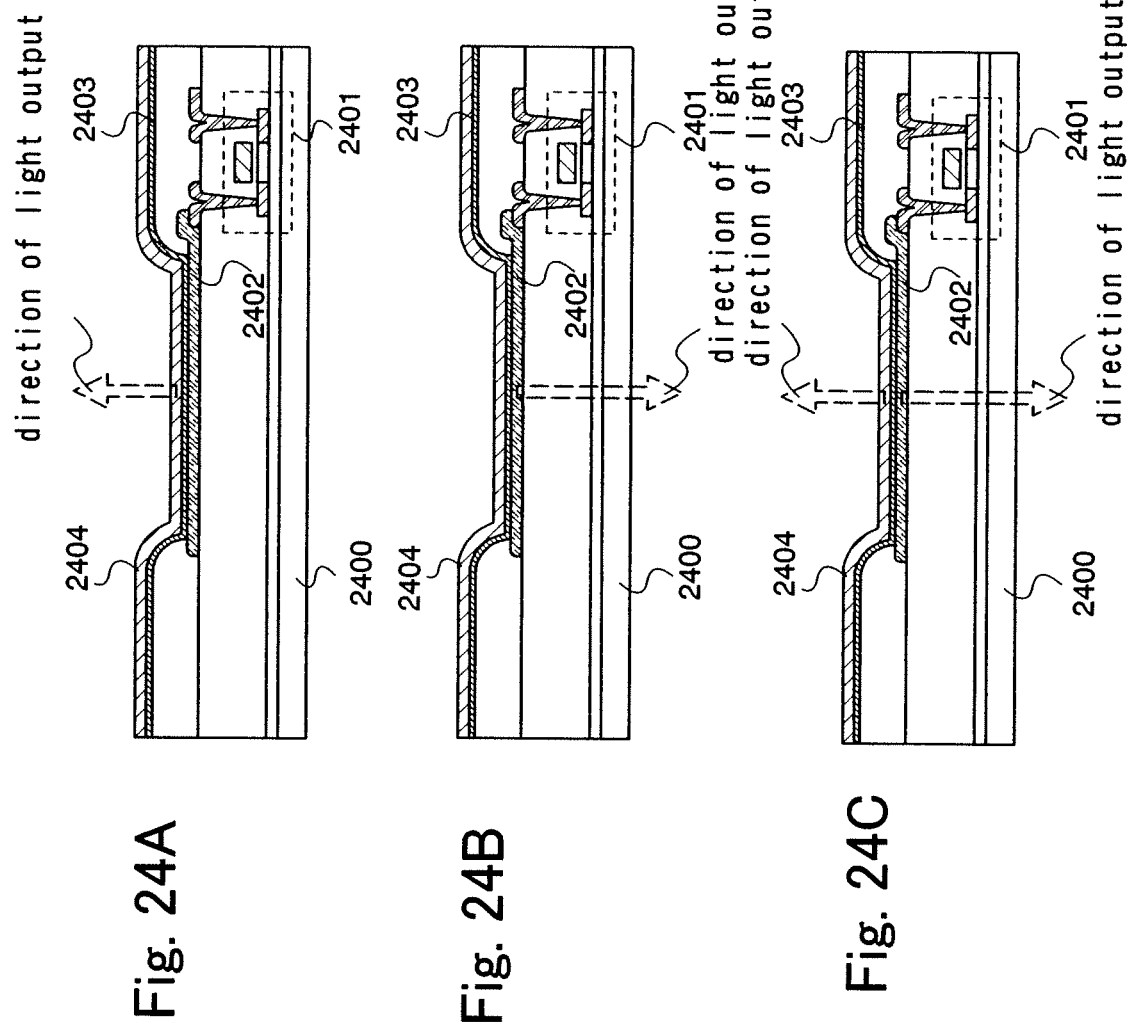

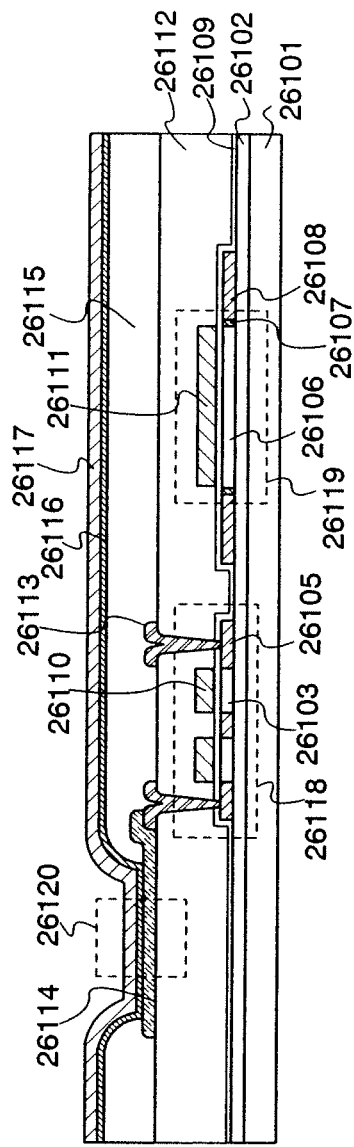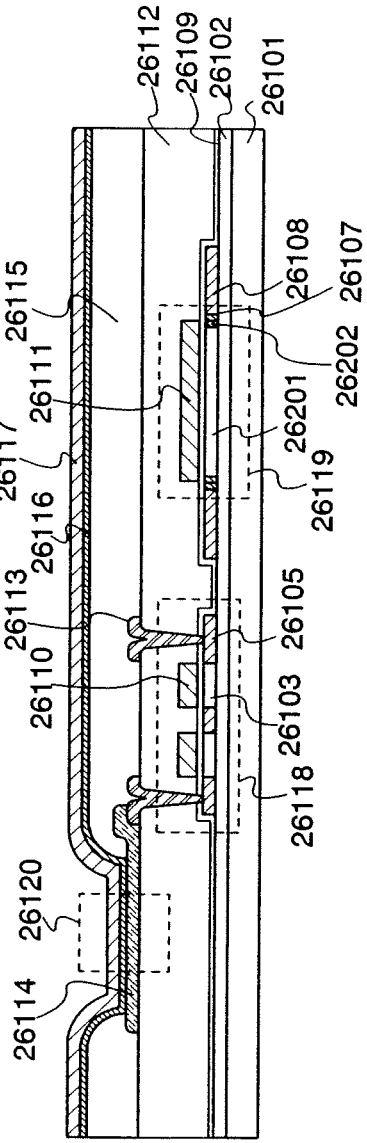

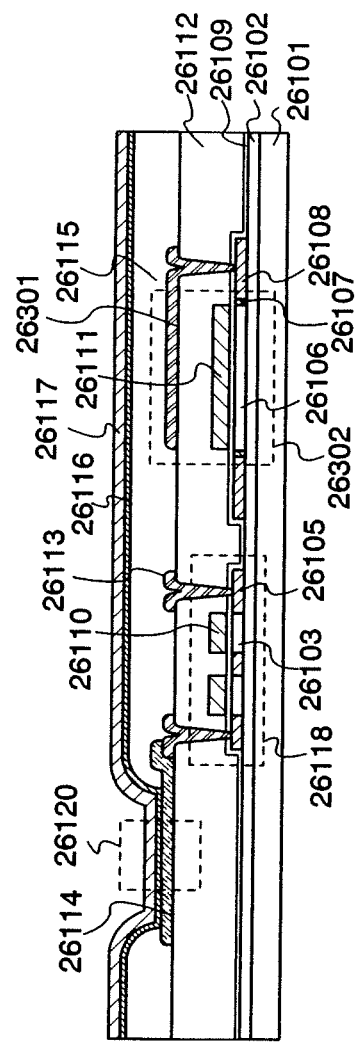
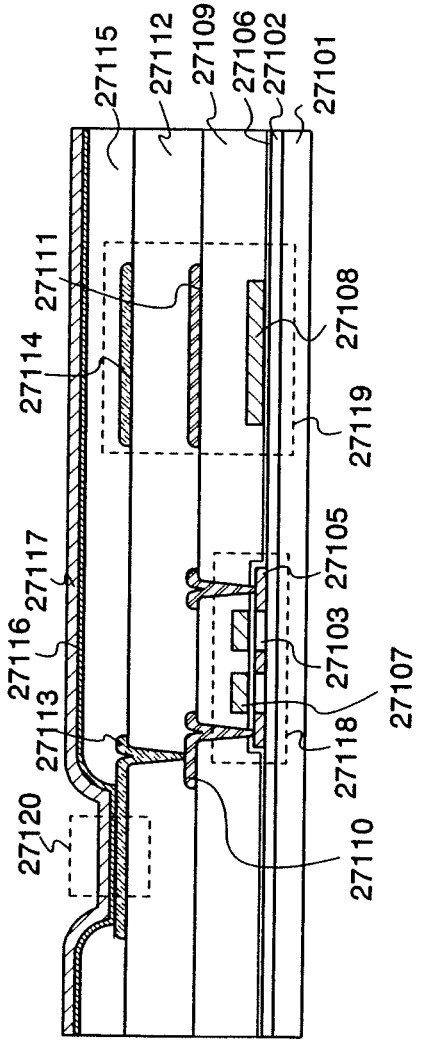
Fig. 27A
Fig. 27B

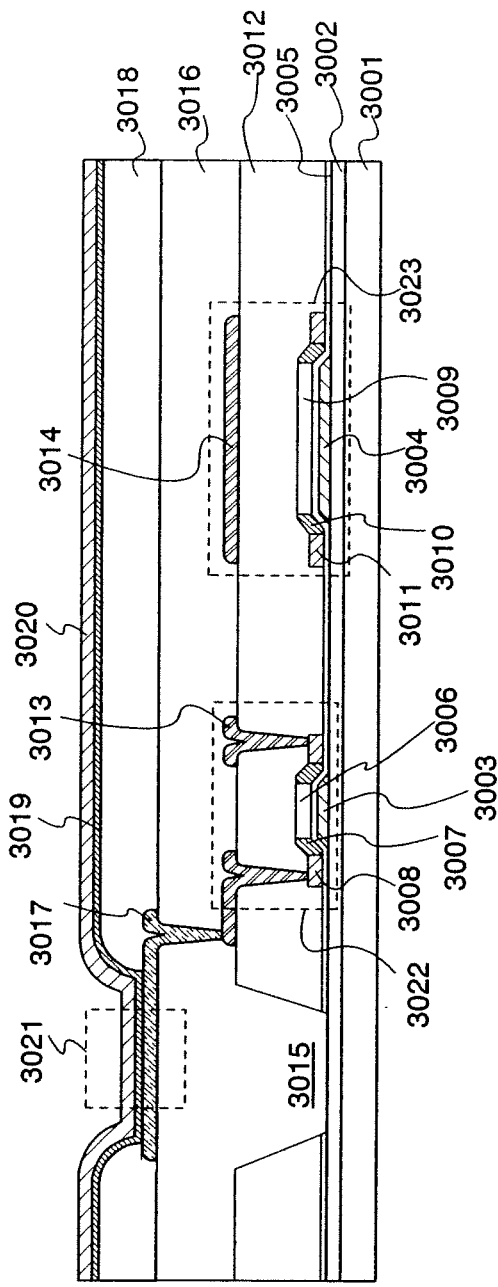
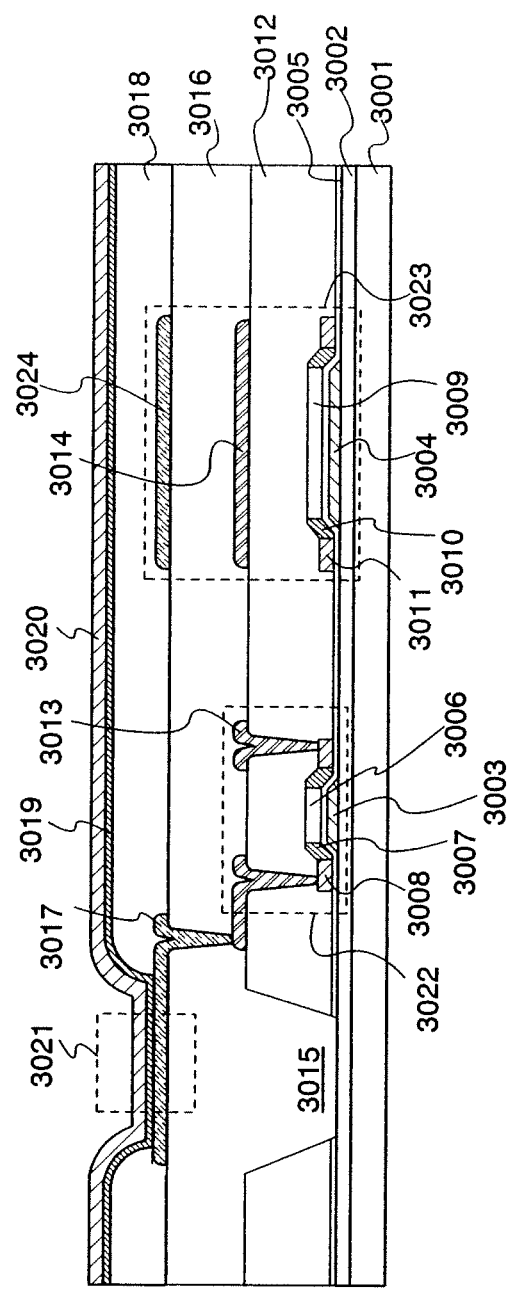
Fig. 30A
Fig. 30B

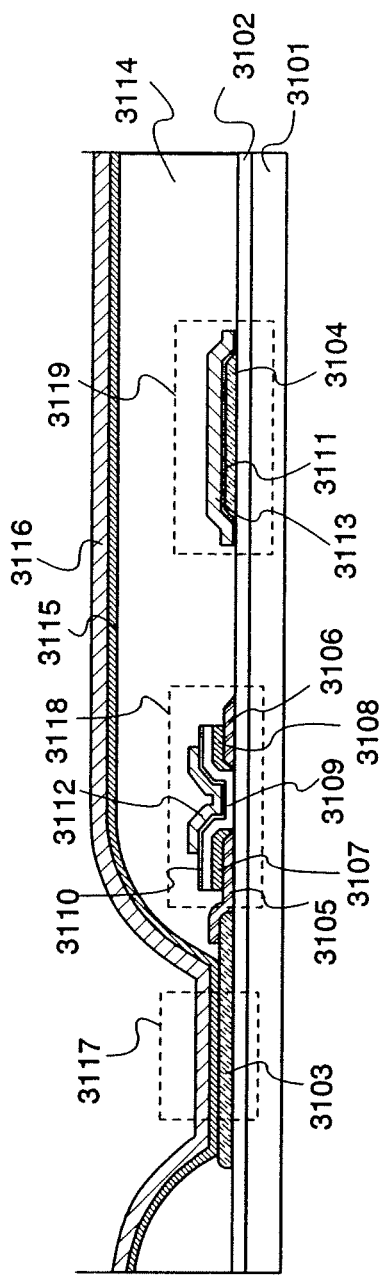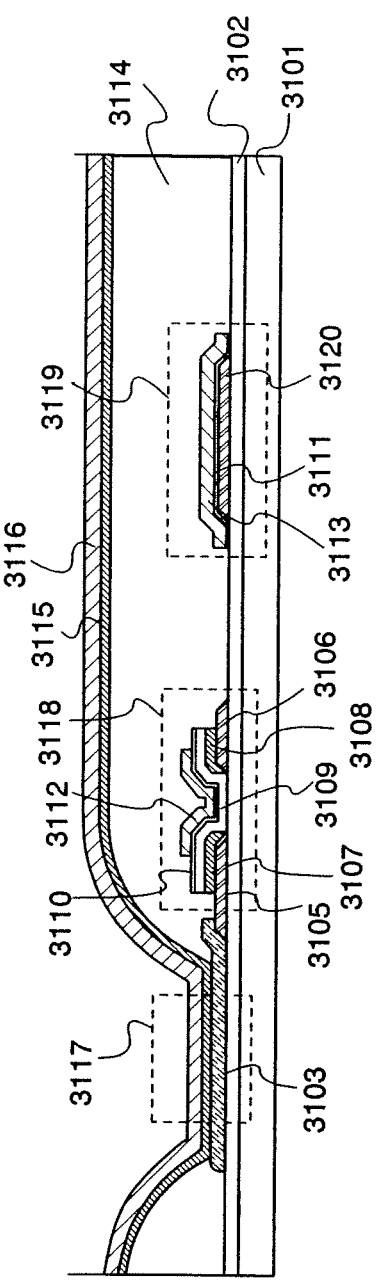
Fig. 31A
Fig. 31B

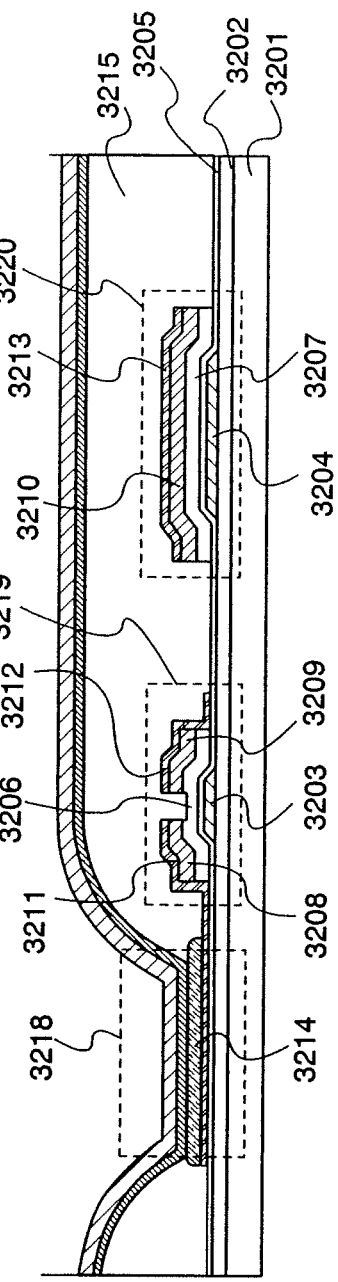
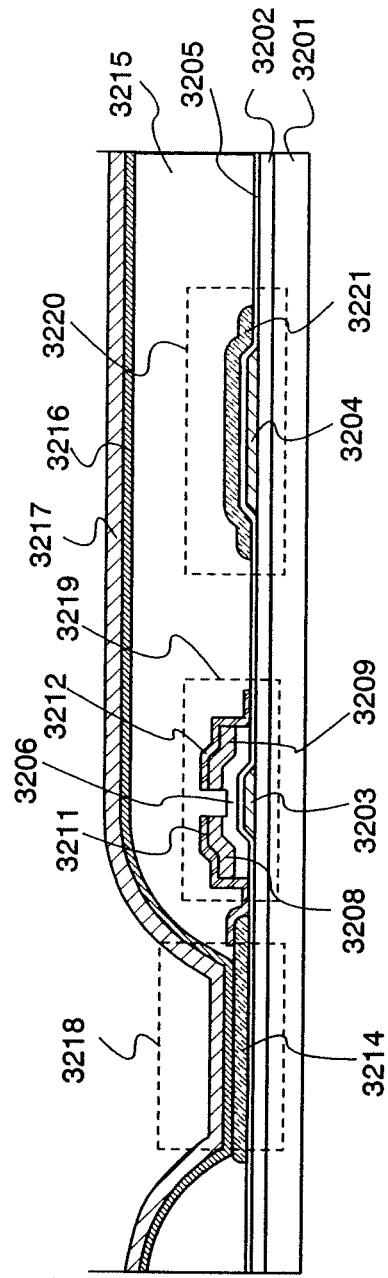
Fig. 32A
Fig. 32B

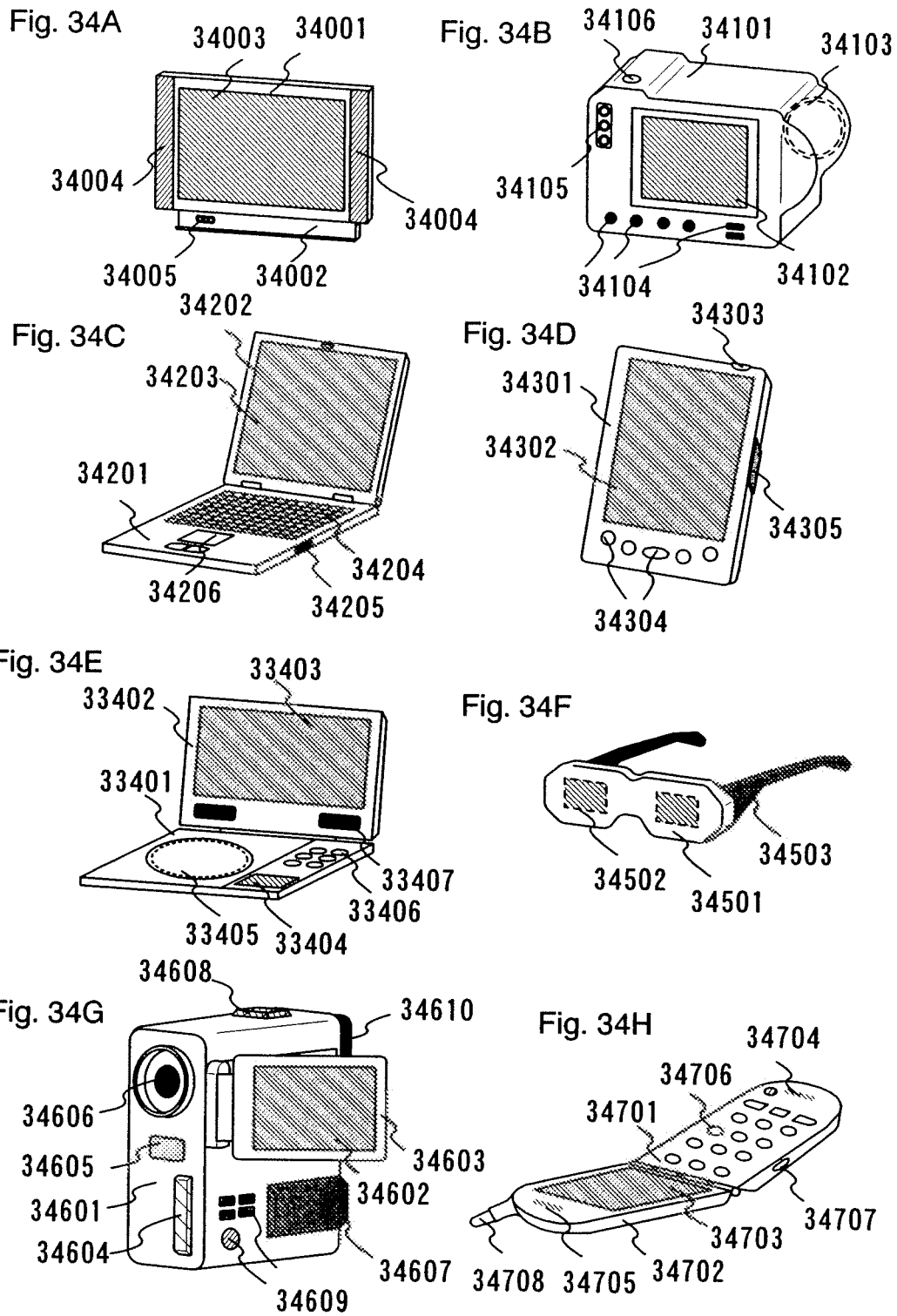

SEMICONDUCTOR DEVICE, DISPLAY DEVICE, AND ELECTRONIC APPLIANCE

CROSS-REFERENCE TO RELATED APPLICATIONS

This application is a continuation of U.S. application Ser. No. 16/291,080, filed Mar. 4, 2019, now allowed, which is a continuation of U.S. application Ser. No. 15/496,092, filed Apr. 25, 2017, now U.S. Pat. No. 10,224,347, which is a continuation of U.S. application Ser. No. 14/644,384, filed Mar. 11, 2015, now U.S. Pat. No. 9,640,558, which is a continuation of U.S. application Ser. No. 12/716,840, filed Mar. 3, 2010, now U.S. Pat. No. 8,981,443, which is a continuation of U.S. application Ser. No. 11/425,242, filed Jun. 20, 2006, now U.S. Pat. No. 7,679,585, which claims the benefit of a foreign priority application filed in Japan as Serial No. 2005-191145 on Jun. 30, 2005, all of which are incorporated by reference.

BACKGROUND OF THE INVENTION

1. Field of the Invention

The present invention relates to a semiconductor device having a function to control a current to be supplied to a load by a transistor, and a display device including a pixel formed of a current driven display element in which luminance is changed in accordance with a signal, and a signal line driver circuit and a scan line driver circuit for driving the pixel. Further, the present invention relates to a driving method of the display device. Furthermore, the present invention relates to an electronic appliance having the display device as a display portion.

2. Description of the Related Art

A liquid crystal display (LCD) which is a display device formed of a display element such as a liquid crystal is widely used. On the other hand, in recent years, a so-called self-light emitting display device having a pixel which is formed of a display element such as a light emitting diode (LED) has been attracting attention. As a display element used for such a self-light emitting display device, an organic light emitting diode (OLED) (also referred to as an organic EL element, electroluminescence (EL) element, or the like) has been attracting attentions, and they have been used for an EL display and the like. A display element such as an OLED is self-light emitting, therefore, it has advantages such as higher visibility of pixels, no backlight, and higher response compared to a liquid crystal display. Note that the luminance of a display element is generally controlled by a current value flowing through it.

As a driving method for expressing a gray scale of such a display device, there are a digital gray scale method and an analog gray scale method. By the digital gray scale method, a display element is turned on/off by being controlled in a digital manner to express a gray scale. In the case of the digital gray-scale method, the uniformity in luminance of each pixel is excellent; however, only two gray scale levels can be expressed if nothing is done since there are only two states, that is, light emission and non-light emission. Therefore, another method is used in combination to realize a multi-level gray scale. There is an area gray-scale method to express a gray scale by selecting the weighted light emission areas of pixels and a time gray-scale method to express a gray scale by selecting the weighted light emission time.

Further, in the case of the digital gray-scale method, a time gray-scale method which is appropriate for achieving high definition is often employed. On the other hand, as the analog gray-scale method, there are a method of controlling the light emission intensity of a display element in an analog manner, and a method of controlling the light emission time of a display element in an analog manner. As the analog gray scale method, often employed is a method to control light emission intensity of a display element in an analog manner. As the method to control light emission intensity in an analog manner, often employed is a current input current driving method which is hardly affected by variations in characteristics of a thin film transistor (hereinafter also referred to as a TFT) of each pixel.

A current input current driven pixel including a unipolar transistor, that is, a transistor having one of a p-channel polarity or an n-channel polarity is disclosed in Patent Document 1 and Non-Patent Document 1.

[Patent Document 1] Japanese Patent Laid-Open No. 2004-021219

[Non-Patent Document 1] SID 04 DIGEST p. 1516-p. 1519

SUMMARY OF THE INVENTION

According to Patent Document 1 and Non-Patent Document 1, potentials of power source lines for supplying a current to a display element are varied per row; thereby preventing a current from flowing to a display element when signals are written to pixels. If a current flows to a display element in signal writing operation, the signals cannot be correctly written to pixels. As a result, a display defect occurs.

Meanwhile, a large amount of current is required to be supplied to a light emitting element from the power source lines. Therefore, a switch capable of controlling a large amount of current is required to be disposed to supply the large amount of current while varying potentials of the power source lines per row. Because of this, it is a problem that the size of a transistor in a circuit is necessarily enlarged. If the size of the transistor is enlarged, power consumption of the transistor is increased.

Further, in the case of the prior structure as described in Non-Patent Document 1 and Patent Document 1, Vds=Vgs is satisfied in a transistor for driving a display element in signal writing operation. On the other hand, in light emission operation, Vds>Vgs is satisfied. Therefore, when constant current characteristics (flatness of current) in a saturation region are deteriorated, a current value significantly varies between in the signal writing operation and in the light emitting operation.

Thus, the present invention provides a display device capable of preventing a current from flowing to a display element in signal writing operation without varying potentials of power source lines for supplying a current to the display element per row.

In the present invention, in setting a gate-source voltage of a transistor by applying a predetermined current to the transistor, a potential of a gate terminal of the transistor is adjusted so as to prevent a current from flowing to a load connected to a source terminal of the transistor. Therefore, a potential of a wire connected to the gate terminal of the transistor is differentiated from a potential of a wire connected to a drain terminal of the transistor.

That is to say, the potential of the gate terminal of the transistor is set to be higher or lower than the potential of the drain terminal of the transistor, thereby adjusting a potential of a source terminal of the transistor, and preventing a current from flowing to the load.

Hereinafter, specific structures are described.

A semiconductor device of the present invention includes a transistor, a first switch, a second switch, a capacitor, a first wire, a second wire, a third wire, and a load. A first terminal of the transistor is connected to the first wire through the first switch, a second terminal of the transistor is connected to the second wire, and a gate terminal of the transistor is connected to the third wire through the second switch. The capacitor is connected between the gate terminal and the first terminal of the transistor. The load is connected to the first terminal of the transistor.

Further, in the semiconductor device of the present invention having the above structure, a predetermined potential is inputted to the second wire and the third wire.

A semiconductor device of the present invention includes a transistor, a first switch, a second switch, a capacitor, a first wire, a second wire, a third wire, and a load. A first terminal of the transistor is connected to the first wire through the first switch, a second terminal of the transistor is connected to the second wire, and a gate terminal of the transistor is connected to the third wire through the second switch. The capacitor is connected between the gate terminal and the first terminal of the transistor. The load is connected to the first terminal of the transistor. A potential of the third wire is lower than that of the second wire.

A semiconductor device of the present invention includes a transistor, a first switch, a second switch, a capacitor, a first wire, a second wire, a third wire, and a load. A first terminal of the transistor is connected to the first wire through the first switch, a second terminal of the transistor is connected to the second wire, and a gate terminal of the transistor is connected to the third wire through the second switch. The capacitor is connected between the gate terminal and the first terminal of the transistor. The load is connected to the first terminal of the transistor. A predetermined potential is inputted to the second wire and the third wire. When the first switch and the second switch are turned on and a current flows to the first wire, a current flows to the transistor and does not flow to the load. Meanwhile, when the first switch and the second switch are turned off, a current flows to the transistor and the load.

A semiconductor device of the present invention includes a first transistor, a second transistor, a third transistor, a capacitor, a first wire, a second wire, a third wire, a fourth wire, and a load. A first terminal, a second terminal, and a gate terminal of the first transistor are connected to a second terminal of the second transistor, the third wire, and a first terminal of the third transistor respectively. A gate terminal and a first terminal of the second transistor are connected to the first wire and the second wire respectively. A gate terminal and a second terminal of the third transistor are connected to the first wire and the fourth wire respectively. The capacitor is connected between the gate terminal and the first terminal of the first transistor. The load is connected to the first terminal of the first transistor.

Further, in the semiconductor device of the present invention having the above structure, a predetermined potential is inputted to the third wire and the fourth wire.

A semiconductor device of the present invention includes a first transistor, a second transistor, a third transistor, a capacitor, a first wire, a second wire, a third wire, a fourth wire, and a load. A first terminal, a second terminal, and a gate terminal of the first transistor are connected to a second terminal of the second transistor, the third wire, and a first terminal of the third transistor respectively. A gate terminal and a first terminal of the second transistor are connected to the first wire and the second wire respectively. A gate terminal and a second terminal of the third transistor are connected to the first wire and the fourth wire respectively. The capacitor is connected between the gate terminal and the first terminal of the first transistor. The load is connected to the first terminal of the first transistor. A potential of the fourth wire is lower than that of the third wire.

A semiconductor device of the present invention includes a first transistor, a second transistor, a third transistor, a capacitor, a first wire, a second wire, a third wire, a fourth wire, and a load. A first terminal, a second terminal, and a gate terminal of the first transistor are connected to a second terminal of the second transistor, the third wire, and a first terminal of the third transistor respectively. A gate terminal and a first terminal of the second transistor are connected to the first wire and the second wire respectively. A gate terminal and a second terminal of the third transistor are connected to the first wire and the fourth wire respectively. The capacitor is connected between the gate terminal and the first terminal of the first transistor. The load is connected to the first terminal of the first transistor. When the second transistor and the third transistor are turned on by a signal inputted to the first wire and a current flows to the first wire, a current flows to the first transistor and does not flow to the load. Meanwhile, when the second transistor and the third transistor are turned off, a current flows to the first transistor and the load.

A display device of the present invention includes a first transistor, a second transistor, a third transistor, a capacitor, a first wire, a second wire, a third wire, a fourth wire, and a light emitting element having a light emitting layer between a pixel electrode and an opposed electrode. A first terminal, a second terminal, and a gate terminal of the first transistor are connected to a second terminal of the second transistor, the third wire, and a first terminal of the third transistor respectively. A gate terminal and a first terminal of the second transistor are connected to the first wire and the second wire respectively. A gate terminal and a second terminal of the third transistor are connected to the first wire and the fourth wire respectively. The capacitor is connected between the gate terminal and the first terminal of the first transistor. The pixel electrode of the light emitting element is connected to the first terminal of the first transistor.

Further, in the display device of the present invention having the above structure, a predetermined potential is inputted to the third wire and the fourth wire.

A display device of the present invention includes a first transistor, a second transistor, a third transistor, a capacitor, a first wire, a second wire, a third wire, a fourth wire, and a light emitting element having a light emitting layer between a pixel electrode and an opposed electrode. A first terminal, a second terminal, and a gate terminal of the first transistor are connected to a second terminal of the second transistor, the third wire, and a first terminal of the third transistor respectively. A gate terminal and a first terminal of the second transistor are connected to the first wire and the second wire respectively. A gate terminal and a second terminal of the third transistor are connected to the first wire and the fourth wire respectively. The capacitor is connected between the gate terminal and the first terminal of the first transistor. The pixel electrode of the light emitting element is connected to the first terminal of the first transistor. A potential of the fourth wire is lower than that of the third wire.

A display device of the present invention includes a first transistor, a second transistor, a third transistor, a capacitor, a first wire, a second wire, a third wire, a fourth wire, and a light emitting element having a light emitting layer between a pixel electrode and an opposed electrode. A first terminal, a second terminal, and a gate terminal of the first transistor are connected to a second terminal of the second transistor, the third wire, and a first terminal of the third transistor respectively. A gate terminal and a first terminal of the second transistor are connected to the first wire and the second wire respectively. A gate terminal and a second terminal of the third transistor are connected to the first wire and the fourth wire respectively. The capacitor is connected between the gate terminal and the first terminal of the first transistor. The pixel electrode of the light emitting element is connected to the first terminal of the first transistor. When the second transistor and the third transistor are turned on by a signal inputted to the first wire and a current flows to the first wire, a current flows to the first transistor and does not flow to the light emitting element. Meanwhile, when the second transistor and the third transistor are turned off, a current flows to the first transistor and the light emitting element.

A display device of the present invention includes a first transistor, a second transistor, a third transistor, a capacitor, a first wire, a second wire, a third wire, a fourth wire, and a light emitting element having a light emitting layer between a pixel electrode and an opposed electrode. A first terminal, a second terminal, and a gate terminal of the first transistor are connected to a second terminal of the second transistor, the third wire, and a first terminal of the third transistor respectively. A gate terminal and a first terminal of the second transistor are connected to the first wire and the second wire respectively. A gate terminal and a second terminal of the third transistor are connected to the first wire and the fourth wire respectively. The capacitor is connected between the gate terminal and the first terminal of the first transistor. The pixel electrode of the light emitting element is connected to the first terminal of the first transistor. A potential of the fourth wire is equal to that of the opposed electrode.

A display device of the present invention includes a scan line driver circuit, a signal line driver circuit, and a pixel portion. The pixel portion includes a plurality of scan lines extended from the scan line driver circuit, a plurality of signal lines extended from the signal line driver circuit, and a plurality of pixels arranged in matrix corresponding to the scan lines and the signal lines. Each of the pixels includes a first transistor, a second transistor, a third transistor, a capacitor, a scan line, a signal line, a power source line, a bias line, and a light emitting element having a light emitting layer between a pixel electrode and an opposed electrode. A first terminal, a second terminal, and a gate terminal of the first transistor are connected to a second terminal of the second transistor, the power source line, and a first terminal of the third transistor respectively. A gate terminal and a first terminal of the second transistor are connected to the scan line and the signal line respectively. A gate terminal and a second terminal of the third transistor are connected to the scan line and the bias line respectively. The capacitor is connected between the gate terminal and the first terminal of the first transistor. The pixel electrode of the light emitting element is connected to the first terminal of the first transistor.

A display device of the present invention includes a scan line driver circuit, a signal line driver circuit, and a pixel portion. The pixel portion includes a plurality of scan lines extended from the scan line driver circuit, a plurality of signal lines extended from the signal line driver circuit, and a plurality of pixels arranged in matrix corresponding to the scan lines and the signal lines. Each of the pixels includes a first transistor, a second transistor, a third transistor, a capacitor, a scan line, a signal line, a power source line, a bias line, and a light emitting element having a light emitting layer between a pixel electrode and an opposed electrode. A first terminal, a second terminal, and a gate terminal of the first transistor are connected to a second terminal of the second transistor, the power source line, and a first terminal of the third transistor respectively. A gate terminal and a first terminal of the second transistor are connected to the scan line and the signal line respectively. A gate terminal and a second terminal of the third transistor are connected to the scan line and the bias line respectively. The capacitor is connected between the gate terminal and the first terminal of the first transistor. The pixel electrode of the light emitting element is connected to the first terminal of the first transistor. A potential of the bias line is lower than that of the power source line.

A display device of the present invention includes a scan line driver circuit, a signal line driver circuit, and a pixel portion. The pixel portion includes a plurality of scan lines extended from the scan line driver circuit, a plurality of signal lines extended from the signal line driver circuit, and a plurality of pixels arranged in matrix corresponding to the scan lines and the signal lines. Each of the pixels includes a first transistor, a second transistor, a third transistor, a capacitor, a scan line, a signal line, a power source line, a bias line, and a light emitting element having a light emitting layer between a pixel electrode and an opposed electrode. A first terminal, a second terminal, and a gate terminal of the first transistor are connected to a second terminal of the second transistor, the power source line, and a first terminal of the third transistor respectively. A gate terminal and a first terminal of the second transistor are connected to the scan line and the signal line respectively. A gate terminal and a second terminal of the third transistor are connected to the scan line and the bias line respectively. The capacitor is connected between the gate terminal and the first terminal of the first transistor. When the second transistor and the third transistor are turned on by a signal inputted to the scan line and a signal current flows to the signal line, a current flows to the first transistor and does not flow to the light emitting element. Meanwhile, when the second transistor and the third transistor are turned off, a current flows to the first transistor and the light emitting element.

A display device of the present invention includes a scan line driver circuit, a signal line driver circuit, and a pixel portion. The pixel portion includes a plurality of scan lines extended from the scan line driver circuit, a plurality of signal lines extended from the signal line driver circuit, and a plurality of pixels arranged in matrix corresponding to the scan lines and the signal lines. Each of the pixels includes a first transistor, a second transistor, a third transistor, a capacitor, a scan line, a signal line, a power source line, a bias line, and a light emitting element having a light emitting layer between a pixel electrode and an opposed electrode. A first terminal, a second terminal, and a gate terminal of the first transistor are connected to a second terminal of the second transistor, the power source line, and a first terminal of the third transistor respectively. A gate terminal and a first terminal of the second transistor are connected to the scan line and the signal line respectively. A gate terminal and a second terminal of the third transistor are connected to the scan line and the bias line respectively. The capacitor is connected between the gate terminal and the first terminal of the first transistor. The pixel electrode of the light emitting element is connected to the first terminal of the first transistor. A potential of the bias line is equal to that of the opposed electrode.

Further, in the display device of the present invention having the above structure, the first, second, and third transistors are n-channel transistors.

Further, in the display device of the present invention having the above structure, an amorphous semiconductor film is used for a semiconductor layer of the n-channel transistor.

A switch used in the invention may be any switch such as an electrical switch or a mechanical switch. That is, it may be anything as far as it can control a current flow and is not limited to a particular type. It may be a transistor, a diode (PN diode, PIN diode, Schottky diode, diode-connected transistor, or the like), or a logic circuit configured with them. Therefore, in the case of using a transistor as a switch, polarity (conductivity) thereof is not particularly limited because it operates just as a switch. However, when an off current is preferred to be small, a transistor of polarity with a small off current is preferably used. For example, a transistor which has an LDD region or a multi-gate structure has a small off current. Further, it is desirable that an n-channel transistor be employed when a potential of a source terminal of the transistor operating as a switch is closer to a low potential side power source (Vss, GND, 0 V or the like), and a p-channel transistor be employed when a potential of the source terminal is closer to the high potential side power source (Vdd or the like). This helps the switch operate efficiently since the absolute value of the gate-source voltage of the transistor can be increased. It is to be noted that a CMOS switch can also be applied by using both n-channel and p-channel transistors. With a CMOS switch, operation can be appropriately performed even when the situation changes such that a voltage outputted through a switch (that is, an input voltage to the switch) is higher or lower than an output voltage.

In the invention, "being connected" means "being electrically connected" and "being directly connected". Therefore, in the structure disclosed in the invention, another element which enables an electrical connection (for example, switch, transistor, capacitor, inductor, resistor, diode, or the like) may be provided in addition to the predetermined connection. Alternatively, a direct connection may be made without interposing another element. It is to be noted that when elements are connected without interposing another element which enables an electrical connection and connected not electrically but directly, it is referred to as "being directly connected". It is to be noted that "being electrically connected" means "being electrically connected" and "being directly connected".

Note that various modes can be applied to a display element. For example, a display medium in which contrast is changed by an electromagnetic effect can be used, such as an EL element (organic EL element, inorganic EL element, EL element containing organic material and inorganic material), an electron discharging element, a liquid crystal element, an electron ink, a light diffraction element, a discharging element, a digital micromirror device (DMD), a piezoelectric element, or a carbon nanotube. It is to be noted that an EL panel type display device using an EL element includes an EL display; a display device using an electron discharging element includes a field emission display (FED), an SED type flat panel display (Surface-conduction Electron-emitter Display), and the like; a liquid crystal panel type display device using a liquid crystal element includes a liquid crystal display; a digital paper type display device using an electron ink includes electronic paper; a display device using a light diffraction element includes a grating light valve (GLV) type display; a PDP (Plasma Display Panel) type display using a discharging element includes a plasma display; a DMD panel type display device using a micromirror element includes a digital light processing (DLP) type display device; a display device using a piezoelectric element includes a piezoelectric ceramic display; a display device using a carbon nanotube includes a nano emissive display (NED) and the like.

It is to be noted that transistors of various modes can be applied to a transistor of the invention. Therefore, kinds of transistors applicable to the invention are not limited. Accordingly, the following transistors are applicable to the invention: a thin film transistor (TFT) using a non-single crystalline semiconductor film typified by amorphous silicon and polycrystalline silicon; a MOS transistor which is formed using a semiconductor substrate or an SOI substrate; a junction transistor; a bipolar transistor; a transistor using a compound semiconductor such as ZnO or a-InGaZnO; a transistor using an organic semiconductor or a carbon nanotube; and other transistors. It is to be noted that a non-single crystalline semiconductor film may contain hydrogen or halogen. A substrate over which a transistor is provided is not limited to a particular type and various kinds of substrates can be used. Therefore, a transistor can be provided over, for example, a single crystalline substrate, an SOI substrate, a glass substrate, a quartz substrate, a plastic substrate, a paper substrate, a cellophane substrate, a stone substrate, a stainless steel substrate, a substrate having stainless steel foil, or the like. Further, a transistor formed over a certain substrate may be transferred to another substrate.

It is to be noted that a transistor can have structures of various modes and is not limited to a specific structure. For example, a multi-gate structure where the number of gates is two or more may be employed as well. With a multi-gate structure, an off current can be reduced and reliability can be improved by improving the pressure resistance of a transistor, and further flat characteristics can be obtained since a drain-source current does not change so much even when a drain-source voltage changes in the operation in a saturation region. Further, gate electrodes may be provided over and under a channel. Accordingly, a channel region increases, thereby a current value is increased or a subthreshold coefficient can be improved since a depletion layer is easily formed. Further, a gate electrode may be provided over or under the channel. Either a forward staggered structure or an inversely staggered structure may be employed. A channel region may be divided into a plurality of regions, or connected in parallel or in series. Further, a source electrode or a drain electrode may overlap a channel (or a part of it), thereby preventing a charge from being accumulated in a part of the channel and unstable operation. Further, an LDD region may be provided. By providing an LDD region, an off current can be reduced and reliability can be improved by improving the pressure resistance of a transistor, and further flat characteristics can be obtained since a drain-source current does not change so much even when a drain-source voltage changes in the operation in a saturation region.

It is to be noted that various types of transistors can be used as a transistor of the invention and formed over various substrates. Therefore, all of the circuits may be formed over a glass substrate, a plastic substrate, a single crystalline substrate, an SOI substrate, or any substrate. When all the circuits are formed over a substrate, cost can be reduced by reducing the number of components and reliability can be improved by reducing the number of connections with the components. Alternatively, a part of a circuit may be formed over a certain substrate and another part of the circuit may be formed over another substrate. That is, not all of the circuits are required to be formed over the same substrate. For example, a part of a circuit may be formed over a glass substrate using a transistor and another part of the circuit may be formed over a single crystalline substrate into an IC chip which may be provided over the glass substrate by COG (Chip On Glass). Alternatively, the IC chip may be connected to a glass substrate using TAB (Tape Auto Bonding) or a printed substrate. In this manner, when parts of a circuit are formed over the same substrate, cost can be reduced by reducing the number of components and reliability can be improved by reducing the number of connections with the components. Further, a portion with a high driving voltage or a high driving frequency which consumes more power is not formed over the same substrate, thereby an increase in power consumption can be prevented.

It is to be noted in the invention that one pixel corresponds to one element which can control brightness. Therefore, for example, one pixel expresses one color element by which brightness is expressed. Accordingly, in the case of a color display device formed of color elements of R (red), G (green), and B (blue), the smallest unit of an image is formed of three pixels of an R pixel, a G pixel, and a B pixel. It is to be noted that a color element is not limited to be formed of three colors and may be formed of more than three colors such as RGBW (W is white) or RGB to which yellow, cyan, and magenta are added. Further, as another example, in the case of controlling the brightness of one color element by using a plurality of regions, one of the plurality of regions corresponds to one pixel. Therefore, for example, in the case of performing an area gray scale display, a plurality of regions for controlling the brightness are provided for one color element, which express a gray scale as a whole. One of the regions for controlling the brightness corresponds to one pixel. Therefore, in this case, one color element is formed of a plurality of pixels. Moreover, in this case, regions which contribute to display may differ in size depending on the pixel. In the plurality of regions for controlling the brightness provided for one color element, that is, a plurality of pixels which constitute one color element, the viewing angle may be expanded by supplying each pixel with a slightly different signal.

It is to be noted in the invention that pixels may be arranged in matrix. Here, the case where pixels are arranged in matrix corresponds to a case where pixels are arranged in a grid pattern where longitudinal stripes and lateral stripes cross each other or to a case where dots of three color elements are arranged in what is called a delta pattern or in a Bayer pattern when a full color display is performed using the three color elements (for example, RGB). It is to be noted that a color element is not limited to three colors and the number of colors may be more than three. The size of a light emission area may be different depending on the dot of the color element.

It is to be noted that a transistor is an element having at least three terminals including a gate, a drain, and a source. A channel region is provided between a drain region and a source region. Here, it is difficult to determine the source region or the drain region since they depend on the structure, operating condition, and the like of the transistor. Therefore, in the invention, a region functioning as a source or a drain may not be referred to as a source or a drain. In this case, for example, each of the region functioning as a source and the region functioning as a drain may be referred to as a first terminal or a second terminal.

It is to be noted that a gate includes a gate electrode and a gate wire (also referred to as gate line, gate signal line, or the like) or a part of them. A gate electrode corresponds to a conductive film of a part overlapping a semiconductor forming a channel region, an LDD (Lightly Doped Drain) region, and the like with a gate insulating film interposed therebetween. A gate wire corresponds to a wire for connecting gate electrodes of pixels and connecting a gate electrode and another wire.

However, there is a portion which functions as a gate electrode and also as a gate wire. Such a region may be referred to as a gate electrode or a gate wire. That is, there is a region which cannot be specifically determined as a gate electrode or a gate wire. For example, when there is a channel region overlapping a gate wire which is extended, the region functions as a gate wire and also as a gate electrode. Therefore, such a region may be referred to as a gate electrode or a gate wire.

Further, a region which is formed of the same material as a gate electrode and connected to the gate electrode may be referred to as a gate electrode as well. Similarly, a region which is formed of the same material as a gate wire and connected to a gate wire may be referred to as a gate wire. In a strict sense, such regions do not overlap a channel region or do not have functions to connect to another gate electrode in some cases. However, there is a region which is formed of the same material as a gate electrode or a gate wire and connected to the gate electrode or the gate wire due to a manufacturing margin and the like. Therefore, such a region may be referred to as a gate electrode or a gate wire.

For example, in a multi-gate transistor, gate electrodes of one transistor and another transistor are often connected through a conductive film formed of the same material as the gate electrodes. Such a region may be referred to as a gate wire since it is a region for connecting the gate electrodes, or a gate electrode when a multi-gate transistor is considered as one transistor. That is, a component which is formed of the same material as a gate electrode or a gate wire and connected to the gate electrode or the gate wire may be referred to as a gate electrode or a gate wire. Moreover, for example, a conductive film of a portion which connects a gate electrode and a gate wire may be referred to as a gate electrode or a gate wire.

It is to be noted that a gate terminal corresponds to a part of a region of a gate electrode or a region electrically connected to a gate electrode.

It is to be noted that a source includes a source region, a source electrode, and a source wire (also referred to as source line, source signal line, or the like), or a part of them. A source region corresponds to a semiconductor region which contains a lot of P-type impurities (boron, gallium, or the like) or N-type impurities (phosphorus, arsenic, or the like). Therefore, a region containing a small amount of P-type impurities or N-type impurities, that is, an LDD (Lightly Doped Drain) region is not included in a source region. A source electrode corresponds to a conductive layer of a part which is formed of a different material from a source region and electrically connected to the source region. However, a source electrode may be referred to as a source electrode including a source region. A source wire corresponds to a wire for connecting source electrodes of pixels and connecting a source electrode and another wire.

However, there is a part which functions as a source electrode and also as a source wire. Such a region may be referred to as a source electrode or a source wire. That is, there is a region which cannot be specifically determined as a source electrode or a source wire. For example, when there is a source region overlapping a source wire which is extended, the region functions as a source wire and also as a source electrode. Therefore, such a region may be referred to as a source electrode or a source wire.

Further, a portion which is formed of the same material as a source electrode and connected to the source electrode may be referred to as a source electrode as well. A portion which connects one source electrode and another source electrode may also be referred to as a source electrode as well. Further, a portion overlapping a source region may be referred to as a source electrode. Similarly, a region which is formed of the same material as a source wire and connected to the source wire may be referred to as a source wire. In a strict sense, such a region may not have a function to connect to another source electrode. However, there is a region which is formed of the same material as a source electrode or a source wire and connected to a source electrode or a source wire due to a manufacturing margin and the like. Therefore, such a region may also be referred to as a source electrode or a source wire.

For example, a conductive film of a portion which connects a source electrode and a source wire may be referred to as a source electrode or a source wire.

It is to be noted that a source terminal corresponds to a part of a source region, a source electrode, or a region electrically connected to a source electrode.

It is to be noted that as for a drain, the similar thing to a source can be applied.

It is to be noted in the invention that a semiconductor device corresponds to a device including a circuit having a semiconductor element (transistor, diode, or the like). Further, a semiconductor device may be a general device which can function by utilizing semiconductor characteristics. A display device corresponds to a device including a display element (liquid crystal element, light emitting element, or the like). It is to be noted that a display device may be a main body of a display panel in which a plurality of pixels including display elements such as a liquid crystal element and an EL element and a peripheral driver circuit for driving the pixels are formed over a substrate. Further, a display device may include the one provided with a flexible printed circuit (FPC) or a printed wiring board (PWB) (IC, resistor, capacitor, inductor, transistor, or the like). Moreover, a display device may include an optical sheet such as a polarizing plate or a retardation film. In addition, a backlight (such as light guide plate, prism sheet, diffusion sheet, reflection sheet, light source (LED, cold-cathode tube, or the like) may be included. A light emitting device corresponds to a display device including a self-light emitting display element such as an EL element or an element used for an FED in particular. A liquid crystal display device corresponds to a display device including a liquid crystal element.

It is to be noted in the invention that when it is described that an object is formed on another object, it does not necessarily mean that the object is in direct contact with the another object. In the case where the above two objects are not in direct contact with each other, still another object may be interposed therebetween. Accordingly, when it is described that a layer B is formed on a layer A, it means either a case where the layer B is formed in direct contact with the layer A, or a case where another layer (such as a layer C or a layer D) is formed in direct contact with the layer A, and then the layer B is formed in direct contact with the another layer. In addition, when it is described that an object is formed over or above another object, it does not necessarily mean that the object is in direct contact with the another object, and another object may be interposed therebetween. Accordingly, when it is described that a layer B is formed over or above a layer A, it means either a case where the layer B is formed in direct contact with the layer A, or a case where another layer (such as a layer C or a layer D) is formed in direct contact with the layer A, and then the layer B is formed in direct contact with the another layer. Similarly, when it is described that an object is formed below or under another object, it means either a case where the objects are in direct contact with each other or not in contact with each other.

The invention can provide a display device capable of preventing a current from flowing to a display element in signal writing operation without changing potentials of power source lines for supplying a current to the display element per row.

BRIEF DESCRIPTION OF DRAWINGS

FIG. 4 is a diagram showing a display device of the invention.

FIG. 6 is a diagram showing a pixel structure of the invention.

FIGS. 7A to 7D are diagrams showing operation of a pixel of the invention.

FIGS. 9A and 9B are diagrams showing operation of a pixel of the invention.

FIGS. 22A and 22B are diagrams showing a display panel of the invention.

FIGS. 23A and 23B are diagrams showing a light emitting element applicable to a display device of the invention.

FIGS. 24A to 24C are diagrams showing a display panel of the invention.

FIGS. 26A and 26B are diagrams showing structures of a transistor and a capacitor applicable to a pixel of the invention.

FIGS. 27A and 27B are diagrams showing structures of a transistor and a capacitor applicable to a pixel of the invention.

FIGS. 30A and 30B are diagrams showing structures of a transistor and a capacitor applicable to a pixel of the invention.

FIGS. 31A and 31B are diagrams showing structures of a transistor and a capacitor applicable to a pixel of the invention.

FIGS. 32A and 32B are diagrams showing structures of a transistor and a capacitor applicable to a pixel of the invention.

FIGS. 34A to 34H are views showing electronic appliances to which a display device of the invention can be applied.

DETAILED DESCRIPTION OF THE INVENTION

Embodiment Mode

Although the invention will be fully described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein.

The invention can be applied to not only a pixel including an EL element and the like but various analog circuits each including a current source. First, in this embodiment mode, description is made of a basic principle of the invention.

Figure 21:
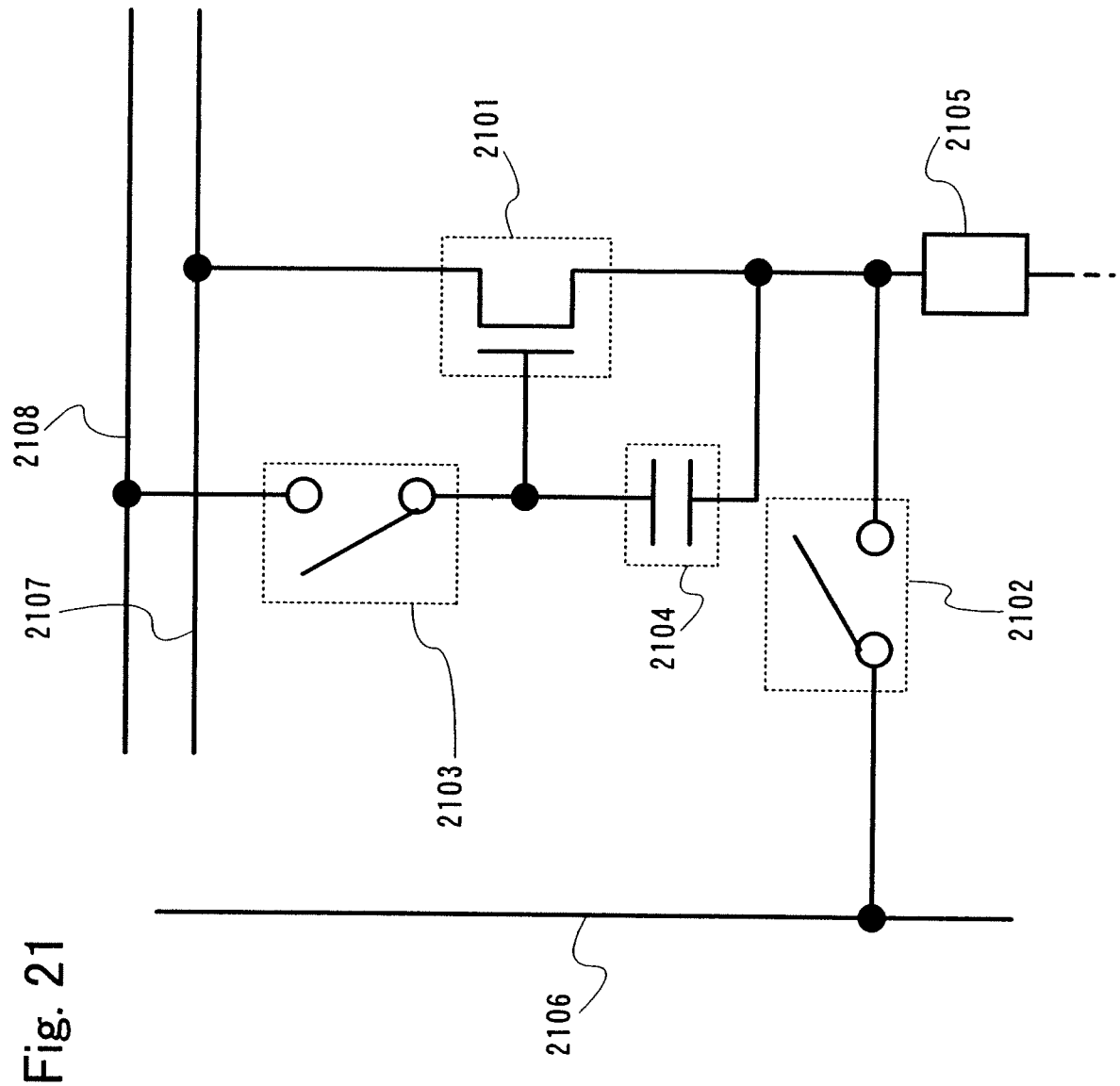
FIG. 21 is a diagram showing a basic principle of the invention.

First, FIG. 21 shows a structure of a semiconductor device based on a basic principle of the invention. The semiconductor device includes a transistor 2101, a first switch 2102, a second switch 2103, a capacitor 2104, a load 2105, a first wire 2106, a second wire 2107, and a third wire 2108. It is to be noted that the transistor 2101 is an n-channel transistor.

A connection structure of the semiconductor device is described.

A first terminal (one of a source terminal and a drain terminal) and a second terminal (the other of the source terminal and the drain terminal) of the transistor 2101 are connected to the load 2105 and the second wire 2107 respectively. A gate terminal of the transistor 2101 is connected to the third wire 2108 through the second switch 2103. That is to say, when the second switch 2103 is in an on state, the gate terminal of the transistor 2101 and the third wire 2108 are electrically connected. On the other hand, when the second switch 2103 is in an off state, the gate terminal of the transistor 2101 and the third wire 2108 are electrically disconnected.

The first terminal of the transistor 2101 is connected to the first wire 2106 through the first switch 2102. That is to say, when the first switch 2102 is in an on state, the first terminal of the transistor 2101 and the first wire 2106 are electrically connected. On the other hand, when the first switch 2102 is in an off state, the first terminal of the transistor 2101 and the first wire 2106 are electrically disconnected.

The capacitor 2104 is connected between the gate terminal and the first terminal of the transistor 2101. That is to say, a first electrode and a second electrode of the capacitor 2104 are connected to the gate terminal and the first terminal of the transistor 2101 respectively. It is to be noted that the capacitor 2104 may have a structure where an insulating film is interposed between a wire, an active layer, an electrode, and the like, or can be omitted by using the gate capacitance of the transistor 2101.

It is to be noted that a predetermined potential is inputted to the second wire 2107 and the third wire 2108.

Subsequently, operation of the semiconductor device is described.

In setting operation, the first switch 2012 and the second switch 2103 are turned on.

Then, a charge is accumulated in the capacitor 2104; therefore, a current flows to the transistor 2101. A current which flows at this time is a current set to the first wire 2106.

When accumulating the charge in the capacitor 2104 is completed, the first switch 2102 and the second switch 2103 are turned off. Then, a gate-source voltage of the transistor 2101 is held in the capacitor 2104. Further, by adjusting a potential of the third wire 2108 at this time, a current can be prevented from flowing to the load 2105.

It is to be noted that the gate-source voltage of the transistor 2101 is a voltage to apply the same amount of current as that flowing through the first wire 2106 to the transistor 2101.

In outputting operation, the first switch 2102 and the second switch 2103 are turned off, and then the gate terminal of the transistor 2101 is set in a floating state. A gate-source voltage of the transistor 2101 is held in the capacitor 2104. Therefore, a current which has flown to the first wire 2106 in the setting operation flows from the second wire 2107 to the load 2105 through the transistor 2101

At this time, the first terminal of the transistor 2101 is a source terminal and has a higher potential. The drain-source voltage of the transistor 2101 becomes lower than that in the setting operation. However, since the transistor 2101 is operated in a saturation region, almost the same current as that flowing through the first wire 2106 in the setting operation can be applied to the load 2105.

It is to be noted that an n-channel transistor is used for the transistor 2101.

Alternatively, a p-channel transistor may be used as well. In this case, direction of a current is opposite.

Embodiment Mode 1

In this embodiment mode, description is made of a basic pixel structure in the case of applying the invention to the pixel.

A pixel described in this embodiment mode includes a transistor 101, a first switch 102, a second switch 103, a capacitor 104, a display element 105, a first wire 106, a second wire 107, a third wire 108, and a fourth wire 109. It is to be noted that the transistor 101 is an n-channel transistor.

A connection structure of the pixel is described.

A first terminal (one of a source terminal and a drain terminal) and a second terminal (the other of the source terminal and the drain terminal) of the transistor 101 are connected to a pixel electrode of the display element 105 and the third wire 108 respectively. A gate terminal of the transistor 101 is connected to the fourth wire 109 through the second switch 103. That is to say, when the second switch 103 is in an on state, the gate terminal of the transistor 101 and the fourth wire 109 are electrically connected. On the other hand, when the second switch 103 is in an off state, the gate terminal of the transistor 101 and the fourth wire 109 are electrically disconnected.

The first terminal of the transistor 101 is connected to the second wire 107 through the first switch 102. That is to say, when the first switch 102 is in an on state, the first terminal of the transistor 101 and the second wire 107 are electrically connected. On the other hand, when the first switch 102 is in an off state, the first terminal of the transistor 101 and the second wire 107 are electrically disconnected.

The capacitor 104 is connected between the gate terminal and the first terminal of the transistor 101. That is to say, a first electrode and a second electrode of the capacitor 104 are connected to the gate terminal and the first terminal of the transistor 101 respectively. It is to be noted that the capacitor 104 may have a structure where an insulating film is interposed between a wire, an active layer, an electrode, and the like, or can be omitted by using the gate capacitance of the transistor 101.

It is to be noted that a predetermined potential is inputted to an opposed electrode 110 of the display element 105, the third wire 108, and the fourth wire 109.

By inputting a signal to the first wire 106, the first switch 102 and the second switch 103 are controlled to be turned on or off.

A signal is inputted to the second wire 107 in accordance with a gray scale level of the pixel. This signal corresponds to a video signal and a signal current flows to the second wire 107.

Figure 1:
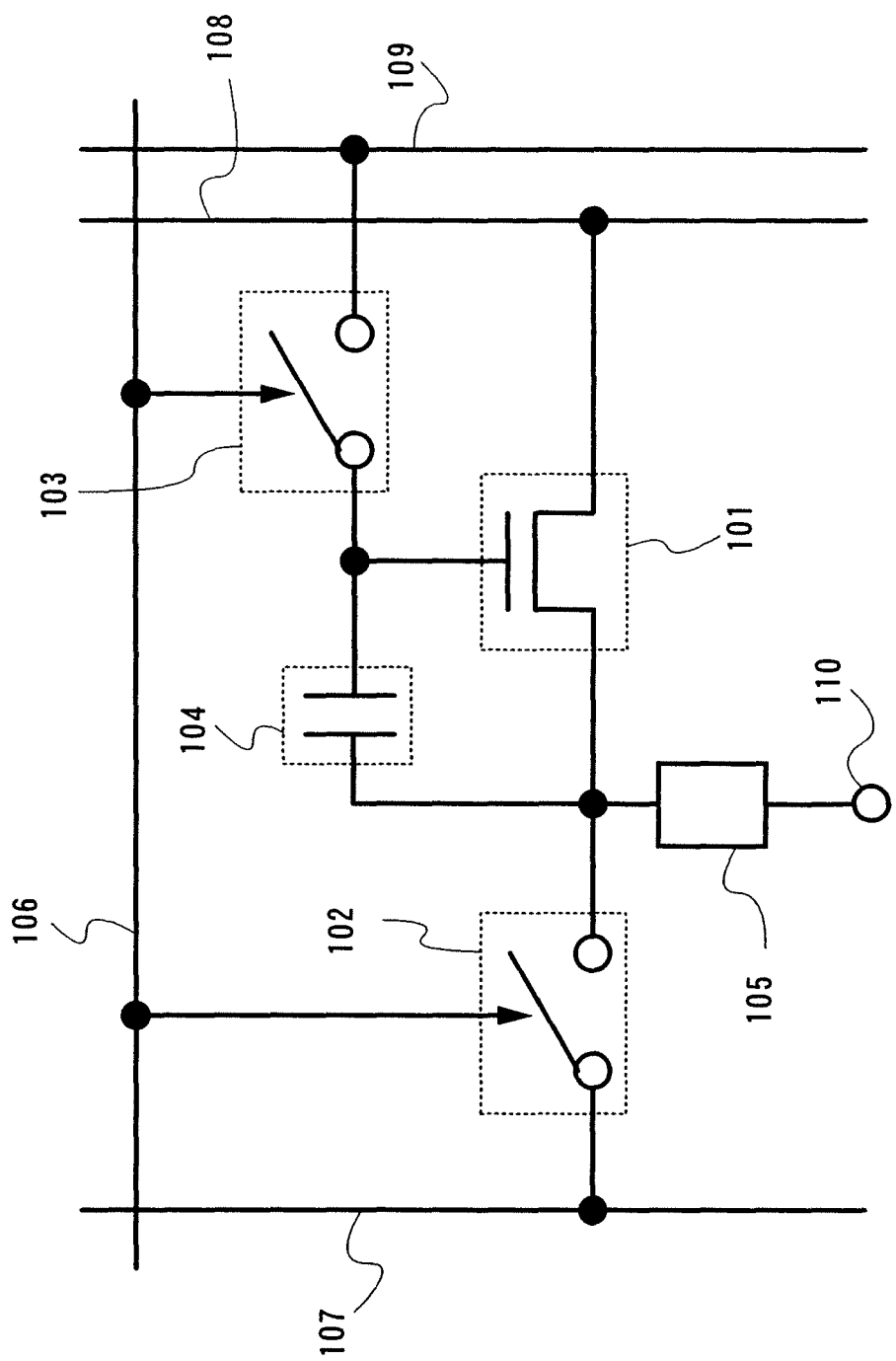
FIG. 1 is a diagram showing a pixel structure of the invention.
Figure 2:
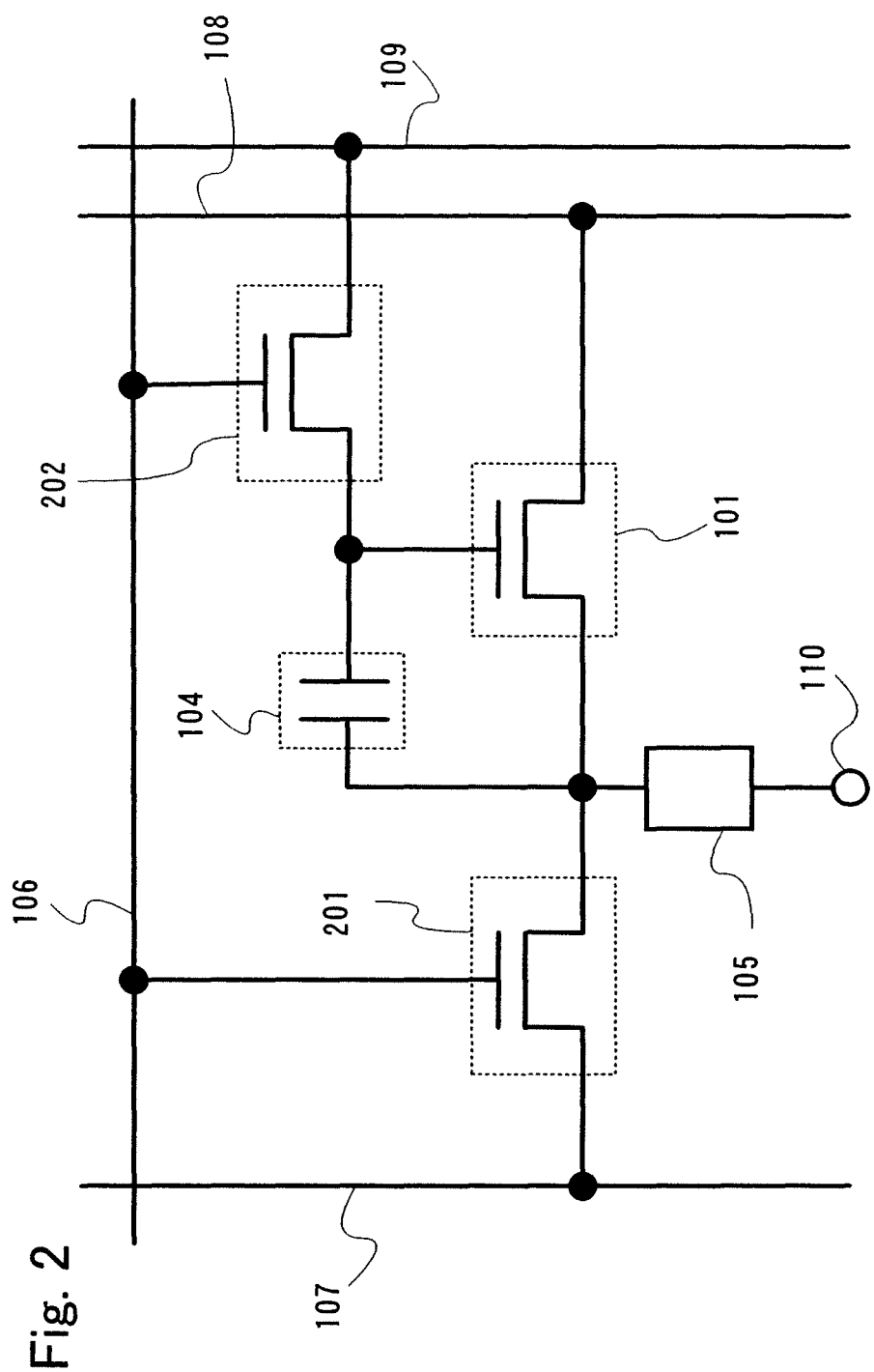
FIG. 2 is a diagram showing a pixel structure of the invention.

It is to be noted that transistors can be applied to the first switch 102 and the second switch 103. FIG. 2 shows the case of applying n-channel transistors to the first switch 102 and the second switch 103. Note that common portions to those in FIG. 1 are denoted by the same reference numerals, and description thereof is omitted.

A first switching transistor 201 corresponds to the first switch 102 and a second switching transistor 202 corresponds to the second switch 103.

A gate terminal, a first terminal (one of a source terminal and a drain terminal), and a second terminal (the other of the source terminal and the drain terminal) of the first switching transistor 201 are connected to the first wire 106, the second wire 107, and a pixel electrode of the display element 105 and the first terminal of the transistor 101, respectively. Therefore, when a signal inputted to the first wire 106 is at H level, the first switching transistor 201 is turned on whereas when the signal is at L level, the first switching transistor 201 is turned off.

A gate terminal, a first terminal (one of a source terminal and a drain terminal), and a second terminal (the other of the source terminal and the drain terminal) of the second switching transistor 202 are connected to the first wire 106, the gate terminal of the transistor 101, and the fourth wire 109 respectively. Therefore, when a signal inputted to the first wire 106 is at H level, the second switching transistor 202 is turned on whereas when the signal is at L level, the second switching transistor 202 is turned off.

Figure 3A:
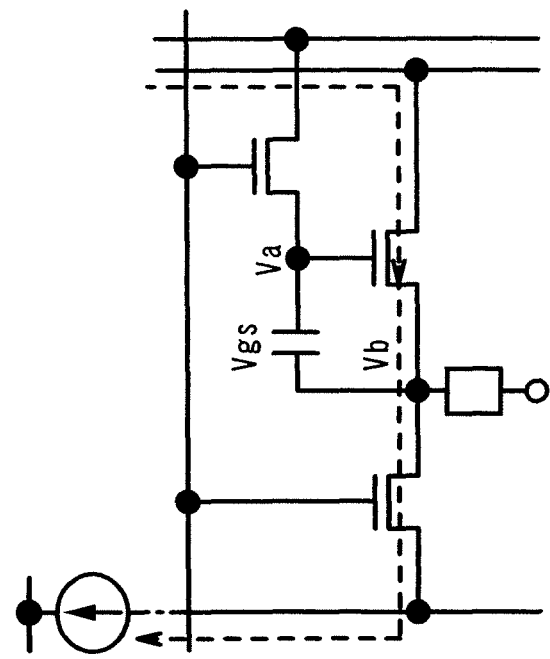
FIGS. 3A to 3C are diagrams showing operation of a pixel of the invention.

Subsequently, description is made with reference to FIGS. 3A to 3C of operation of the pixel of this embodiment mode. Note that in FIGS. 3A to 3C, description is made by using the pixel structure in FIG. 2 since the pixels of FIGS. 1 and 2 operate in the same manner.

Figure 48:
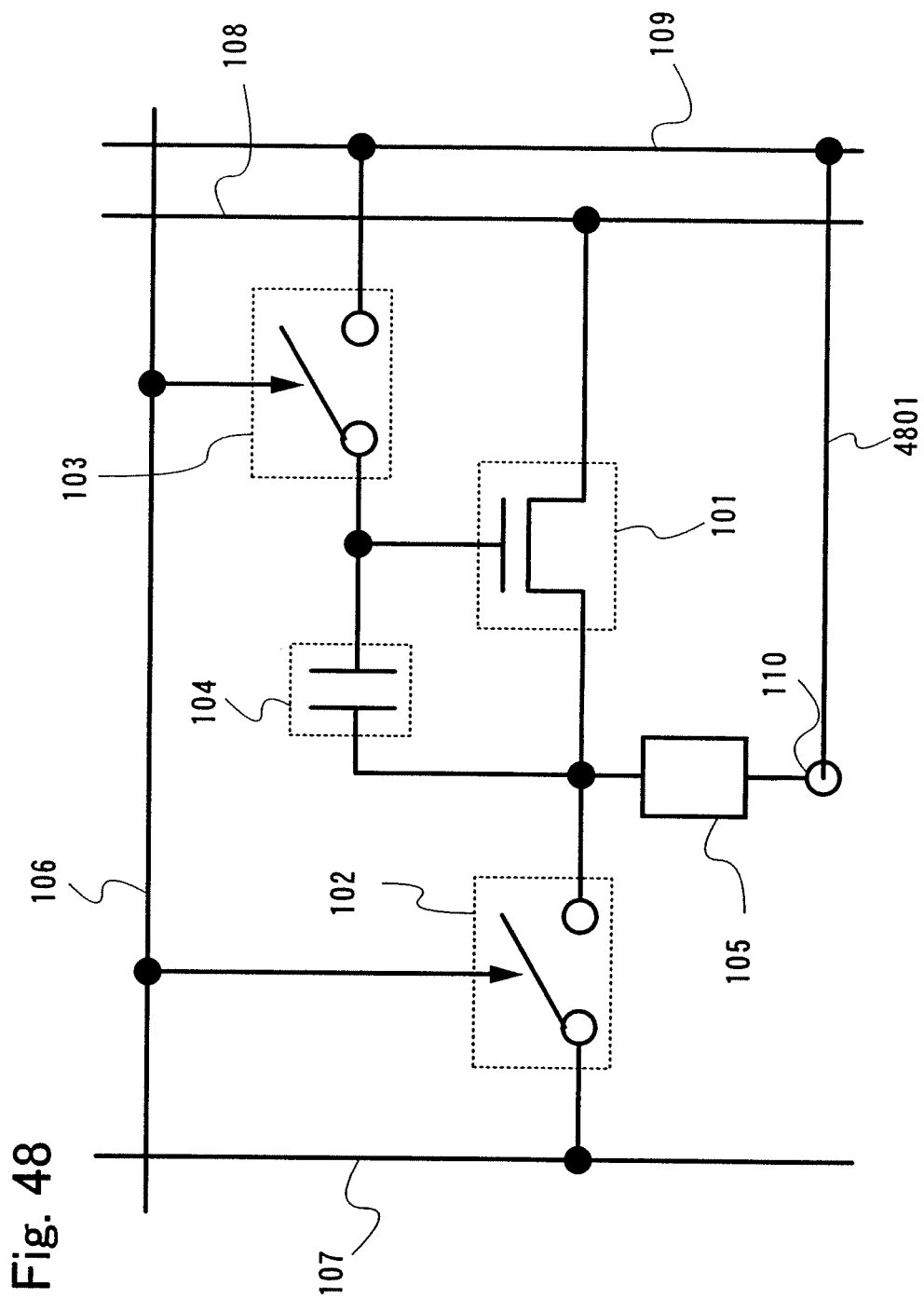
FIG. 48 is a diagram showing a pixel structure of the invention.

It is to be noted that a current source 301 connected to the second wire 107 sets a signal current Idata which is written to the pixel. The second wire 107 is connected to a wire 302 through a current source 301. A predetermined potential is inputted to the wire 302. Here, potentials inputted to the third wire 108, the fourth wire 109, the wire 302, and the opposed electrode 110 are denoted by V3, V4, V5, and Vcom respectively. As for a relation of the potentials, V3>Vcom>V5 is at least satisfied. When V4=Vcom is satisfied, the fourth wire 109 and the opposed electrode 110 of the display element 105 may be connected through a fifth wire 4801 as shown in FIG. 48.

It is to be noted that the operation of a pixel includes signal writing operation for writing a signal to a pixel and light emitting operation for emitting light of a gray scale level in accordance with a signal written to a pixel. FIGS. 3A and 3B are diagrams showing the signal writing operation, and FIG. 3C is a diagram showing the light emitting operation.

First, a transient state in the signal writing operation is described with reference to FIG. 3A. A signal to be inputted to the first wire 106 is set to be at H level, thereby turning on the first and second switching transistors 201 and 202. Accordingly, a current flows as shown in FIG. 3A. That is, as paths of current, there are a first path where a current flows from the fourth wire 109 to the capacitor 104 through the second switching transistor 202 and a second path where a current flows from the third wire 108 to the transistor 101. A current Ic that flows through the first path and a current Itr that flows through the second path unite at a connecting portion of the first terminal of the transistor 101 and the second electrode of the capacitor 104. Then, a current Ic and a current Itr flow as the signal current Idata to the wire 302 through the first switching transistor 201 and a current source 301. That is to say, Ic+Itr=Idata is satisfied.

A current does not flow to the capacitor 104 before long, which leads to a steady state in the signal writing operation.

Figure 3B:
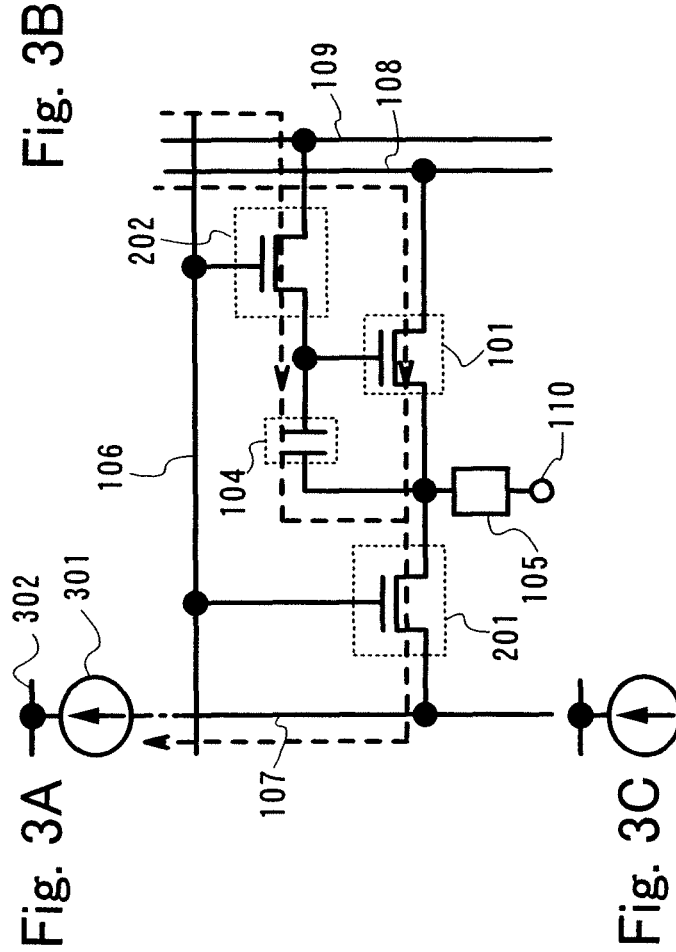

Therefore, a current flows as shown in FIG. 3B. A current Itr that flows from the third wire 108 to the transistor 101 is equal to the signal current Idata. That is, a gate-source voltage Vgs of the transistor 101 is necessary for applying the signal current Idata to the transistor 101. A load for the gate-source voltage Vgs of the transistor 101 is accumulated in the capacitor 104.

It is to be noted that when potentials of the gate terminal and the first terminal of the transistor 101 at this time are denoted by Va and Vb respectively, Vgs=(Va−Vb) is satisfied. When a forward threshold voltage of the display element 105 is denoted by $V_{ELth}$, (Vb−Vcom)<$V_{ELth}$ is preferably satisfied, thereby applying no current to the display element 105 in the signal writing operation. Therefore, the potential V4 inputted to the fourth wire 109 is desirably set so as to satisfy V3>V4>V5. When V4=Vcom is satisfied, the number of power sources necessary for pixels can be reduced. Further, a reverse bias can be applied to the display element 105 in the signal writing operation.

It is to be noted that even when a reverse bias is applied to the display element 105, a current does not flow to the display element 105 normally (if flows, it is a small amount of current). On the other hand, if the display element 105 is short-circuited, a current flows to a short-circuited portion. Then, the short-circuited portion is insulated, thereby a display defect can be improved.

Subsequently, description is made with reference to FIG. 3C of the light emitting operation. A signal inputted to the first wire 106 is set to be at an L level, thereby turning off the first and second switching transistors 201 and 202. Thus, a current flows as shown in FIG. 3C. At this time, the second switching transistor 202 is in an off state. Therefore, the capacitor 104 holds the gate-source voltage Vgs necessary for applying the signal current Idata to the transistor 101. Accordingly, a current which is almost equivalent to the signal current Idata flows to the transistor 101.

It is to be noted that when potentials of the gate terminal and the first terminal of the transistor 101 at this time are denoted by Va' and Vb' respectively, Vgs=(Va'−Vb') is satisfied. This is because Va' is increased as Vb' is increased since the capacitor 104 holds the gate-source voltage Vgs although Vb'>Vb is satisfied.

It is to be noted that when potentials of H level signal and an L level signal to be inputted to the first wire 106 are denoted by V1(H) and V1(L) respectively, the following potentials are preferable. Threshold voltages of the first switching transistor 201 and the second switching transistor 202 are denoted by Vth1 and Vth2 respectively.

As shown in FIG. 3B, even when a potential of the pixel electrode of the display element 105 becomes Vb, the first switching transistor 201 is required to be in an on state. Therefore, V1(H)>(Vb+Vth1) is set to be satisfied. Further, V1(H)>(V4+Vth2) is set to be satisfied so that the second switching transistor 202 is in an on state. Specifically, for example, when V4=Vcom is satisfied, V1(H) is preferably a potential higher than Vcom by 1 to 8 V.

Figure 3C:
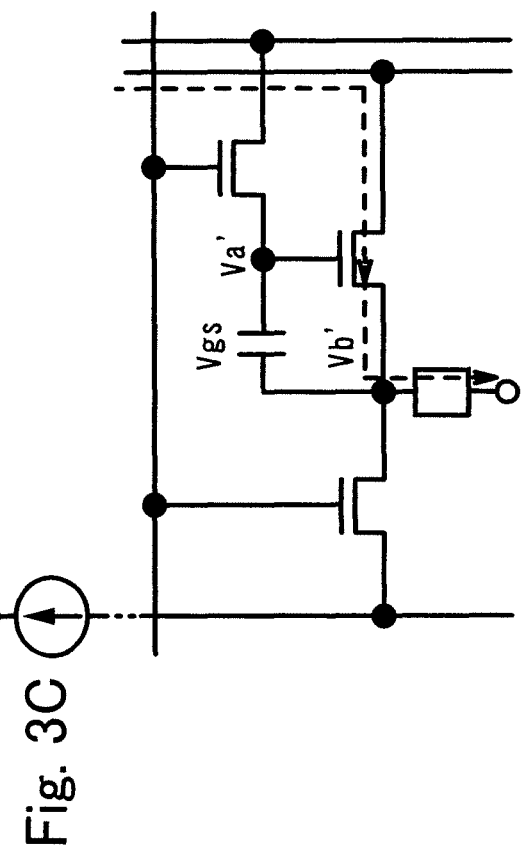

As shown in FIG. 3C, V1(L)<(Vb+Vth1) is satisfied so that the first switching transistor 201 is turned off. That is, when the signal current is written to another pixel, a potential of the second wire 107 becomes Vb. Therefore, in a pixel which is not selected at this time, the first switching transistor 201 is required to be in an off state. On the other hand, V1(L)<(V4+Vth2) is satisfied so that the second switching transistor 202 is in an off state. Specifically, for example, when V4=Vcom is satisfied, V1(L) is preferably a potential lower than Vcom by 1 to 8 V.

By employing a pixel structure described in this embodiment mode, a potential of a gate terminal of a transistor in the signal writing operation is controlled, thereby preventing a current from flowing to a display element at this time.

It is to be noted that by employing the pixel structure shown in FIG. 2, a pixel can be formed of only n-channel transistors, which can simplify manufacturing steps. An amorphous semiconductor, a semi-amorphous semiconductor (also referred to as a microcrystalline semiconductor), or the like can be used for a semiconductor layer of a transistor constituting a pixel. For example, amorphous silicon (a-Si: H) may be used as the amorphous semiconductor. Therefore, the manufacturing steps can be further simplified. As a result, reduction in a manufacturing cost and improvement in the yield can be achieved.

Further, by employing the structure of the invention, Vds>Vgs can be satisfied in the signal writing operation. A change in the Vds can be made small between in the signal writing operation and in the light emitting operation. Therefore, even if constant current characteristics (flatness of current) in a saturation region of the transistor 101 are bad, current values are almost equivalent between in the signal writing operation and in the light emitting operation. In particular, when an amorphous semiconductor film (such as amorphous silicon) is used as a semiconductor layer of the transistor 101, constant current characteristics (flatness of current) in a saturation region of the transistor 101 may be deteriorated. Therefore, when the structure of the invention is applied in the case where an amorphous semiconductor film is used as a semiconductor layer of the transistor 101, a display defect can be prevented.

Figure 16:
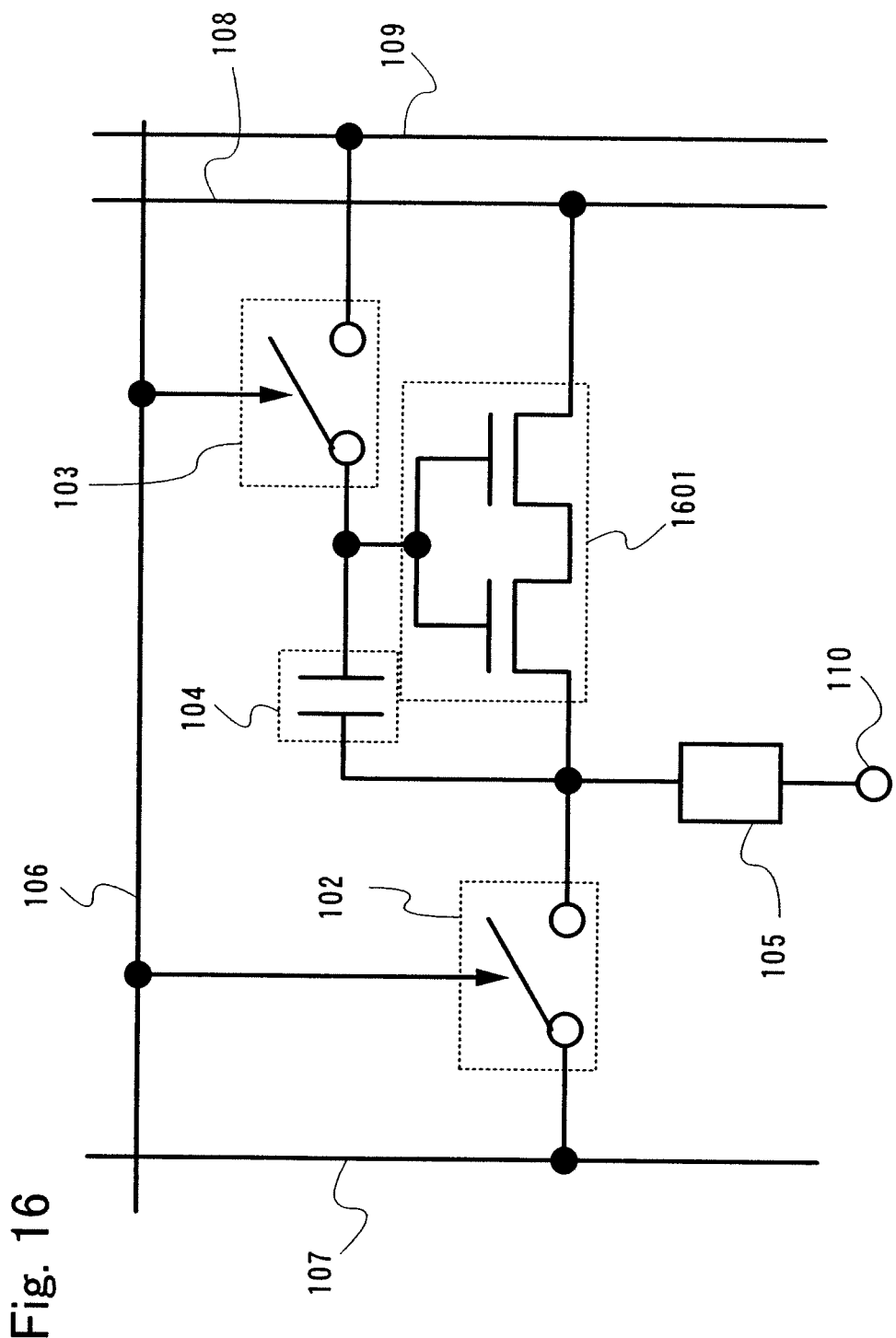
FIG. 16 is a diagram showing a pixel structure of the invention.

Further, since a high voltage is applied between the source and drain terminals of the transistor 101 shown in FIG. 2, the channel length of the transistor 101 may be longer than that of the first switching transistor 201 or the second switching transistor 202. Alternatively, a multi-gate transistor may be applied to the transistor 101 as shown in FIG. 16. Accordingly, the pressure resistance of the transistor is increased, thereby preventing the transistor from being damaged.

Figure 17:
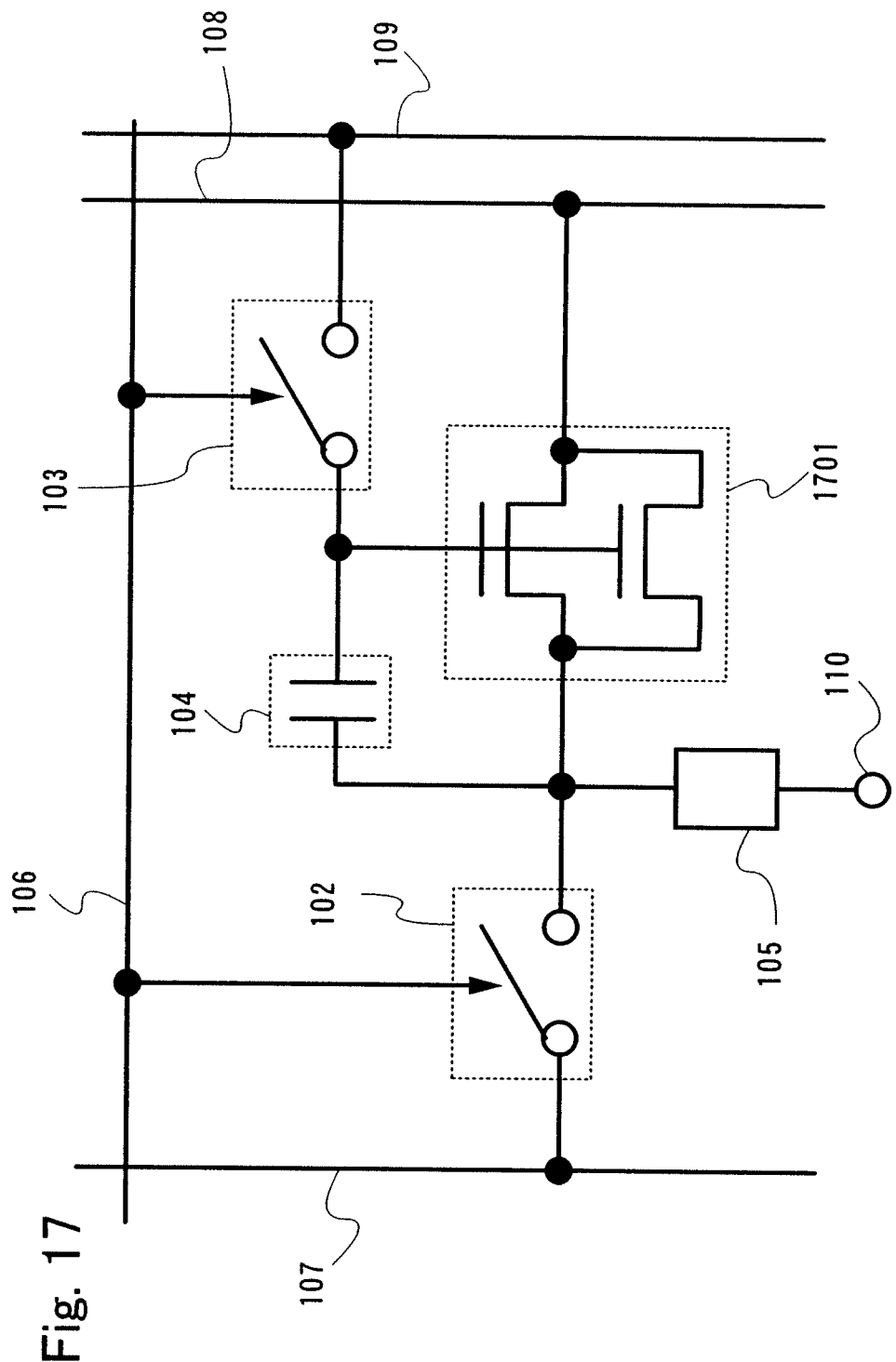
FIG. 17 is a diagram showing a pixel structure of the invention.

Further, in order to apply a current controlled by the transistor 101 shown in FIG. 2 to the display element 105, the transistor 101 is required to have a capability of applying a large amount of on current. Therefore, the channel width of the transistor 101 may be wider than that of the first switching transistor 201 or the second switching transistor 202. Alternatively, the transistor 101 may have a structure where a plurality of transistors are connected in parallel as a transistor 1701 shown in FIG. 17.

Subsequently, description is made with reference to FIG. 4 of a display device including a pixel of the invention.

A display device includes a signal line driver circuit 401, a scan line driver circuit 402, and a pixel portion 403. The pixel portion 403 includes a plurality of signal lines S1 to Sn extended in column direction from the signal line driver circuit 401, a plurality of scan lines G1 to Gm extended in row direction from the scan line driver circuit 402, and a plurality of pixels 404 arranged in matrix corresponding to the signal lines S1 to Sn and the scan lines G1 to Gm. Further, the pixel portion 403 includes power source lines P1 to Pn and bias lines B1 to Bn which are parallel to the signal lines S1 to Sn. Each of the pixels 404 is connected to a signal line Sj (any one of the signal lines S1 to Sn), a scan line Gi (any one of the scan lines G1 to Gm), a power source line Pj (any one of the power source lines P1 to Pn), and a bias line Bj (any one of the bias lines B1 to Bn).

It is to be noted that the scan line Gi corresponds to the first wire 106 in FIG. 1. The signal line Sj corresponds to the second wire 107 in FIG. 1. The power source line Pj corresponds to the third wire 108 in FIG. 1. The bias line Bj corresponds to the fourth wire 109 in FIG. 1.

The scan lines G1 to Gm are selected one by one by a signal outputted from the scan line driver circuit 402. Then, the signal is written to the pixel 404 connected to the scan line which is selected. At this time, a signal current flows to each of the signal line S1 to Sn in accordance with a gray scale level of each pixel.

After signal writing is completed, another scan line is selected, and then signal writing is performed to the pixel 404 connected to the scan line. The pixel to which a signal has been written starts light emitting operation and emits light in accordance with the signal written to the pixel. Thus, signals are sequentially written to the pixels 404 to perform signal writing is all the pixels 404 sequentially.

However, the structure of the display device shown in FIG. 4 is one example and the invention is not limited to this. That is, the power source lines P1 to Pn and the bias lines B1 to Bn are not required to be arranged parallel to the signal lines Si to Sn. The power source lines and the bias lines may be arranged parallel to the scan lines G1 to Gm. Alternatively, each of the power source lines and the bias lines may be arranged in a grid pattern. It is to be noted that in the case where the pixel portion 403 includes a plurality of color elements, the power source lines and the bias lines are preferably arranged as shown in FIG. 4.

Figure 46:
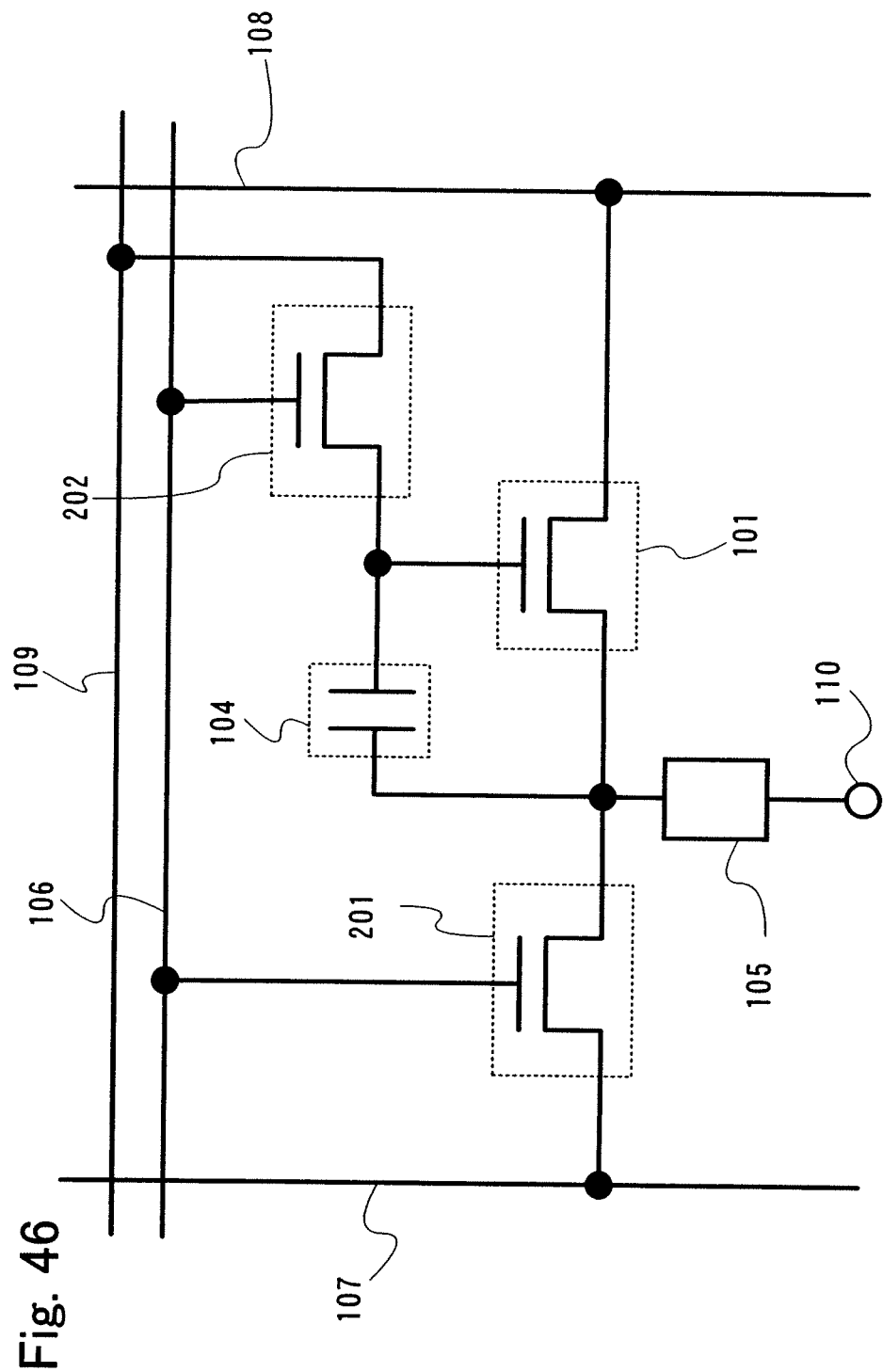
FIG. 46 is a diagram showing a pixel structure of the invention.
Figure 47:
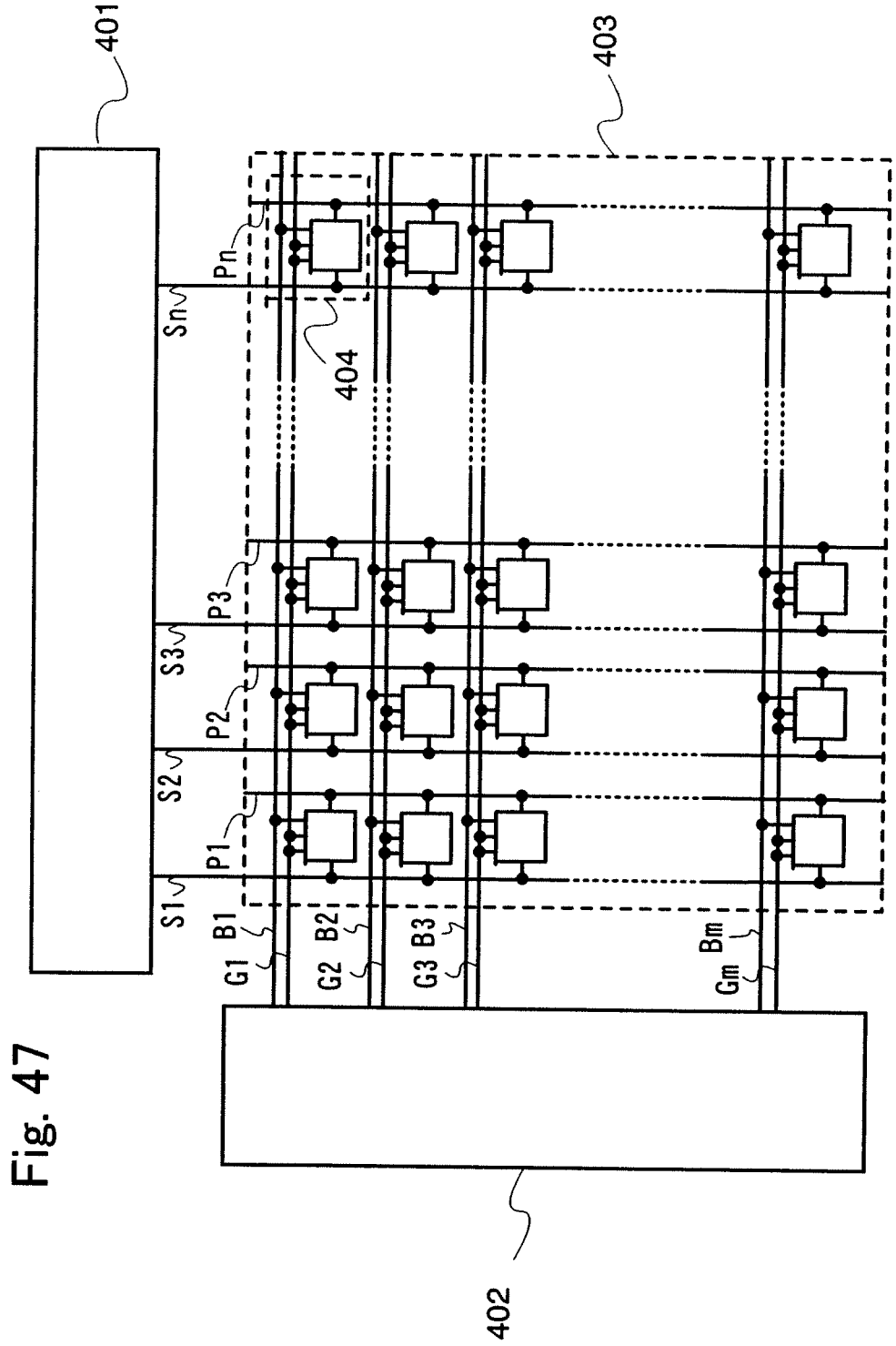
FIG. 47 is a diagram showing a pixel structure of the invention.

That is to say, the fourth wire 109 in the pixel of FIG. 1 may be arranged parallel to the first wire 106 as shown in FIG. 46. In this case, bias lines B1 to Bm corresponding to the bias lines B1 to Bn in FIG. 4 are arranged parallel to the scan lines G1 to Gm as shown in FIG. 47. Potentials of the bias lines B1 to Bm may be varied. In other words, the bias lines may be scanned. In this case, a bias line driver circuit may be provided in addition to the scan line driver circuit 402 which scans the scan lines G1 to Gm.

In the case where the pixel portion 403 includes a plurality of color elements, potentials of a power source line and a bias line connected to each pixel which is a color element may be varied. Further, the size of a pixel electrode may be different per pixel to be a color element. In other words, a light emitting area may be different per pixel to be a color element. Thus, in the case where an EL element of a different color is used as a display element for a full color display, a balance of colors and a progress of deterioration of the EL element can be controlled.

Figure 19:
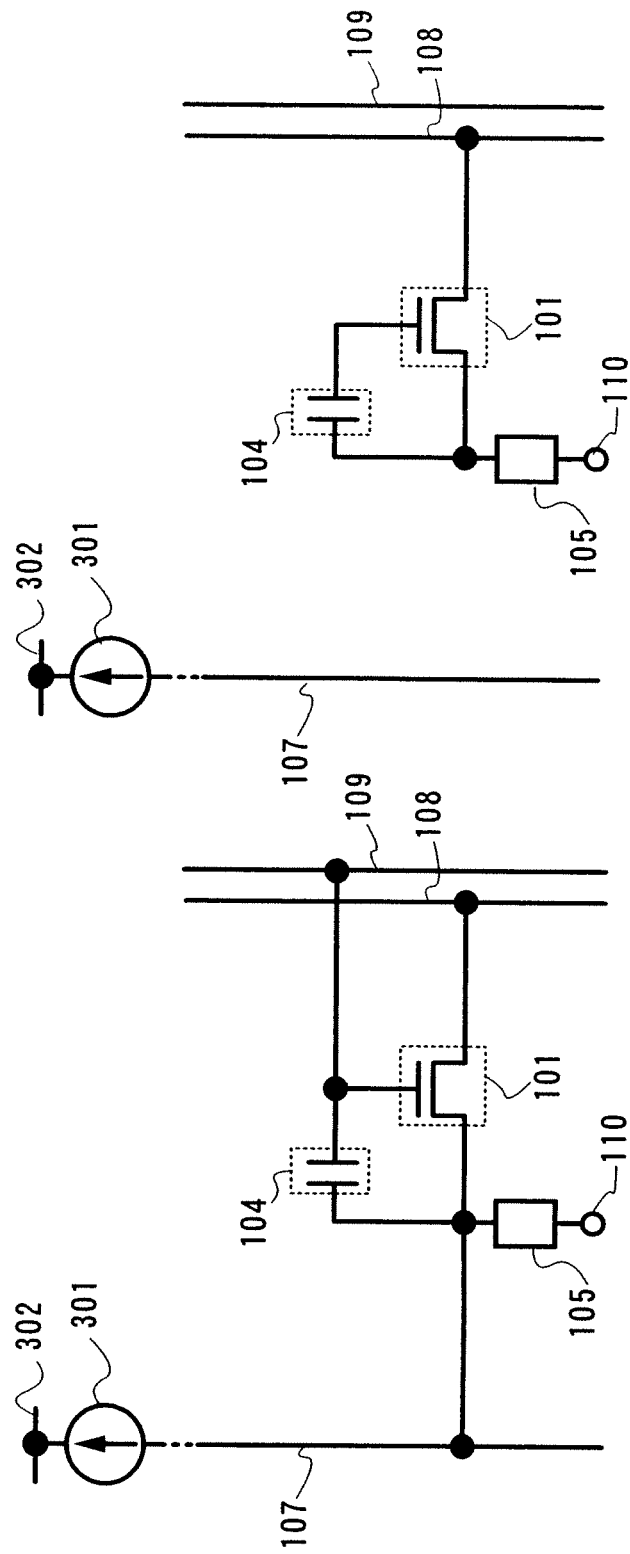
FIGS. 19A and 19B are diagrams showing a connecting state when a pixel of the invention operates.

A pixel of the invention is not limited to the structure of FIG. 1. A pixel is only required to be connected as shown in FIG. 19A in signal writing operation whereas connected as shown in FIG. 19B in light emitting operation. That is to say, in the signal writing operation, the gate terminal, the first terminal, and the second terminal of the transistor 101 are only required to be connected to the fourth wire 109, the second wire 107, and the third wire 108 respectively. On the other hand, in the light emitting operation, it is only required that the gate terminal of the transistor 101 be electrically connected nowhere and the first terminal and the second terminal of the transistor 101 be connected to the pixel electrode of the display element 105 and the third wire 108 respectively.

Thus, in the pixel shown in FIG. 1, an additional wire may be provided to control on/off of the first switch 102 and the second switch 103 separately. That is to say, a fifth wire 501 for controlling on/off of the second switch 103 may be provided in addition to the first wire 106 for controlling on/off of the first switch 102. In this case, after the signal writing operation is completed, the first switch 102 and the second switch 103 are turned off at the same time or the second switch 103 is turned off before the first switch 102 is turned off. If the second switch 103 is in an on state even after the first switch 102 is turned off, a charge accumulated in the capacitor 104 is discharged through the transistor 101.

Figure 5:
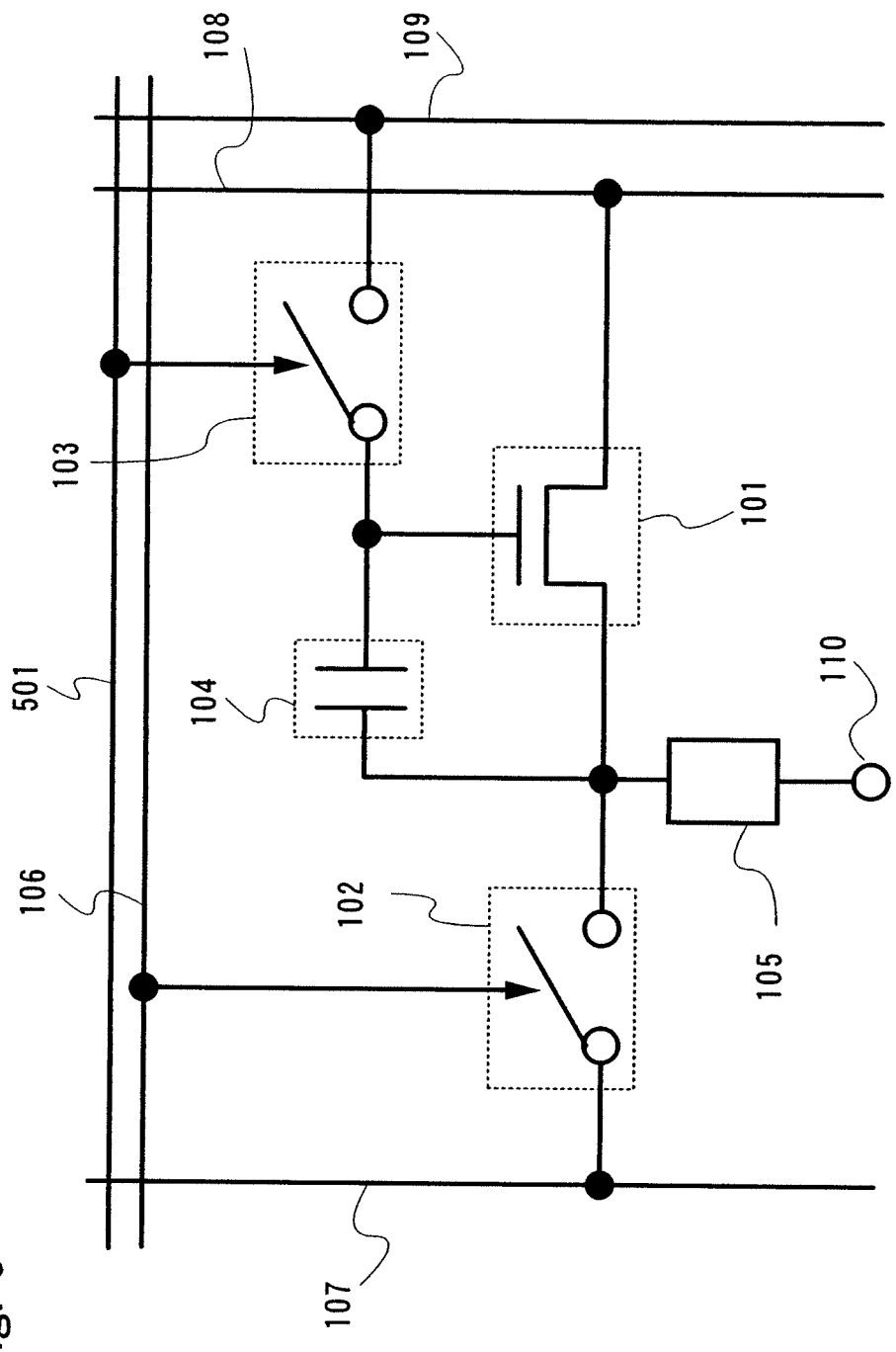
FIG. 5 is a diagram showing a pixel structure of the invention.
Figure 49:
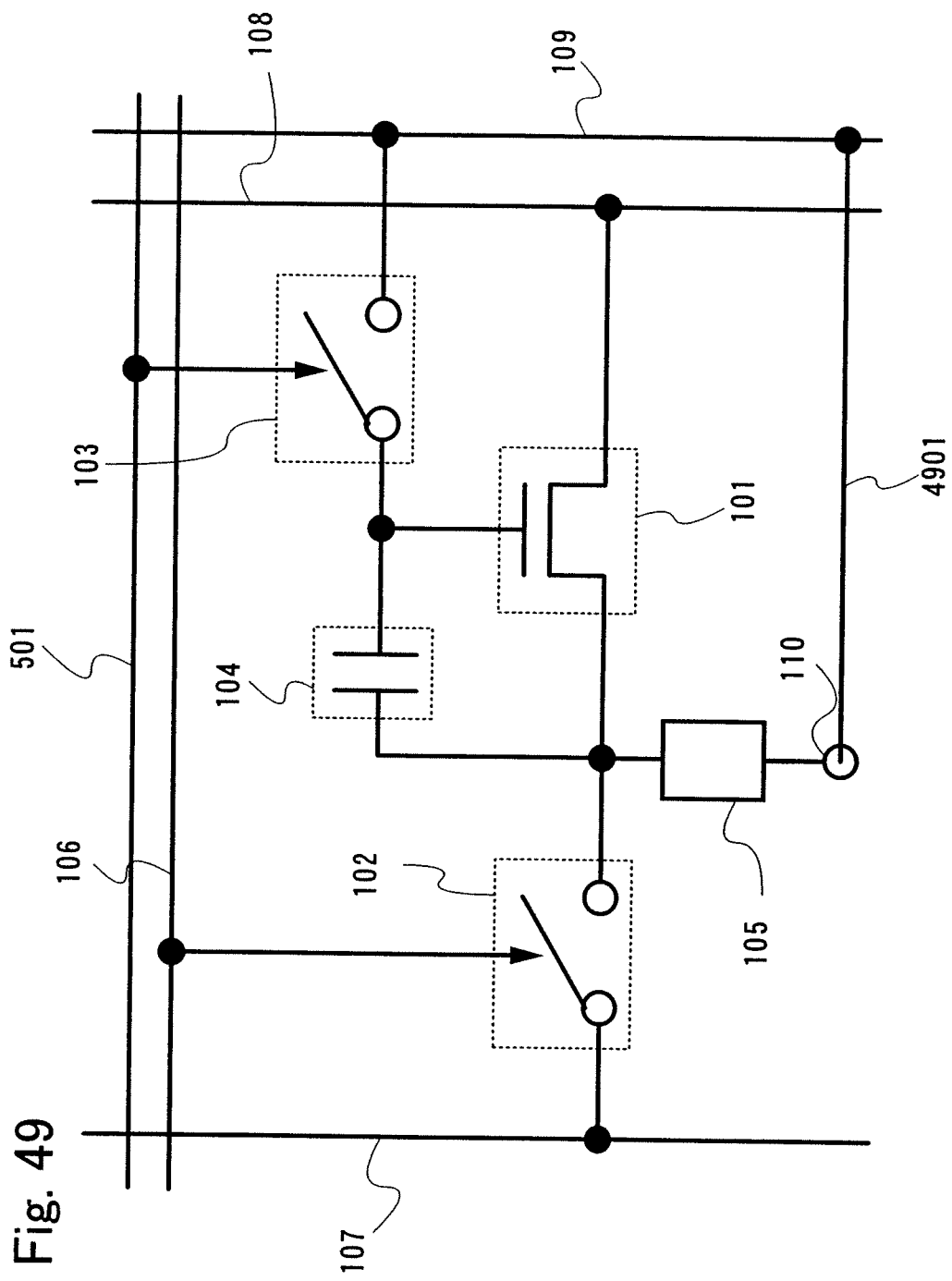
FIG. 49 is a diagram showing a pixel structure of the invention.

In the case of a structure shown in FIG. 5, when V4=Vcom is satisfied, the fourth wire 109 and the opposed electrode 110 of the display element 105 may be connected through a sixth wire 4901 as shown in FIG. 49.

Figure 13:
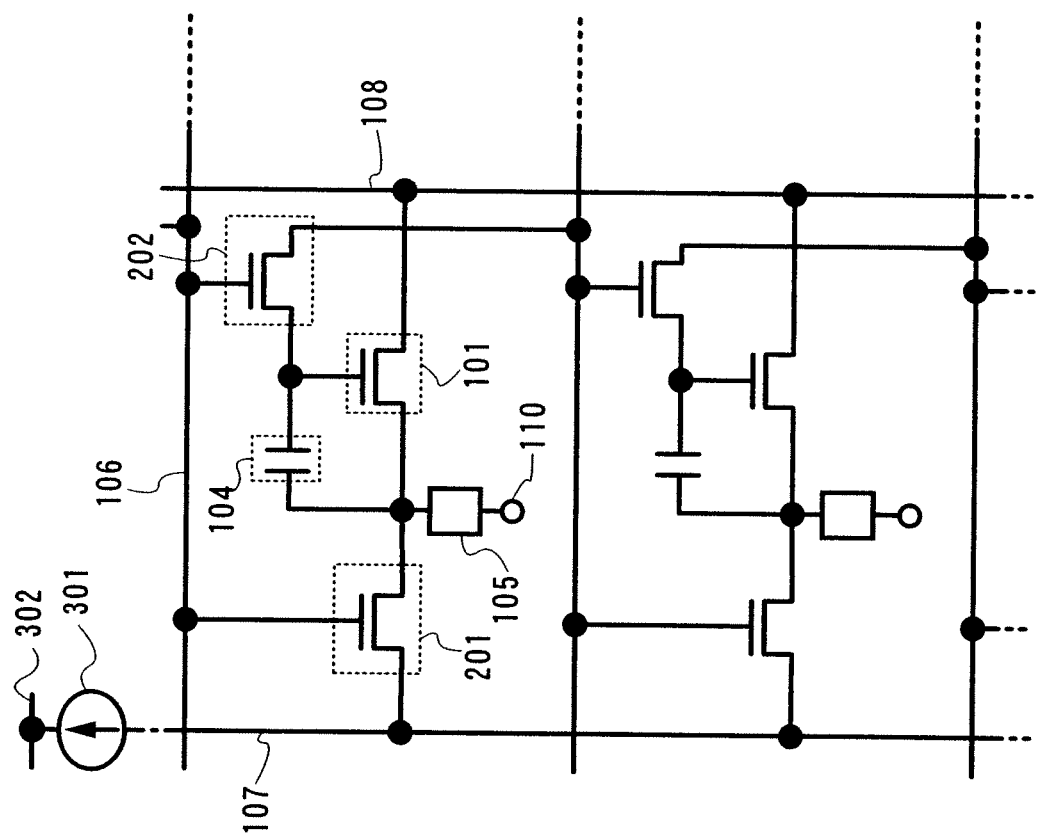
FIG. 13 is a diagram showing a pixel structure of the invention.

In the pixel of FIG. 1 or FIG. 2, the first wire 106 in a pixel of another row can be used instead of the fourth wire 109. That is, in this case, the bias lines B1 to Bn of the display device shown in FIG. 4 can be omitted. As an example, FIG. 13 shows a structure where the fourth wire 109 in the pixel of FIG. 2 is omitted and the first wire 106 in a pixel of the adjacent row is used instead of the fourth wire 109.

Figure 14:
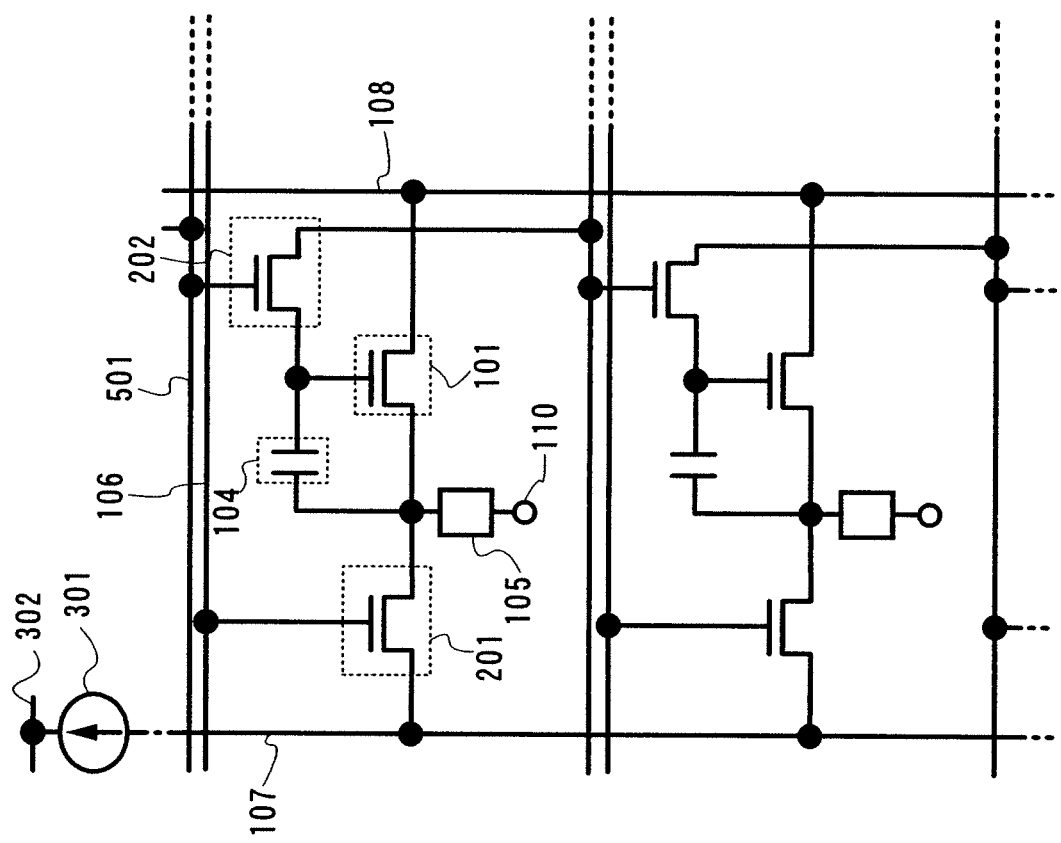
FIG. 14 is a diagram showing a pixel structure of the invention.

As shown in FIG. 14, the first switching transistor 201 and the second switching transistor 202 which are n-channel transistors can be applied to the first switch 102 and the second switch 103 in the pixel of FIG. 5 respectively, and the fifth wire 501 in a pixel of another row can be used instead of the fourth wire 109.

Figure 15:
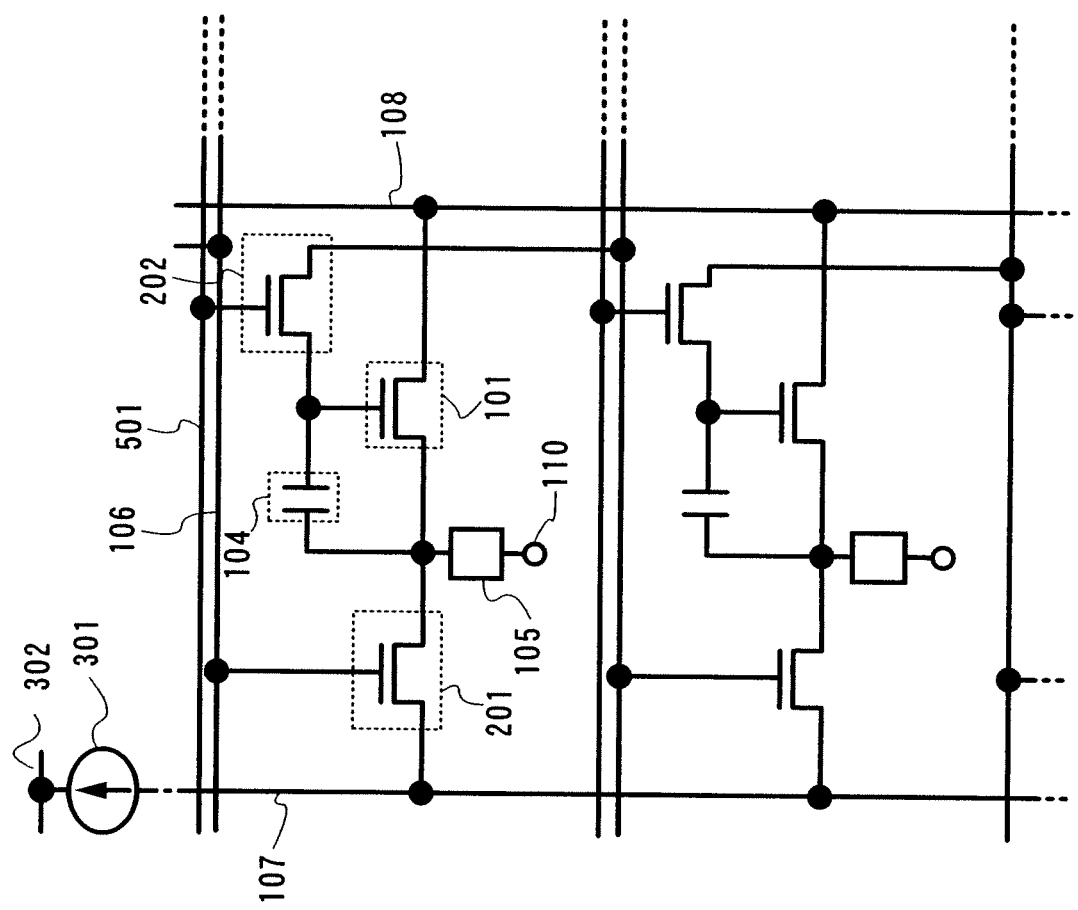
FIG. 15 is a diagram showing a pixel structure of the invention.

As shown in FIG. 15, the first switching transistor 201 and the second switching transistor 202 which are n-channel transistors can be applied to the first switch 102 and the second switch 103 in the pixel of FIG. 5 respectively, and the first wire 106 in a pixel of another row can also be used instead of the fourth wire 109.

Figure 20:
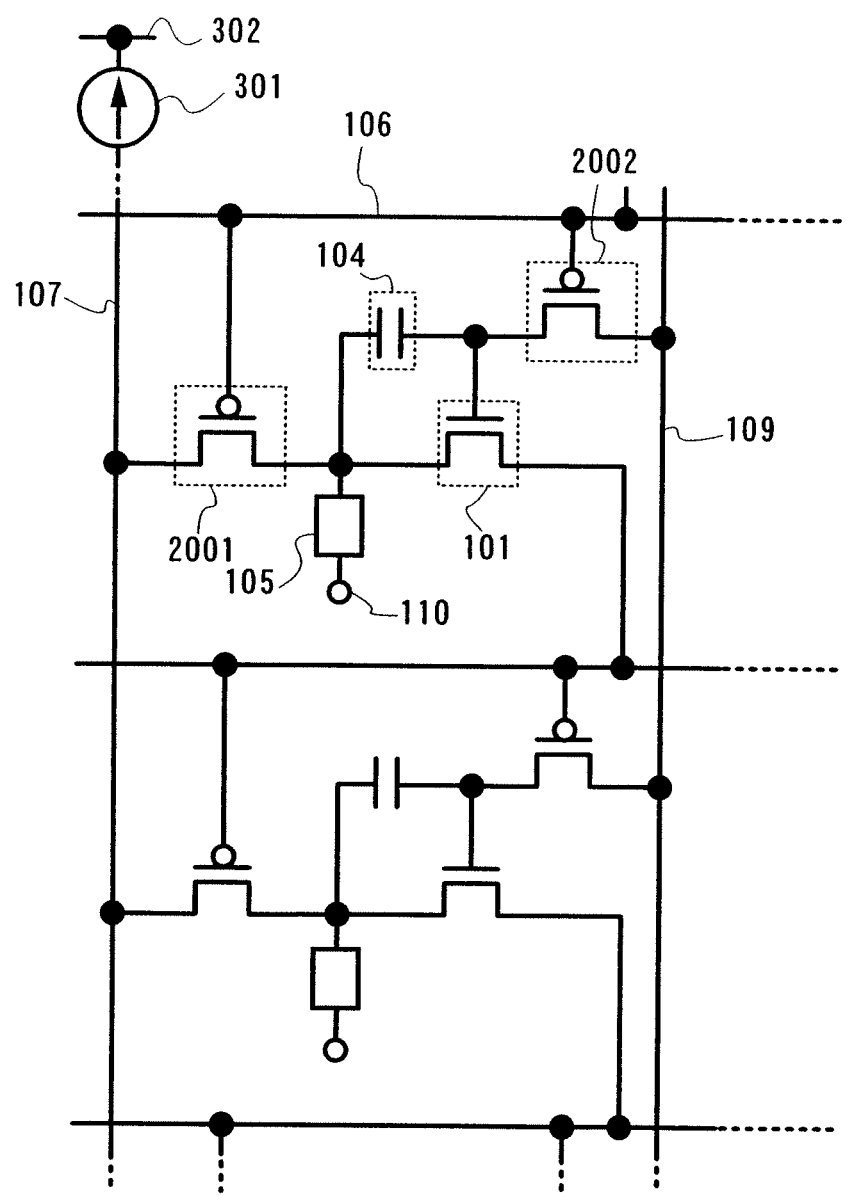
FIG. 20 is a diagram showing a pixel structure of the invention.

As shown in FIG. 20, a first switching transistor 2001 and a second switching transistor 2002 which are p-channel transistors can be applied to the first switch 102 and the second switch 103 in the pixel of FIG. 1 respectively, and the first wire 106 in a pixel of another row can be used instead of the third wire 108.

Embodiment Mode 2

When a pixel is formed using a transistor, variation in characteristics of transistors in different pixels is a problem. The variation in transistor characteristics is recognized as display unevenness.

In this embodiment mode, description is made of a case where transistors (transistors to be turned on) used in pixels of the invention are switched per period, thereby transistor characteristics can be averaged in terms of time and display unevenness can be hardly recognized.

A pixel of this embodiment mode is shown in FIG. 6.

A pixel of this embodiment mode includes a first transistor 601, a second transistor 611, a first switch 602, a second switch 603, a third switch 612, a fourth switch 613, a capacitor 604, a display element 605, a first wire 606, a second wire 607, a third wire 608, and a fourth wire 609. It is to be noted that the first transistor 601 and the second transistor 611 are n-channel transistors.

First, a connection structure of the pixel is described.

A first terminal (one of a source terminal and a drain terminal) of the first transistor 601 is connected to a pixel electrode of the display element 605, a second terminal (the other of the source terminal and the drain terminal) of the first transistor 601 is connected to the third wire 608 through the third switch 612, and a gate terminal of the first transistor 601 is connected to the fourth wire 609 through the second switch 603. That is to say, when the third switch 612 is in an on state, the second terminal of the first transistor 601 and the third wire 608 are electrically connected. On the other hand, when the third switch 612 is in an off state, the second terminal of the first transistor 601 and the third wire 608 are electrically disconnected. Further, when the second switch 603 is in an on state, the gate terminal of the first transistor 601 and the fourth wire 609 are electrically connected. On the other hand, when the second switch 603 is in an off state, the gate terminal of the first transistor 601 and the fourth wire 609 are electrically disconnected.

Similarly, the second transistor 611 and the first transistor 601 are connected in parallel. That is, a first terminal (one of a source terminal and a drain terminal) of the second transistor 611 is connected to a pixel electrode of the display element 605, a second terminal (the other of the source terminal and the drain terminal) of the second transistor 611 is connected to the third wire 608 through the fourth switch 613, and a gate terminal of the second transistor 611 is connected to the fourth wire 609 through the second switch 603. That is to say, when the fourth switch 613 is in an on state, the second terminal of the second transistor 611 and the third wire 608 are electrically connected. On the other hand, when the fourth switch 613 is in an off state, the second terminal of the second transistor 611 and the third wire 608 are electrically disconnected. Further, when the second switch 603 is in an on state, the gate terminal of the second transistor 611 and the fourth wire 609 are electrically connected. On the other hand, when the second switch 603 is in an off state, the gate terminal of the second transistor 611 and the fourth wire 609 are electrically disconnected.

The first terminal of the first transistor 601 and the first terminal of the second transistor 611 are connected to the second wire 607 through the first switch 602. That is to say, when the first switch 602 is in an on state, the first terminals of the first transistor 601 and the second transistor 611 are electrically connected to the second wire 607. On the other hand, when the first switch 602 is in an off state, the first terminals of the first transistor 601 and the second transistor 611 are electrically disconnected to the second wire 607.

The gate terminals of the first transistor 601 and the second transistor 611 are electrically connected, and the capacitor 604 is connected between the gate terminals and the first terminals of the first transistor 601 and the second transistor 611. That is to say, a first electrode of the capacitor 604 is connected to the gate terminals of the first transistor 601 and the second transistor 611, and a second electrode of the capacitor 604 is connected to the first terminals of the first transistor 601 and the second transistor 611. It is to be noted that the capacitor 604 may have a structure where an insulating film is interposed between a wire, an active layer, an electrode, and the like, or can be omitted by using the gate capacitance of the first transistor 601 or the gate capacitance of the second transistor 611.

It is to be noted that a predetermined potential is inputted to an opposed electrode 610 of the display element 605, the third wire 608, and the fourth wire 609.

By inputting a signal to the first wire 606, the first switch 602 and the second switch 603 are controlled to be turned on or off.

A signal is inputted to the second wire 607 in accordance with a gray scale level of the pixel. This signal corresponds to a video signal and a signal current flows to the second wire 607.

It is to be noted that transistors can be applied to the first switch 602, the second switch 603, the third switch 612, and the fourth switch 613. Therefore, n-channel transistors can also be applied to the first switch 602 and the second switch 603.

Subsequently, operation of the pixel of FIG. 6 is described.

It is to be noted that the operation of a pixel includes signal writing operation for writing a signal to the pixel and light emitting operation for emitting light of a gray scale level in accordance with a signal written to the pixel. Transistors (transistors to be turned on) used in pixels described in this embodiment mode are switched between in the signal writing operation and in the light emitting operation in one period and in the signal writing operation and in the light emitting operation in another period.

FIG. 7A is a diagram showing signal writing operation in a certain period and FIG. 7B is a diagram showing light emitting operation in this period. Further, FIG. 7C is a diagram showing signal writing operation in another period and FIG. 7D is a diagram showing light emitting operation in this period. It is to be noted that a current source 701 connected to the second wire 607 sets a signal current to be written to the pixel. The second wire 607 is connected to a wire 702 through a current source 701. A predetermined potential is inputted to the wire 702. Here, potentials inputted to the third wire 608, the fourth wire 609, the wire 702, and the opposed electrode 610 are denoted by V3, V4, V5, and Vcom respectively. As for a relation of potentials, V3>Vcom>V5 is at least satisfied.

Further, FIG. 7A shows a state where a pixel becomes a steady state in the signal writing operation in a certain period and a current flow at this time. The first switch 602, the second switch 603, and the fourth switch 613 are in an on state whereas the third switch 612 is in an off state. In this case, the second transistor 611 is used. That is to say, the signal current Idata set by a current source 701 flows from the third wire 608 to the second transistor 611 through the fourth switch 613. At this time, the second transistor 611 has a gate-source voltage high enough to apply the signal current Idata, and a charge for the voltage is accumulated in the capacitor 604.

Therefore, in the light emitting operation, the first switch 602, the second switch 603, and the third switch 612 are turned off whereas the fourth switch 613 is turned on, and a current flows as shown in FIG. 7B. That is, a current flows from the third wire 608 to the display element 605 through the fourth switch 613 and the second transistor 611. This current is approximately equal to the signal current Idata.

However, the drain-source voltage of the second transistor 611 varies between in the signal writing operation and in the light emitting operation, which generates a slight difference in amount of current which flows to the second transistor 611. If there is a variation in characteristics of the second transistor 611 per pixel, it is recognized as display unevenness.

Thus in another period, in the signal writing operation, the first switch 602, the second switch 603, and the third switch 612 are turned on whereas the fourth switch 613 is turned off. FIG. 7C shows a state where a pixel becomes a steady state in this period and a current flow at this time. In this case, the first transistor 601 is used. That is to say, the signal current Idata set by a current source 701 flows from the third wire 608 to the first transistor 601 through the third switch 612. At this time, the first transistor 601 has a gate-source voltage high enough to apply the signal current Idata, and a charge for the voltage is accumulated in the capacitor 604.

Therefore, in the light emitting operation, the first switch 602, the second switch 603, and the fourth switch 613 are turned off whereas the third switch 612 is turned on, and a current flows as shown in FIG. 7D. That is, a current flows from the third wire 608 to the display element 605 through the third switch 612 and the first transistor 601. This current is approximately equal to the signal current Idata.

In this manner, transistors to be used are switched per period, thereby transistor characteristics can be averaged in terms of time. Accordingly, display unevenness can be reduced.

Further, another driving method can be applied to a pixel described in this embodiment mode. For example, in signal writing operation, a signal is written with a large amount of signal current, and the amount of current applied to a display element in light emitting operation is reduced. Hereinafter, such a driving method is described FIG. 8A is a diagram showing signal writing operation and FIG. 8B is a diagram showing light emitting operation.

Figure 8B:
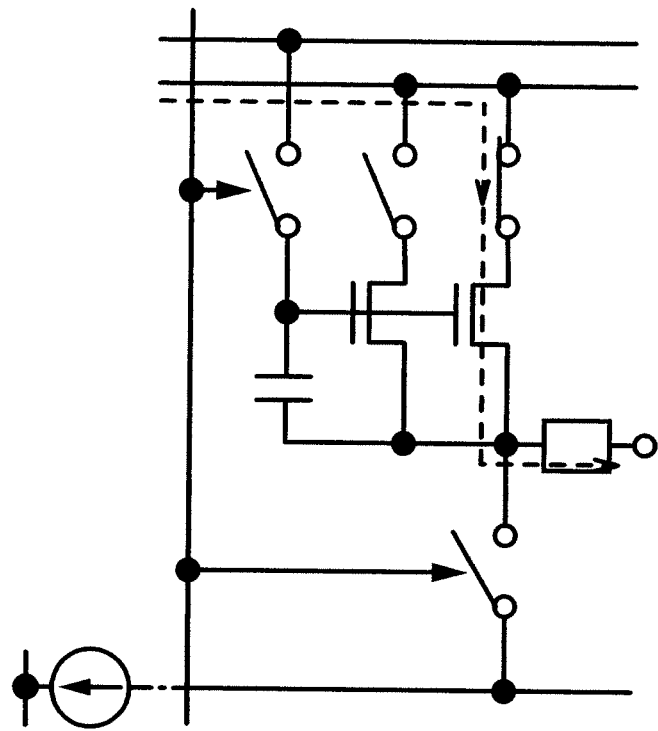
FIGS. 8A and 8B are diagrams showing operation of a pixel of the invention.
Figure 8A:
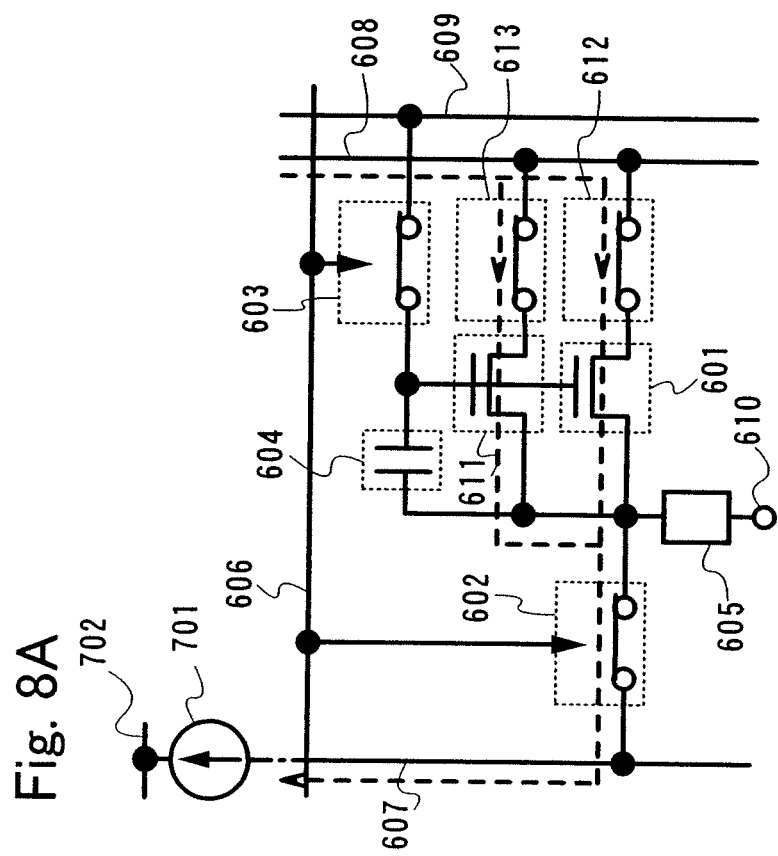

Further, FIG. 8A shows a state where a pixel becomes a steady state in the signal writing operation and a current flow at this time. The first switch 602, the second switch 603, the third switch 612, and the fourth switch 613 are in an on state, and a current flows as shown in FIG. 8A. That is, as paths of current, there are a first path where a current flows from the third wire 608 to the first transistor 601 through the third switch 612 and a second path where a current flows from the third wire 608 to the second transistor 611 through the fourth switch 613. A current I1 that flows through the first path and a current I2 that flows through the second path unite at a connecting portion of the first terminals of the first transistor 601 and the second transistor 611. Then, a current I1 and a current I2 flow as the signal current Idata to the wire 702 through the first switch 602 and a current source 701. That is to say, I1+I2=Idata is satisfied.

Description is made with reference to FIG. 8B of the light emitting operation. The first switch 602, the second switch 603, and the fourth switch 613 are turned off whereas the third switch 612 is turned on, and then a current flows as shown in FIG. 8B. Since the second switch 603 is in an off state at this time, the capacitor 604 holds a gate-source voltage Vgs necessary for a current flowing to the first transistor 601 and the second transistor 611 to be the signal current Idata. Accordingly, a current flows to the display element 605 through the first transistor 601. With this structure, this current can be adjusted.

Here, the channel length and the channel width of a transistor are denoted by L and W respectively. When the transistor operates in a saturation region, a current value flowing through the transistor is generally proportional to W/L as far as a gate-source voltage is constant. In other words, a current value is proportional to the channel width W and inversely proportional to the channel length L.

Therefore, the channel width of the first transistor 601 and the channel width of the second transistor 611 are denoted by W1 and W2 respectively, and these transistors have the same channel length. If the first transistor 601 and the second transistor 611 through which a current flows are regarded as one transistor in FIG. 8A, the channel width and the channel length can be regarded as (W1+W2) and L respectively. On the other hand, in FIG. 8B, a current flows only through the first transistor 601 and the transistor has the channel width W1 and the channel length L. Therefore, in light emitting operation, a current of Idata×(W1/(W1+W2)) can be applied to the display element 605.

In this manner, the channel width or the channel length of the first transistor 601 or the second transistor 611 is adjusted, thereby a smaller amount of current than the signal current which is applied in signal writing operation can be applied to the display element 605.

Further, the channel width W1 and the channel length W2 are set to be the same and a transistor used in light emitting operation is switched per certain period. Accordingly, characteristics of the transistor can be averaged in terms of time.

By switching the transistor to be used between in the signal writing operation and in the light emitting operation, a ratio W/L of the channel width W to the channel length L of the transistor which is used in the signal writing operation and the light emitting operation may be adjusted and the amount of current applied to the display element may be adjusted.

That is, as shown in FIG. 9A, in the signal writing operation, the first switch 602, the second switch 603, and the fourth switch 613 are turned on whereas the third switch 612 is turned off. Then, the signal current Idata is applied from the third wire 608 to the second transistor 611 through the fourth switch 613. In the light emitting operation, the first switch 602, the second switch 603, and the fourth switch 613 are turned off whereas the third switch 612 is turned on. Then, a current of Idata×(W1/W2) flows through the first transistor 601. It is to be noted that the amount of current applied to the display element 605 in the light emitting operation can be set smaller than the signal current Idata as far as W1<W2 is satisfied.

Thus, by writing a signal with a large amount of current in the signal writing operation, even when parasitic capacitance is formed in the path where the signal current flows, signal writing can be performed rapidly. Accordingly, a display defect can be prevented.

The above description is made of a case where the amount of current which is applied to the display element in the light emitting operation is smaller than the signal current applied in the signal writing operation. However, the amount of current which is applied to the display element in the light emitting operation may be larger than the signal current applied in the signal writing operation depending on cases. For example, in the signal writing operation, a current may be applied to either the first transistor 601 or the second transistor 611 whereas in the light emitting operation, a current may be applied to both the first transistor 601 and the second transistor 611. It is to be noted in FIG. 9 that the amount of current applied to the display element 605 in the light emitting operation can be set larger than the signal current Idata as far as W1>W2 is satisfied.

Further, in a pixel of this embodiment mode, pre-charging operation may be performed. The operation is described with reference to FIG. 10. In this case, a current source 701 is connected to the second wire 607 through a fifth switch 1003. The second wire 607 is connected to a wire 1002 through a sixth switch 1004 and a pre-charging current source 1001. It is to be noted that the pre-charging current source 1001 to be used which can set a larger amount of current than a current source 701. A predetermined potential is inputted to the wire 1002. As the wire 702 and the wire 1002, the same wire or different wires may be used.

Figure 10B:
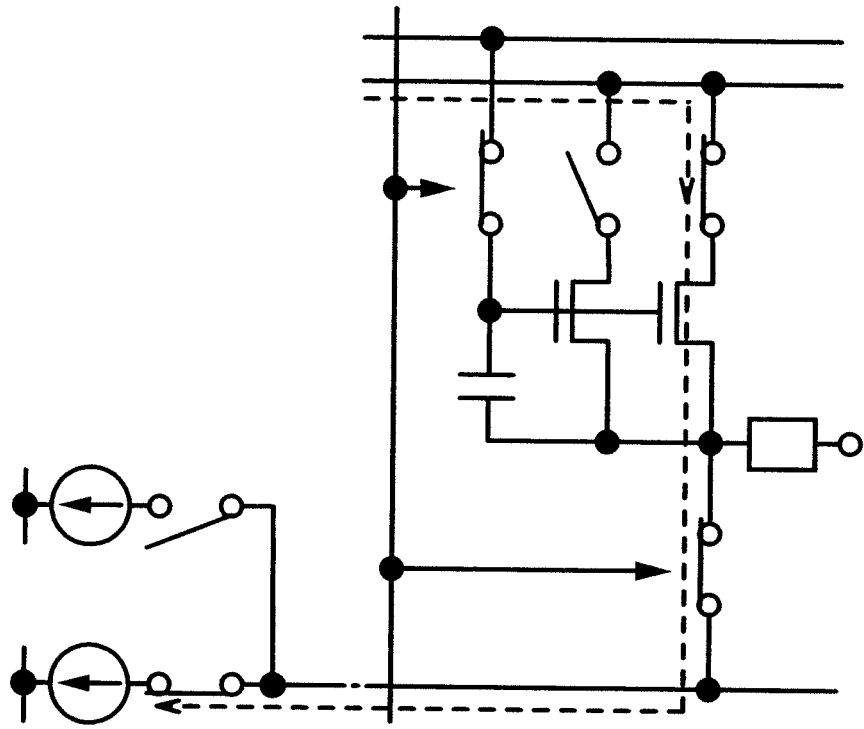
FIGS. 10A and 10B are diagrams showing operation of a pixel of the invention.
Figure 10A:
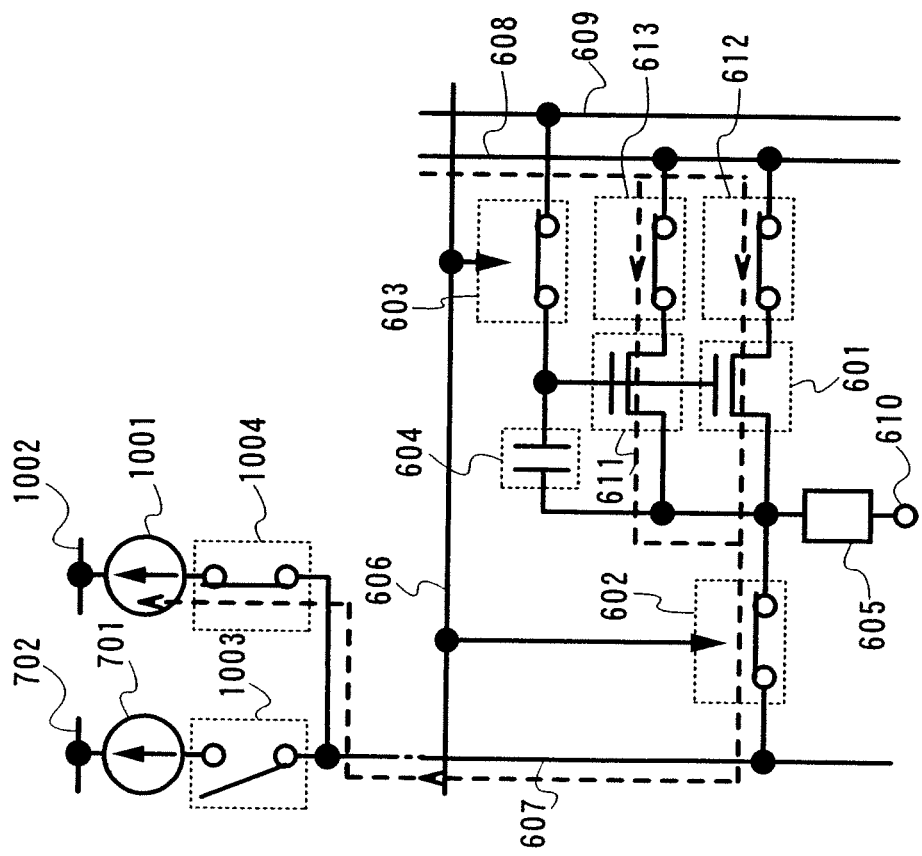

First, FIG. 10A shows a state where a pixel becomes a steady state in the pre-charging operation and a current flow at this time. The first switch 602, the second switch 603, the third switch 612, the fourth switch 613, and the sixth switch 1004 are turned on whereas the fifth switch 1003 is turned off. Then, a current set by the pre-charging current source 1001 flows from the third wire 608 to the first transistor 601 and the second transistor 611 through the third switch 612 and the fourth switch 613, respectively. Thus, a charge is accumulated in the capacitor 604.

In the setting operation, the first switch 602, the second switch 603, the third switch 612, and the fifth switch 1003 are turned on whereas the fourth switch 613 and the sixth switch 1004 are turned off. Then, in a steady state, a current flows as shown in FIG. 10B. That is to say, the signal current Idata set by a current source 701 flows from the third wire 608 to the first transistor 601. Then, a charge for the gate-source voltage necessary for applying the signal current Idata to the first transistor 601 is accumulated in the capacitor 604.

A current applied to the pre-charging current source 1001, the channel length L1 and the channel width W1 of the first transistor 601, and the channel length L2 and the channel width W2 of the second transistor 611 are appropriately determined, thereby a charge which is accumulated in the capacitor 604 in the pre-charging operation can be set so as to be approximately equal to that in the setting operation, and the signal current can be written to a pixel rapidly.

In FIG. 10, although a current is applied to the first transistor 601 and the second transistor 611 in the pre-charging operation, a current may be applied to only one of them. Then, in the setting operation, a current may be applied to the other transistor.

Figure 18:
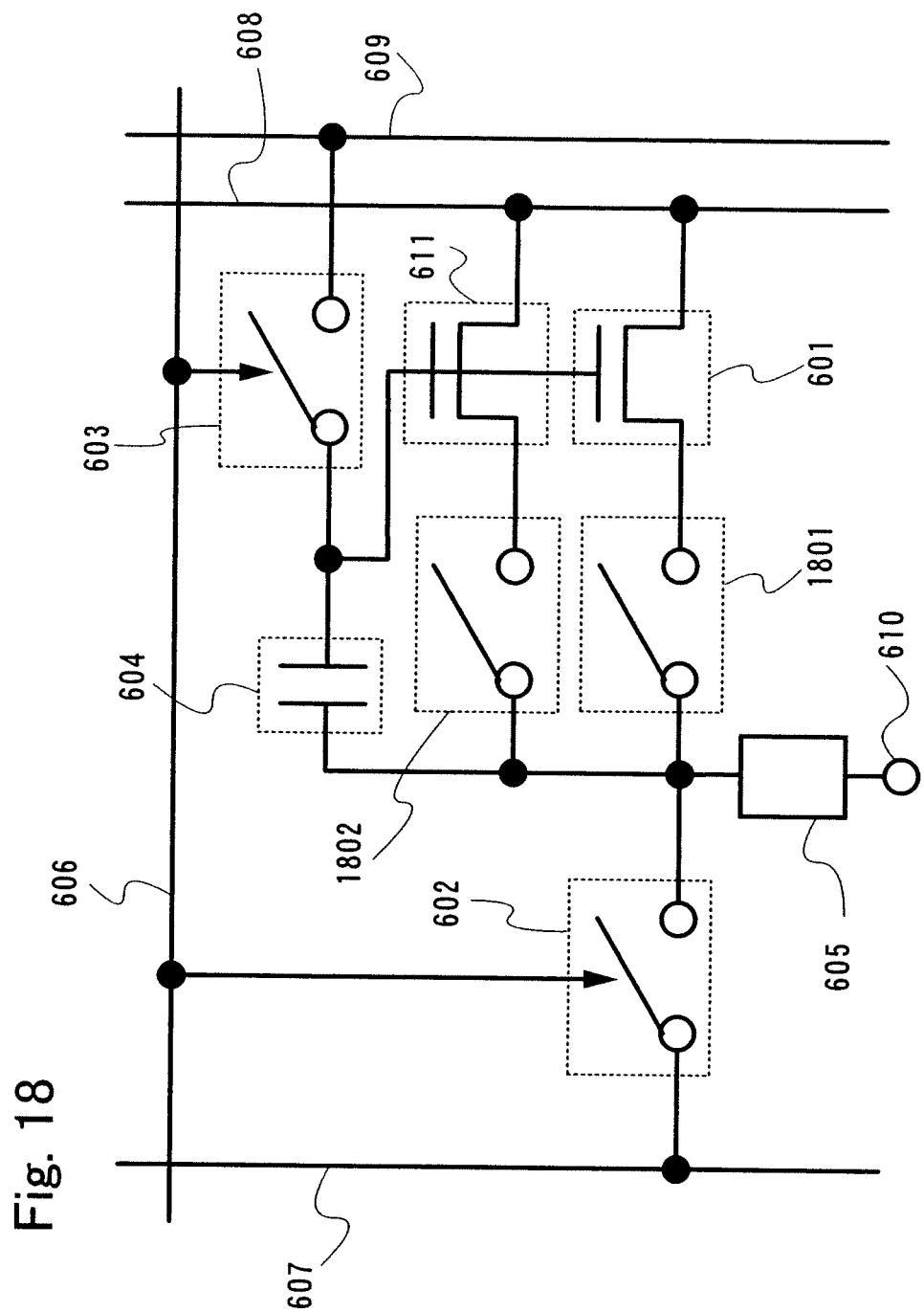
FIG. 18 is a diagram showing a pixel structure of the invention.

As described above, the invention is not limited to a structure where the third switch 612 is connected between a second terminal of the first transistor 601 and the third wire 608, and the fourth switch 613 is connected between a second terminal of the second transistor 611 and the third wire 608. A structure shown in FIG. 18 may be employed. That is, a first terminal (one of a source terminal and a drain terminal) of the first transistor 601 is connected to a pixel electrode of the display element 605 through a third switch 1801 and a second terminal (the other of the source terminal and the drain terminal) of the first transistor 601 is connected to the third wire 608. That is to say, when the third switch 1801 is in an on state, the first terminal of first transistor 601 and the pixel electrode of the display element 605 are electrically connected. On the other hand, when the third switch 1801 is in an off state, the first terminal of the first transistor 601 and the pixel electrode of the display element 605 are electrically disconnected. Similarly, the second transistor 611 is connected to the first transistor 601 in parallel. That is, first terminal (one of a source terminal and a drain terminal) of the second transistor 611 is connected to a pixel electrode of the display element 605 through a fourth switch 1802 and a second terminal (the other of the source terminal and the drain terminal) of the second transistor 611 is connected to the third wire 608. That is to say, when the fourth switch 1802 is in an on state, the first terminal of the second transistor 611 and the pixel electrode of the display element 605 are electrically connected. On the other hand, when the fourth switch 1802 is in an off state, the first terminal of the second transistor 611 and the pixel electrode of the display element 605 are electrically disconnected.

In this embodiment mode, in the signal writing operation, a gate terminal of a transistor to which a current is applied can be set so as to have a predetermined potential; therefore, a potential difference between the pixel electrode of the display element and the opposed electrode can be lower than a forward threshold voltage of the display element. Accordingly, a current can be prevented from flowing to the display element in the signal writing operation.

Also in this embodiment mode, n-channel transistors may be used for the first switch 602, the second switch 603, the third switch 612, and the fourth transistor 613, thereby a pixel can be formed of a unipolar transistor. Accordingly, manufacturing steps can be simplified. As a result, reduction in a manufacturing cost and improvement in the yield can be achieved. Further, since a pixel can be formed of only an n-channel transistor, a semiconductor layer of the transistor which is included in the pixel can be formed of an amorphous semiconductor, a semi-amorphous semiconductor (also referred to as microcrystalline semiconductor), or the like. For example, amorphous silicon (a-Si:H) may be used as an amorphous semiconductor. Therefore, manufacturing steps can be further simplified. As a result, reduction in a manufacturing cost and improvement in the yield can be achieved.

Embodiment Mode 3

Figure 11:
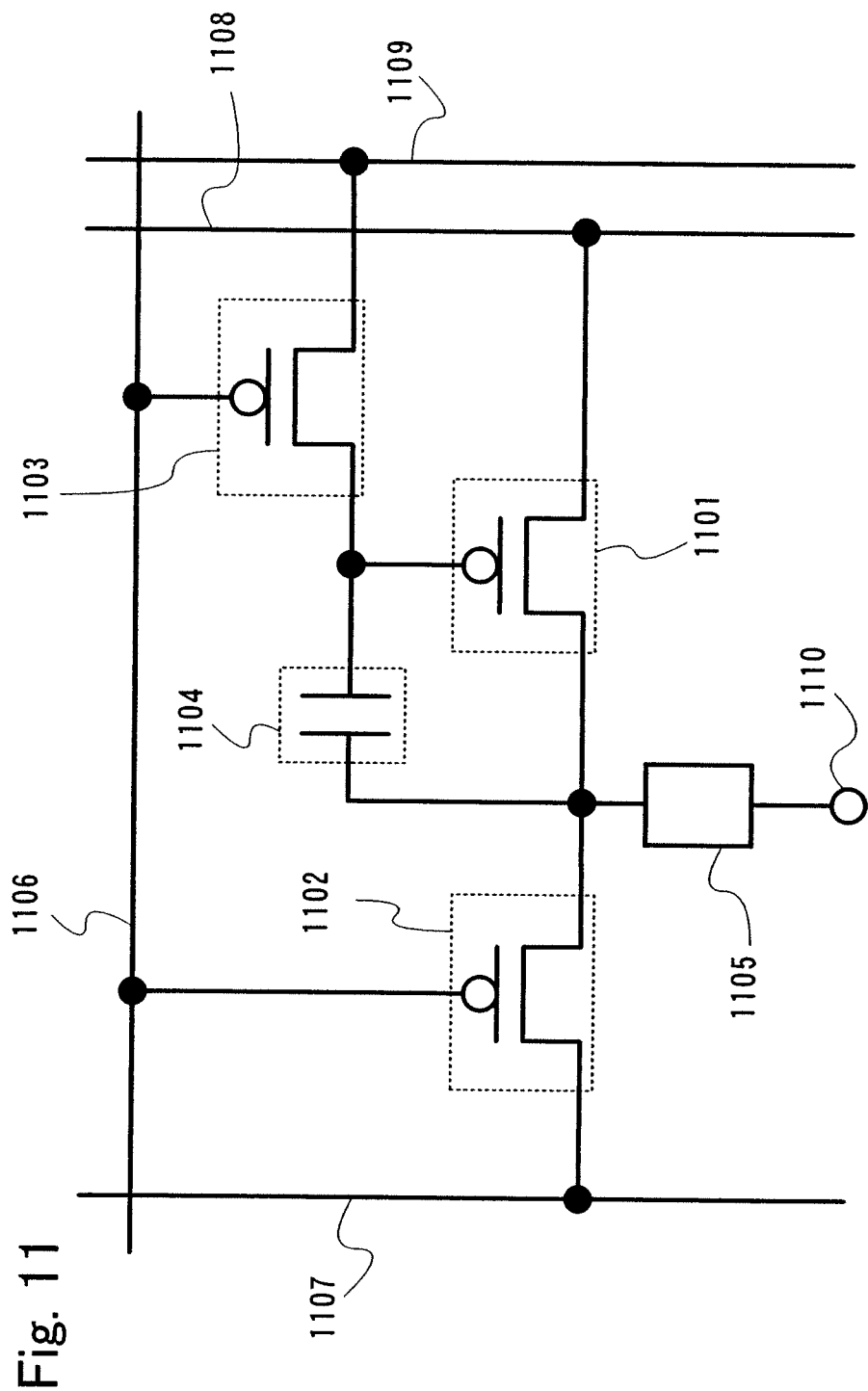
FIG. 11 is a diagram showing a pixel structure of the invention.

In this embodiment mode, description is made with reference to FIG. 11 of a case where a p-channel transistor is applied to a transistor included in a pixel of the invention.

A pixel described in this embodiment mode includes a transistor 1101, a first switching transistor 1102, a second switching transistor 1103, a capacitor 1104, a display element 1105, a first wire 1106, a second wire 1107, a third wire 1108, and a fourth wire 1109. It is to be noted that the transistor 1101, the first switching transistor 1102, and the second switching transistor 1103 are p-channel transistors.

First, a connection structure of the pixel is described.

A first terminal (one of a source terminal and a drain terminal) and a second terminal (the other of the source terminal and the drain terminal) of the transistor 1101 are connected to a pixel electrode of the display element 1105 and the third wire 1108 respectively. A gate terminal of the transistor 1101 is connected to the fourth wire 1109 through the second switching transistor 1103. That is to say, when the second switching transistor 1103 is in an on state, the gate terminal of the transistor 1101 and the fourth wire 1109 are electrically connected. On the other hand, when the second switching transistor 1103 is in an off state, the gate terminal of the transistor 1101 and the fourth wire 1109 are electrically disconnected. A gate terminal, a first terminal (one of a source terminal and a drain terminal), and a second terminal (the other of the source terminal and the drain terminal) of the second switching transistor 1103 are connected to the first wire 1106, the gate terminal of the transistor 1101, and the fourth wire 1109 respectively. Therefore, when a signal inputted to the first wire 1106 is at H level, the second switching transistor 1103 is turned on whereas when the signal is at L level, the second switching transistor 1103 is turned off.

Further, the first terminal of the transistor 1101 is connected to the second wire 1107 through the first switching transistor 1102. That is to say, when the first switching transistor 1102 is in an on state, the first terminal of the transistor 1101 and the second wire 1107 are electrically connected. On the other hand, when the first switching transistor 1102 is in an off state, the first terminal of the transistor 1101 and the second wire 1107 are electrically disconnected. A gate terminal, a first terminal (one of a source terminal and a drain terminal), and a second terminal (the other of the source terminal and the drain terminal) of the first switching transistor 1102 are connected to the first wire 1106, the second wire 1107, and the pixel electrode of the display element 1105 and the first terminal of the transistor 1101, respectively. Therefore, when a signal inputted to the first wire 1106 is at H level, the first switching transistor 1102 is turned on whereas when the signal is at L level, the first switching transistor 1102 is turned off.

The capacitor 1104 is connected between the gate terminal and the first terminal of the transistor 1101. That is to say, a first electrode and a second electrode of the capacitor 1104 are connected to the gate terminal and the first terminal of the transistor 1101 respectively. It is to be noted that the capacitor 1104 may have a structure where an insulating film is interposed between a wire, an active layer, an electrode, and the like, or can be omitted by using the gate capacitance of the transistor 1101.

It is to be noted that a predetermined potential is inputted to the opposed electrode 1110 of the display element 1105, the third wire 1108, and the fourth wire 1109.

By inputting a signal to the first wire 1106, the first switching transistor 1102 and the second switching transistor 1103 are controlled to be turned on or off.

A signal is inputted to the second wire 1107 in accordance with a gray scale level of a pixel. This signal corresponds to a video signal and a signal current flows to the second wire 1107.

Subsequently, description is made with reference to FIGS. 12A to 12C of operation of the pixel of this embodiment mode.

It is to be noted that a current source 1201 connected to the second wire 1107 sets a signal current Idata which is written to a pixel. The second wire 1107 is connected to a wire 1202 through a current source 1201. A predetermined potential is inputted to the wire 1202. Here, potentials inputted to the third wire 1108, the fourth wire 1109, the wire 1202, and the opposed electrode 1110 are denoted by V3, V4, V5, and Vcom respectively. As for a relation of the potentials, V3<Vcom<V5 is at least satisfied.

It is to be noted that the operation of a pixel includes signal writing operation for writing a signal to a pixel and light emitting operation for emitting light of a gray scale level in accordance with the signal written to the pixel. FIGS. 12A and 12B are diagrams showing signal writing operation, and FIG. 12C is a diagram showing light emitting operation.

First, a transient state in signal writing operation is described with reference to FIG. 12A. A signal which is inputted to the first wire 1106 is set to be at L level, thereby turning on the first and second switching transistors 1102 and 1103. Accordingly, a current flows as shown in FIG. 12A. That is, the signal current Idata set by a current source 1201 flows to the capacitor 1104 and the transistor 1101. If a current Ic and a current Itr flow to the capacitor 1104 and the transistor 1101 respectively, Ic+Itr=Idata is satisfied.

A current does not flow to the capacitor 1104 before long, which leads to a steady state in the signal writing operation. Therefore, a current flows as shown in FIG. 12B. A current Itr that flows to the transistor 1101 is equal to the signal current Idata. That is, a gate-source voltage Vgs of the transistor 1101 is necessary for applying the signal current Idata to the transistor 1101. A charge for the gate-source voltage Vgs of the transistor 1101 is accumulated in the capacitor 1104.

It is to be noted that when potentials of the gate terminal and the first terminal of the transistor 1101 at this time are denoted by Va and Vb respectively, Vgs=(Va−Vb) is satisfied. When a forward threshold voltage of the display element 1105 is denoted by $V_{ELth}$, (Vcom−Vb)<$V_{ELth}$ is preferably satisfied, thereby applying no current to the display element 1105 in the signal writing operation. Therefore, the potential V4 to be inputted to the fourth wire 1109 is desirably set so as to satisfy V3<V4<V5. When V4=Vcom is satisfied, the number of power sources necessary for pixels can be reduced. Further, a reverse bias can be applied to the display element 1105 in the signal writing operation.

It is to be noted that even when a reverse bias is applied to the display element 1105, a current does not flow to the display element 1105 normally (if flows, it is a slight amount of current). On the other hand, in the case where the display element 1105 has a short-circuited portion, a current flows to the short-circuited portion. Then, the short-circuited portion is insulated, thereby a display defect can be improved.

Subsequently, description is made with reference to FIG. 12C of the light emitting operation. A signal inputted to the first wire 1106 is set to be at H level, thereby turning off the first and second switching transistors 1102 and 1103. Thus, a current flows as shown in FIG. 12C. At this time, the second switching transistor 1102 is in an off state. Therefore, the capacitor 1104 holds the gate-source voltage Vgs necessary for applying the signal current Idata to the transistor 1101. Accordingly, a current which is almost equivalent to the signal current Idata flows to the transistor 1101.

It is to be noted that when potentials of the gate terminal and the first terminal of the transistor 1101 at this time are denoted by Va' and Vb' respectively, Vgs=(Va'−Vb') is satisfied. This is because Va' is increased as Vb' is increased since the capacitor 1104 holds the gate-source voltage Vgs although Vb'>Vb is satisfied.

It is to be noted that when potentials of L level signal and H level signal to be inputted to the first wire 1106 are denoted by V1(L) and V1(H) respectively, the following potentials are preferable. Threshold voltages of the first switching transistor 1102 and the second switching transistor 1103 are denoted by Vth1 and Vth2 respectively.

As shown in FIG. 12B, even when a potential of the pixel electrode of the display element 1105 becomes Vb, the first switching transistor 1102 is required to be in an on state. Therefore, V1(L)<(Vb+Vth1) is satisfied. Further, V1(L)<(V4+Vth2) is satisfied in order that the second switching transistor 1103 is in an on state. Specifically, for example, when V4=Vcom is satisfied, V1(L) is preferably a potential lower than Vcom by 1 to 8 V.

As shown in FIG. 12C, V1(H)>(Vb+Vth1) is satisfied in order that the first switching transistor 1102 is turned off. That is, when the signal current is written to another pixel, a potential of the second wire 1107 becomes Vb. Therefore, in a pixel which is not selected at this time, the first switching transistor 1102 is required to be in an off state. On the other hand, V1(H)>V4+Vth2 is satisfied in order that the second switching transistor 1103 is in an off state. Specifically, for example, when V4=Vcom is satisfied, V1(H) is preferably a potential higher than Vcom by 1 to 8 V.

By employing the pixel structure described in this embodiment mode, a potential of a gate terminal of a transistor in the signal writing operation can be controlled, thereby preventing a current from flowing to a display element at this time.

Figure 12:
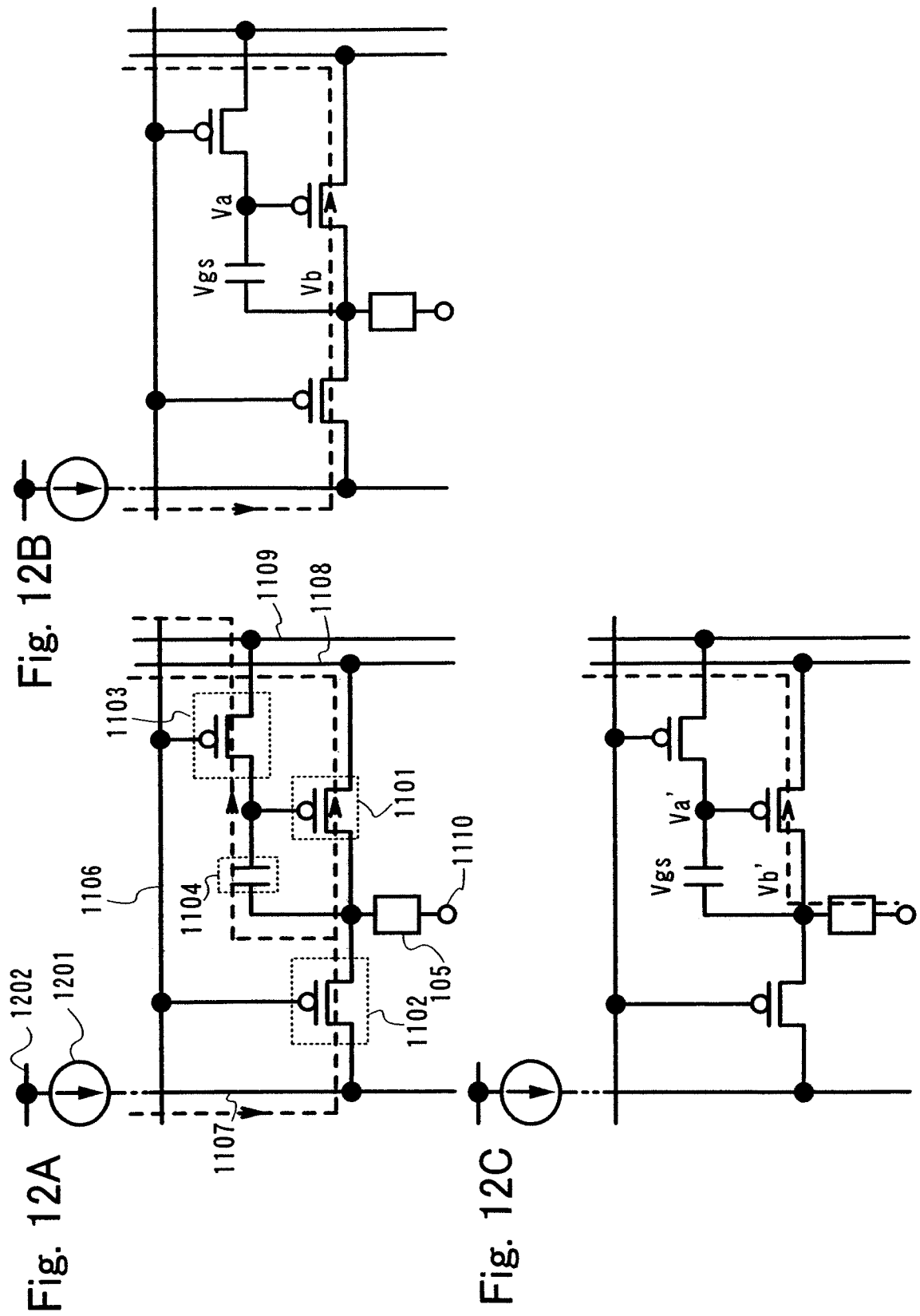
FIGS. 12A to 12C are diagrams showing operation of a pixel of the invention.

By employing the pixel structure shown in FIG. 12, a pixel can be formed of only p-channel transistors, which can simplify manufacturing steps.

Further, by employing the structure of the invention, |Vds|>|Vgs| can be satisfied in the signal writing operation. A change in the Vds can be made small between in the signal writing operation and in the light emitting operation. Therefore, even if constant current characteristics (flatness of current) in a saturation region of the transistor 1101 are bad, current values are almost equivalent between in the signal writing operation and in the light emitting operation. In particular, when an amorphous semiconductor film (such as amorphous silicon) is used for a semiconductor layer of the transistor 1101, constant current characteristics (flatness of current) in a saturation region of the transistor 1101 may be deteriorated. Thus, when the structure of the invention is applied in the case where an amorphous semiconductor film is used for a semiconductor layer of the transistor 1101, a display defect can be prevented.

Embodiment Mode 4

In this embodiment mode, in particular, description is made of a driving method for reducing a source-drain voltage of a transistor in signal writing operation and light emitting operation.

Description is made using the pixel of FIG. 1. Since a connection structure of the pixel is described in Embodiment Mode 1, description thereof is omitted here.

In this embodiment mode, a potential of the opposed electrode 110 in signal writing operation is higher than that in light emitting operation. The potential of the opposed electrode 110 at this time is allowable as far as a forward current does not flow to the display element 105 in the signal writing operation. The potential may be the same as or higher than that of the third wire 108.

Moreover, in the signal writing operation, a signal is inputted to the first wire 106, thereby turning on the first and second switches 102 and 103. Then, a charge for a gate-source voltage necessary for applying the signal current Idata which flows to the second wire 107 to the transistor 101 is accumulated in the capacitor 104.

At this time, a potential of the fourth wire 109 to which a gate terminal of the transistor 101 is connected is a predetermined potential.

Subsequently, in the light emitting operation, a signal is inputted to the first wire 106, thereby turning off the first and second switches 102 and 103. The potential of the opposed electrode 110 at this time is lower than that in the signal writing operation.

The capacitor 104 holds the gate-source voltage necessary for applying the signal current Idata to the transistor 101; therefore, a current which is almost equivalent to the signal current Idata flows to the transistor 101. Then, a current flows to the display element 105.

A potential of a pixel electrode of the display element 105 at this time is higher than that of the opposed electrode 110. That is, a potential of a source terminal of the transistor 101 is higher than that of the opposed electrode 110.

Therefore, a potential of the fourth wire 109 for supplying a potential to be inputted to a gate terminal of the transistor 101 in the signal writing operation and a potential which is inputted to the opposed electrode 110 of the display element 105 in the light emitting operation are appropriately set, thereby potential difference of a first terminal of the transistor 101 can be reduced between in the signal writing operation and in the light emitting operation. Since a predetermined potential is inputted to a second terminal of the transistor 101, the potential of the first terminal of the transistor 101 is controlled, thereby difference of a drain-source voltage of the transistor 101 can be made small between in the signal writing operation and in the light emitting operation.

Therefore, even if constant current characteristics (flatness of current) in a saturation region of the transistor 101 is deteriorated, difference of current values can be made small between in the signal writing operation and in the light emitting operation. Accordingly, display unevenness can be reduced. In particular, when an amorphous semiconductor (such as amorphous silicon) is used for a semiconductor layer of a transistor of a pixel, constant current characteristics (flatness of current) are often deteriorated. Therefore, a driving method of this embodiment mode is applied, thereby preventing a display defect.

Further, a potential to be inputted to the fourth wire 109 is set per column of pixels in accordance with the amount of signal current, thereby, difference of a drain-source voltage of the transistor 101 can be made smaller between in the signal writing operation and in the light emitting operation. Accordingly, the transistor 101 may be operated in a linear region.

Embodiment Mode 5

Figure 40:
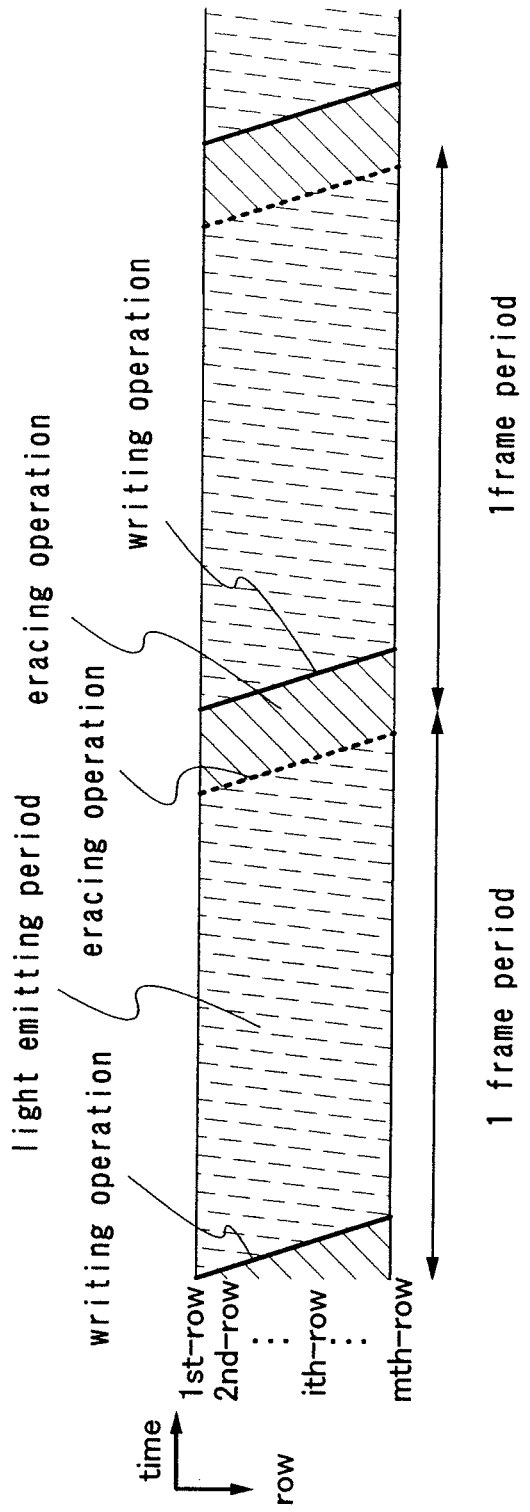
FIG. 40 is a diagram showing a driving method of the invention.

In this embodiment mode, by using a timing chart shown in FIG. 40, description is made of one mode of a driving method of a display device to which a pixel of the invention can be applied. Further, a pixel structure of the invention, to which the driving method can be applied, is described.

Horizontal direction indicates passage of time and longitudinal direction indicates the number of scan rows of scan lines.

When images are displayed, writing operation and light emitting operation are repeated. A period in which writing operation and light emitting operation for one screen (one frame) are performed is referred to as one frame period. Although there is no particular limitation on a process of signals for one frame, it is preferable that the number of one frame periods be at least about 60 times per second so as not to make a viewer notice flickers.

In a display device of this embodiment mode, a video signal is written to a pixel in accordance with a gray scale of each pixel. In other words, an analog signal is written to a pixel. The video signal is a signal current.

In a light emitting period, a gray scale is expressed by holding the video signal. Here, a display device including a pixel of this embodiment mode erases a signal written to a pixel by erasing operation. Thus, an erasing period is provided until a next frame period. That is, black display is inserted, thereby persistence of vision can be hardly seen. Accordingly, characteristics of a moving image can be improved.

Description is made of a pixel structure to which a driving method of this embodiment mode can be applied. A pixel of this embodiment mode is allowable as far as it has a means of forcibly making a pixel emit no light by scanning. As such a means, in the case of the pixel shown in FIG. 1, a path of a current from the third wire 108 to the opposed electrode 110 of the display element 105 through the transistor 101 is preferably made non-conductive.

There are roughly two methods of making the path of a current no-conductive. As one method, another switch is provided in the path of a current from the third wire 108 to the opposed electrode 110 of the display element 105 through the transistor 101. Then, the switch is turned off by scanning a pixel per row, thereby the path of a current is made non-conductive.

Figure 42:
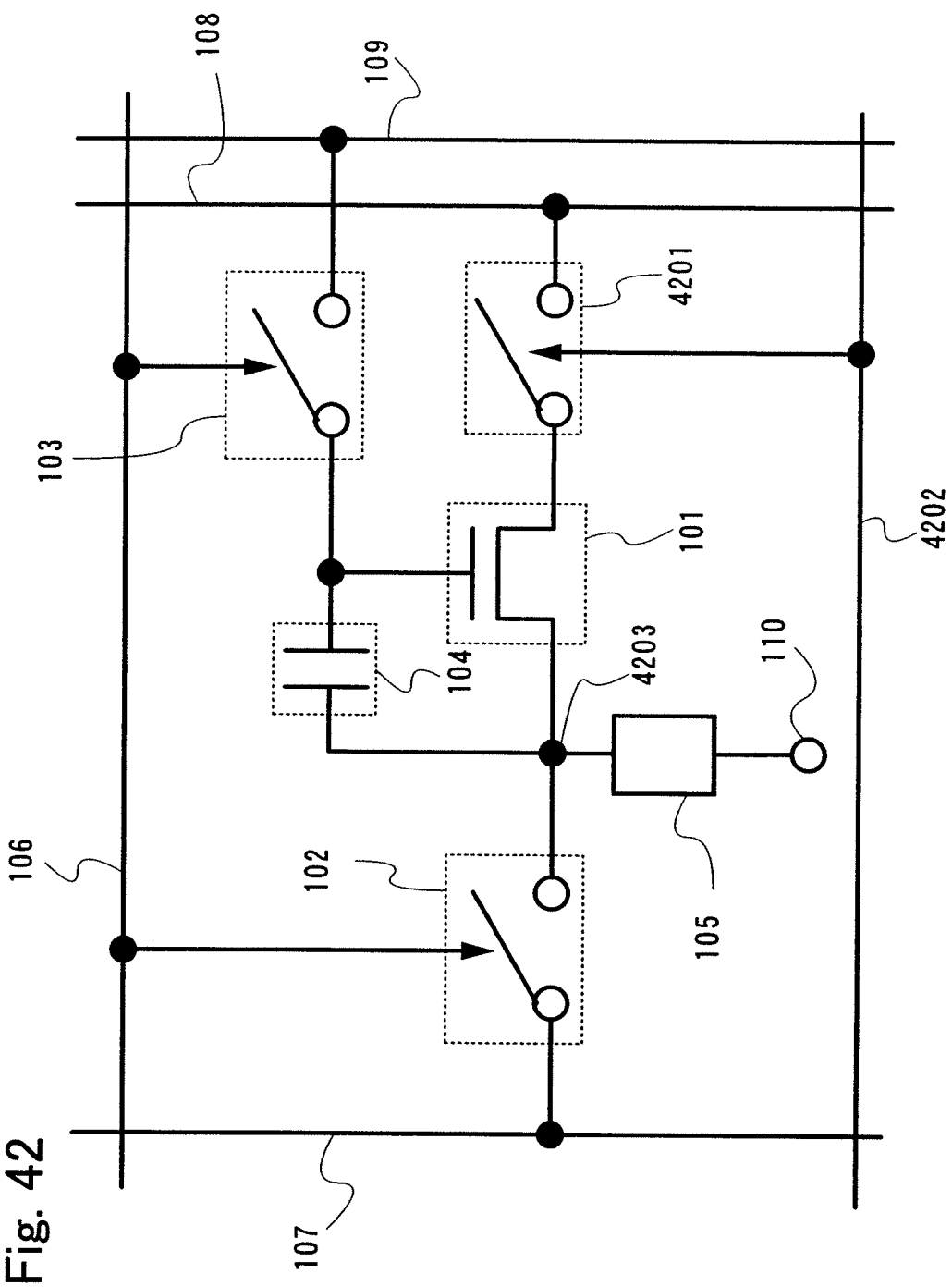
FIG. 42 is a diagram showing a pixel structure of the invention.

An example of such a structure is shown in FIG. 42. Note that common portions to those in FIG. 1 are denoted by the same reference numerals and description thereof is omitted.

In a structure of FIG. 42, a third switch 4201 is connected between a second terminal of a first transistor 101 and a third wire 108, based on the structure of FIG. 1. The third switch 4201 is controlled to be turned on or off by a signal to be inputted to a fifth wire 4202. Note that a portion where the switch is provided is not limited to the structure of FIG. 42. When a connecting point of the first terminal of the transistor 101 and a pixel electrode of a display element 105 is a node 4203, the switch may be connected between the node 4203 and the first terminal of the transistor 101 or the pixel electrode of the display element 105.

As the other method, the transistor 101 is forcibly turned off by scanning a pixel per row. Therefore, the pixel is required to have a means of discharging a charge accumulated in a capacitor 104 or a means of inputting a potential to a gate terminal of the transistor 101.

Figure 38:
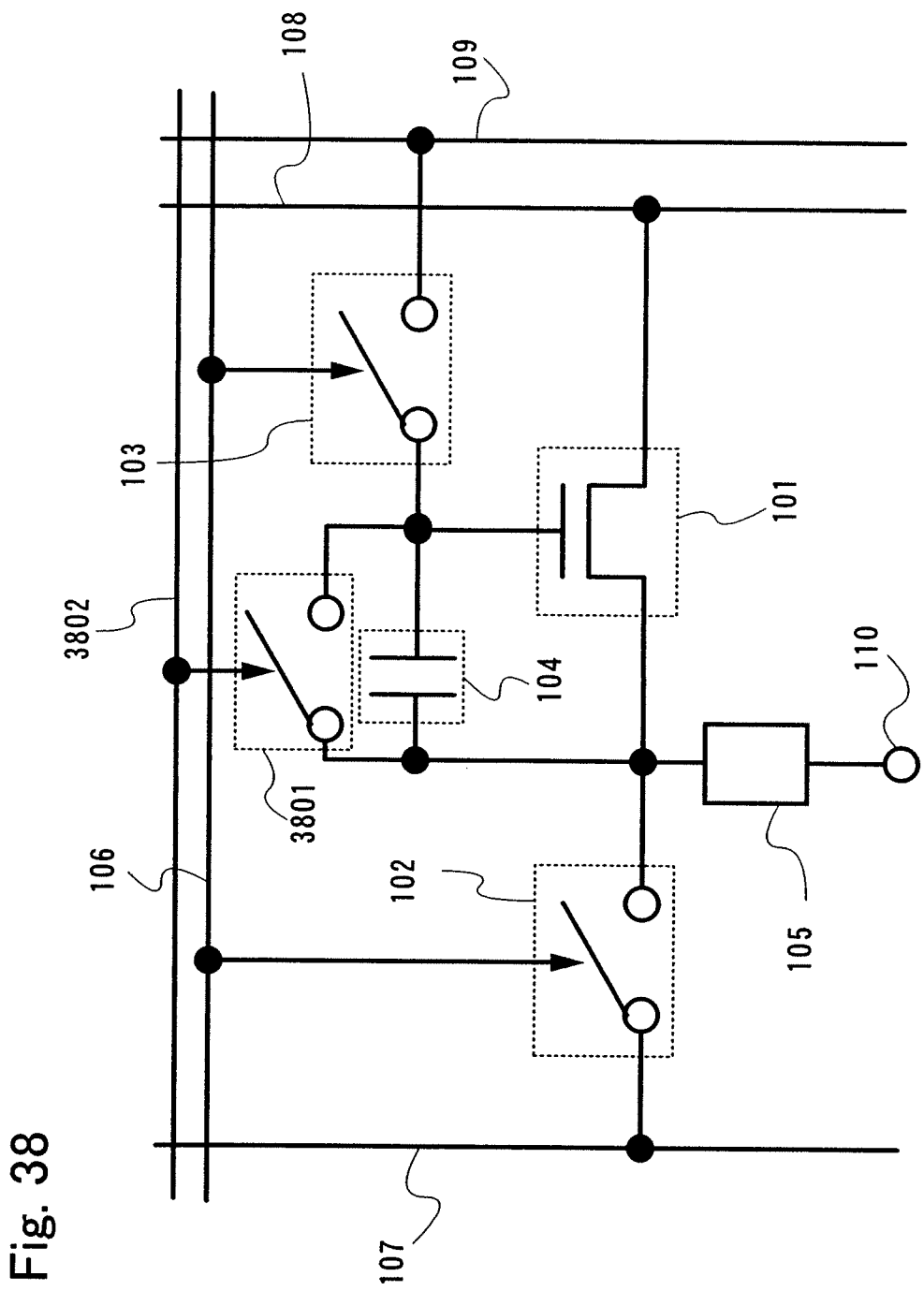
FIG. 38 is a diagram showing a pixel structure of the invention.

First, FIG. 38 shows one example of a pixel having a means of discharging a charge accumulated in a capacitor 104. Note that common portions to those in FIG. 1 are denoted by the same reference numerals and description thereof is omitted. In FIG. 38, the capacitor 104 and a third switch 3801 are connected in parallel. The third switch 3801 is controlled to be turned on or off by a signal to be inputted to a fifth wire 3802. That is, when the third switch 3801 is turned on, the gate terminal and the first terminal of the transistor 101 are short-circuited. Thus, a gate-source voltage of the transistor 101, which is held in the capacitor 104, can be set to 0 V. Accordingly, the transistor 101 can be turned off.

It is to be noted that by employing a structure of FIG. 5 or FIG. 49, a charge accumulated in the capacitor 104 can be discharged by scanning a pixel per row. In this case, a second switch 103 is turned on by a signal to be supplied to a fifth wire 501. The second switch 103 is turned on while the first switch 102 is in an off state, thereby a charge accumulated in the capacitor 104 is discharged through the transistor 101. Accordingly, the transistor 101 can be turned off.

Figure 39:
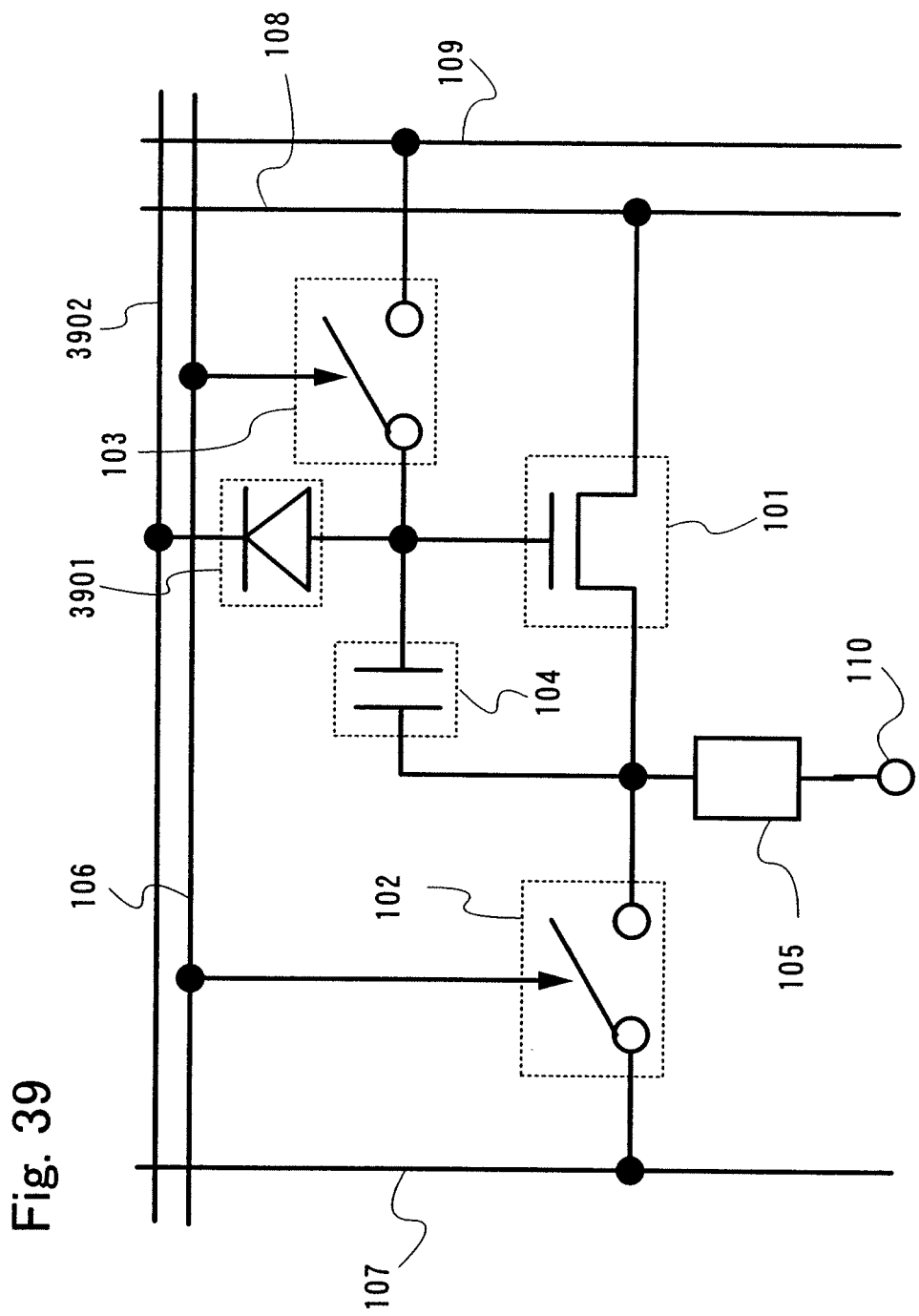
FIG. 39 is a diagram showing a pixel structure of the invention.

Further, FIG. 39 shows one example of a pixel having a means of inputting a potential to the gate terminal of the transistor 101. Note that common portions to those in FIG. 1 are denoted by the same reference numerals and description thereof is omitted. In FIG. 39, a rectifying element 3901 is connected between the gate terminal of the first transistor 101 and a fifth wire 3902. The rectifying element 3901 is connected so that direction of a current flowing from the gate terminal of the transistor 101 to the fifth wire 3902 is a forward current. Only in the case where the transistor 101 is forcibly turned off, L level signal is inputted to the fifth wire 3902, and in the other cases, H level signal is inputted to the fifth wire 3902. Accordingly, when the fifth wire 3902 is at H level, a current does not flow to the rectifying element 3901 whereas when the fifth wire 3902 is at L level, a current flows from the transistor 101 to the fifth wire 3902. Therefore, a potential of the gate terminal of the transistor 101 is higher than that of the fifth wire 3902 at L level by a forward threshold voltage of the rectifying element 3901. At this time, a charge is accumulated also in a second electrode of the capacitor 104 through the transistor 101. Then, a potential of the first terminal of the transistor 101 also becomes high. Thus, the transistor 101 can be forcibly turned off.

As another example of a pixel having a means of inputting a potential to the gate terminal of the transistor 101, a pixel structure of FIG. 5 may be employed. In this case, the second switch 103 is turned on by inputting a signal to the fifth wire 501, thereby a charge is accumulated in the second electrode of the capacitor 104 through the transistor 101. Accordingly, the transistor 101 is turned off.

Figure 41:
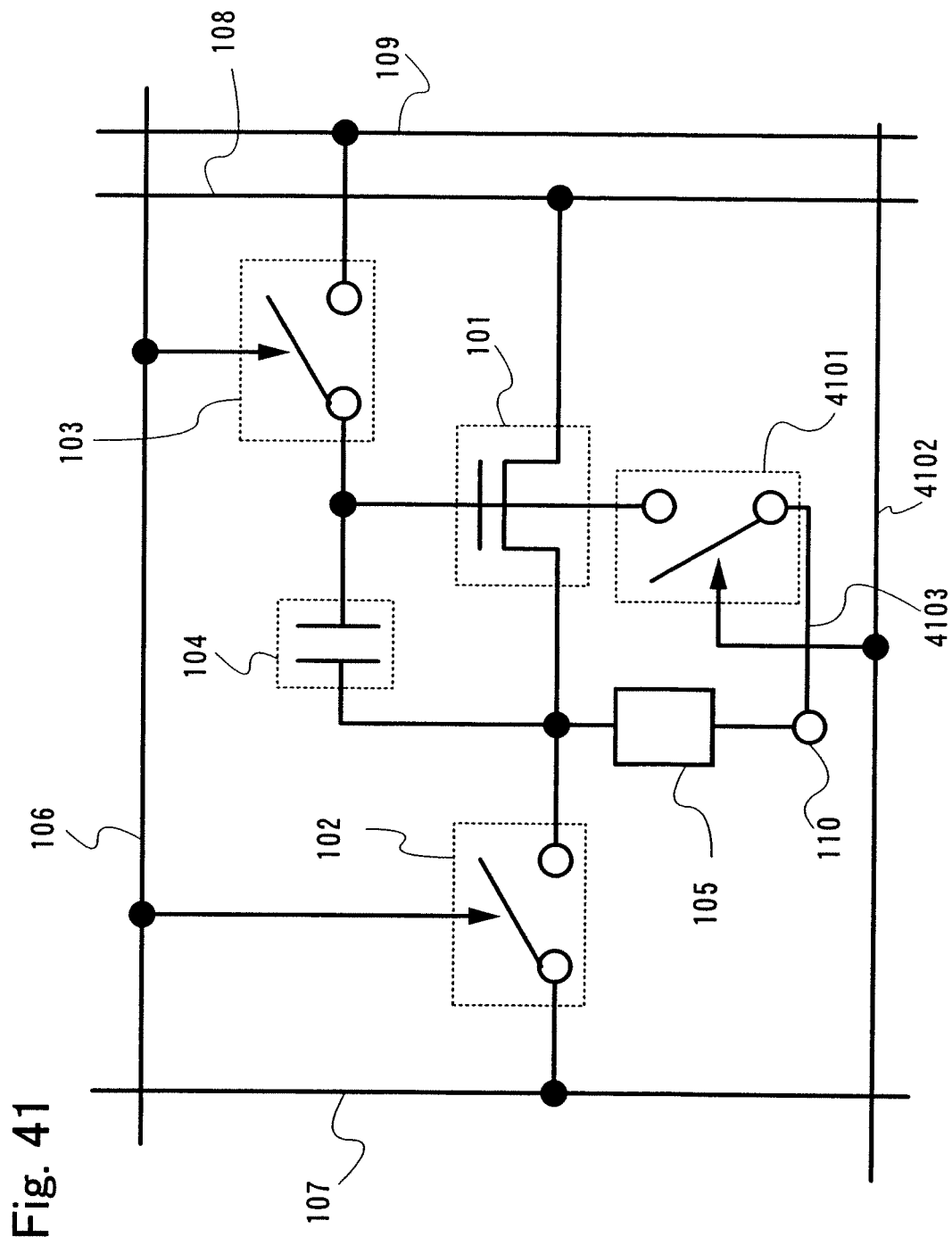
FIG. 41 is a diagram showing a pixel structure of the invention.

Further, FIG. 41 shows another example of a pixel having a means of inputting a potential to the gate terminal of the transistor 101. Note that common portions to those in FIG. 1 are denoted by the same reference numerals and description thereof is omitted. In FIG. 41, a third switch 4101 is connected between the gate terminal of the transistor 101 and the opposed electrode 110 of the display element 105. The third switch 4101 and the opposed electrode 110 of the display element 105 are connected through a wire 4103. Note that the third switch 4101 is controlled to be turned on or off by inputting a signal to a fifth wire 4102. When the third switch 4101 is turned on by inputting a signal to the fifth wire 4102, a charge of the capacitor 104 is discharged through the transistor 101. Accordingly, the transistor 101 is turned off.

Note that a cross sectional structure of a display panel having pixels shown in FIG. 41 is described with reference to FIG. 43.

A base film 4302 is provided over a substrate 4301. The substrate 4301 can be formed of an insulating substrate such as a glass substrate, a quartz substrate, a plastic substrate, or a ceramic substrate, or of a metal substrate, a semiconductor substrate, or the like. The base film 4302 can be formed by CVD or sputtering. For example, a silicon oxide film, a silicon nitride film, a silicon oxynitride film, or the like formed by CVD using $SiH_4$, $N_2O$, and $NH_3$ as a source material. Moreover, a stacked layer of them may be used as well. It is to be noted that the base film 4302 is provided to prevent impurities from dispersing from the substrate 4301 into the semiconductor layer. When the substrate 4301 is formed of a glass substrate or a quartz substrate, the base film 4302 is not required to be provided.

Island-shaped semiconductor layers are formed over the base film 4302. In each of the semiconductor layers, a channel forming region 4303 where an n-channel is formed, an impurity region 4304 which functions as a source region or a drain region, and a low concentration impurity region (LDD region) 4305 are formed. A gate electrode 4307 is formed over the channel forming region 4303 with a gate insulating film 4306 interposed therebetween. As the gate insulating film 4306, a silicon oxide film, a silicon nitride film, a silicon oxynitride film, or the like formed by CVD or sputtering can be used. Further, an aluminum (Al) film, a copper (Cu) film, a thin film containing aluminum or copper as a main component, a chromium (Cr) film, a tantalum (Ta) film, a tantalum nitride (TaN) film, a titanium (Ti) film, a tungsten (W) film, a molybdenum (Mo) film, or the like can be used as the gate electrode 4307.

Sidewalls 4322 are formed on the sides of the gate electrode 4307. After forming a silicon compound, for example, a silicon oxide film, a silicon nitride film, or a silicon oxynitride film is formed so as to cover the gate electrode 4307, etch-back treatment is applied to form the sidewalls 4322.

The LDD regions 4305 are formed under the sidewalls 4322. That is, the LDD regions 4305 are formed in a self-aligned manner. Note that the sidewalls 4322 are not necessarily provided since they are provided to form the LDD regions 4305 in a self-aligned manner.

A first interlayer insulating film is formed over the gate electrode 4307, the sidewalls 4322, and the gate insulating film 4306. The first interlayer insulating film includes an inorganic insulating film 4318 as a lower layer and a resin film 4308 as an upper layer. As the inorganic insulating film 4318, a silicon nitride film, a silicon oxide film, a silicon oxynitride film, or a film formed by stacking these layers can be used. As the resin film 4308, polyimide, polyamide, acrylic, polyimide amide, epoxy, or the like can be used.

A first electrode 4309, a second electrode 4324, a third electrode 4320, and a fourth electrode 4321 are formed over the first interlayer insulating film. The first electrode 4309, the second electrode 4324, and the fourth electrode 4321 are electrically connected to the impurity regions 4304 through contact holes. Further, the third electrode 4320 is electrically connected to the gate electrode 4307 through a contact hole. The third electrode 4320 and the fourth electrode 4321 are electrically connected to each other. A titanium (Ti) film, an aluminum (Al) film, a copper (Cu) film, an aluminum film containing Ti, or the like can be used as the first electrode 4309 and the second electrode 4324. It is to be noted that in the case of providing a wire such as a signal line in the same layer as the first electrode 4309, the second electrode 4324, the third electrode 4320, and the fourth electrode 4321, copper which has low resistance is preferably used.

A second interlayer insulating film 4310 is formed over the first electrode 4309, the second electrode 4324, the third electrode 4320, the fourth electrode 4321, and the first interlayer insulating film. As the second interlayer insulating film 4310, an inorganic insulating film, a resin film, or a film formed by stacking these layers can be used. As an inorganic insulating film, a silicon nitride film, a silicon oxide film, a silicon oxynitride film, or a film formed by stacking these layers can be used. As a resin film, polyimide, polyamide, acrylic, polyimide amide, epoxy, or the like can be used.

A pixel electrode 4311 and a wire 4319 are formed over the second interlayer insulating film 4310. The pixel electrode 4311 and the wire 4319 are formed of the same material. That is, they are formed in the same layer at the same time. As a material used for the pixel electrode 4311 and the wire 4319, a material having a high work function is preferably used. For example, a single layer of a titanium nitride (TiN) film, a chromium (Cr) film, a tungsten (W) film, a zinc (Zn) film, a platinum (Pt) film, or the like, a stacked layer of a titanium nitride film and a film containing aluminum as a main component, a stacked layer of three layers of a titanium nitride film, a film containing aluminum as a main component, and a titanium nitride film can be used. With a stacked layer structure, the resistance as a wire is low, a preferable ohmic contact can be obtained, and further a function as an anode can be obtained. By using a metal film which reflects light, an anode which does not transmit light can be formed.

An insulator 4312 is formed so as to cover end portions of the pixel electrode 4311 and the wire 4319. As the insulator 4312, for example, a positive type photosensitive acrylic resin film can be used.

A layer 4313 containing an organic compound is formed over the pixel electrode 4311, and the layer 4313 containing an organic compound partially overlaps the insulator 4312. Note that the layer 4313 containing an organic compound is not formed over the wire 4319.

An opposed electrode 4314 is provided over the layer 4313 containing an organic compound, the insulator 4312, and the wire 4319. As a material used for the opposed electrode 4314, a material having a low work function is preferably used. For example, a metal thin film of aluminum (Al), silver (Ag), lithium (Li), calcium (Ca), an alloy of these, MgAg, MgIn, AlLi, CaF$_2$, Ca$_3$N$_2$ or the like can be used. By using a metal thin film in this manner, a cathode which can transmit light can be formed.

A region where the layer 4313 containing an organic compound is interposed between the opposed electrode 4314 and the pixel electrode 4311 corresponds to a light emitting element 4316.

In a region where the layer 4313 containing an organic compound is isolated by the insulator 4312, a joint portion 4317 is formed so that the opposed electrode 4314 and the wire 4319 contact each other. Therefore, the wire 4319 functions as an auxiliary electrode of the opposed electrode 4314, thereby the lower resistance of the opposed electrode 4314 can be realized. Accordingly, a film thickness of the opposed electrode 4314 can be reduced, which leads to an increase in the light transmittance. Therefore, higher luminance can be obtained in a top emission structure where the light from the light emitting element 4316 is extracted from a top surface.

A stacked layer of a metal thin film and a light-transmissive conductive film (such as ITO (indium tin oxide) film, indium zinc oxide (IZO) film, or zinc oxide (ZnO) film) may be used in order to realize the lower resistance of the opposed electrode 4314. In this manner, a cathode which can transmit light can be formed by using a metal thin film and a light-transmissive conductive film which transmits light as well.

That is, a transistor 4315 corresponds to the transistor 101 in the pixel of FIG. 41 and a transistor 4323 fulfills the function of the third transistor 4101 in the pixel of FIG. 41. Further, the opposed electrode 4314 corresponds to the opposed electrode 110 of the display element 105 in the pixel of FIG. 41. In addition, the wire 4319 corresponds to the wire 4103 in the pixel of FIG. 41.

Figure 43:
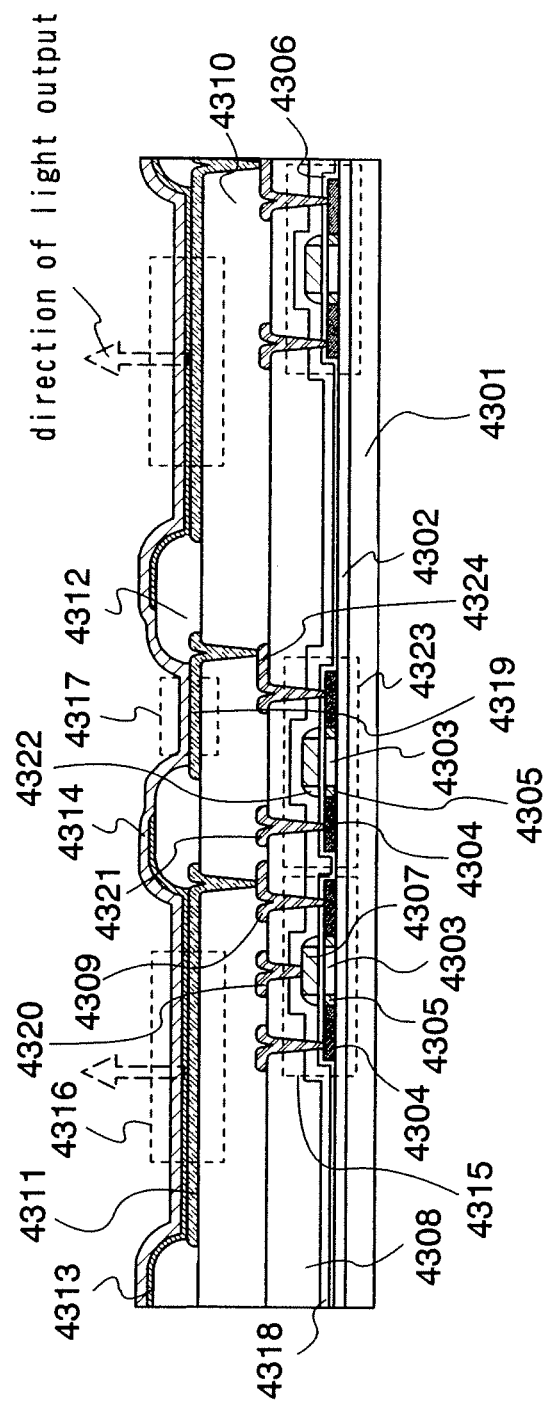
FIG. 43 is a cross sectional view of a part of a pixel.

Further, a display panel having the structure shown in FIG. 43 can also be applied in the case of having another pixel structure. For example, the transistor 4315 corresponds to the transistor 101 of FIG. 48 or 49, and the transistor 4323 fulfills the function of the second switch 103 of FIG. 48 or 49. Note that the electrode 4324 may correspond to the fourth wire 109 of FIG. 48 or 49, and the wire 4319 may correspond to the fifth wire 4801 of FIG. 48 or the sixth wire 4901 of FIG. 49. Alternatively, the wire 4319 may fulfill the function of the fourth wire 109 and the fifth wire 4801 of FIG. 48 or of the fourth wire 109 and the sixth wire 4901 of FIG. 49.

In the display panel having the structure shown in FIG. 43, the film of the opposed electrode 4314 can be formed thin, thereby the light can be emitted from a top surface with favorable transmittance. Therefore, the luminance from the top surface can be enhanced. Further, by connecting the opposed electrode 4314 and the wire 4319, the lower resistance of the opposed electrode 4314 and the wire 4319 can be realized. Therefore, power consumption can be reduced.

Further, the transistor 101 can be forcibly turned off by in a display device having the pixel structure of FIG. 2. A driving method in this case is described below.

Figure 44:
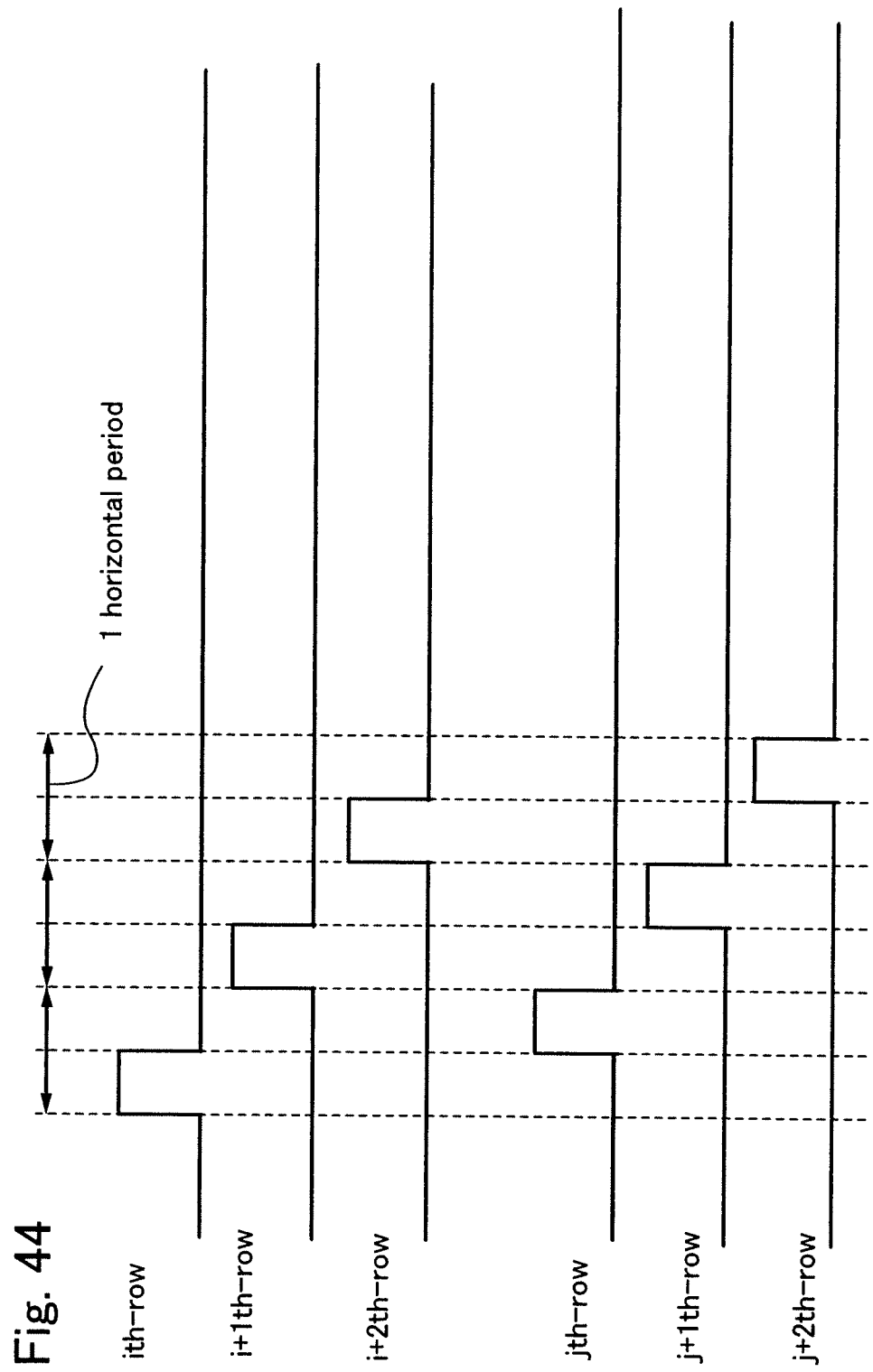
FIG. 44 is a diagram showing a driving method of the invention.

One horizontal period is divided into two periods as shown in FIG. 44. Here, description is made assuming that the former half is writing time and the latter half is erasing time. In the divided horizontal period, each scan line is selected, and at that time, a corresponding signal is inputted to a signal line. For example, an i-th row is selected in the former half of a certain horizontal period and a j-th row is selected in the latter half. Then, operation can be performed as if two rows are selected at the same time in one horizontal period. In other words, the video signals are written to pixels from the signal line in the writing time Tb1 to Tb4 using writing time that is the former half of each horizontal period. Then, a pixel is not selected in erasing time that is the latter half of the one horizontal period at this time. In addition, an erasing signal is inputted to a pixel from the signal line in erasing time Te using erasing time that is the latter half of another horizontal period. In writing time that is the former half of one horizontal period at this time, a pixel is not selected. Thus, a display device having a high aperture ratio can be provided and the yield can be improved.

Figure 45:
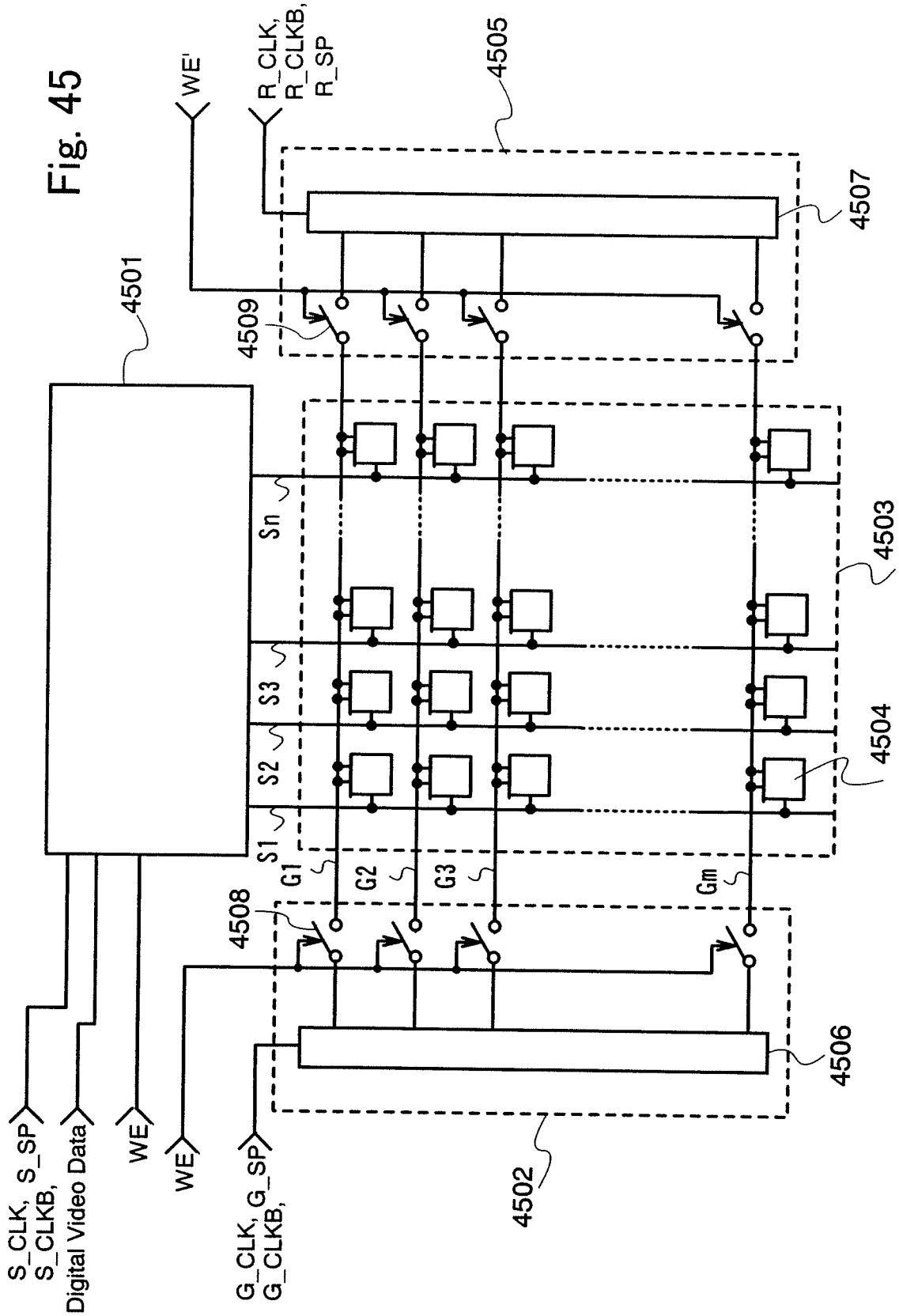
FIG. 45 is a diagram showing a display device of the invention.

FIG. 45 shows an example of a display device including such a pixel. The display device has a signal line driver circuit 4501, a first scan line driver circuit 4502, a second scan line driver circuit 4505, and a pixel portion 4503 in which pixels 4504 are arranged in matrix corresponding to scan lines Gi to Gm and signal lines S1 to Sn. The first scan line driver circuit 4502 includes a pulse output circuit 4506 and switches 4508 which are connected between each of the scan lines Gi to Gm and the pulse output circuit 4506. The second scan line driver circuit 4505 includes a pulse output circuit 4507 and switches 4509 which are connected between each of the scan lines Gi to Gm and the pulse output circuit 4507.

It is to be noted that a scan line Gi (one of the scan lines Gi to Gm) corresponds to the first wire 106 of FIG. 2, and a signal line Sj (one of the signal lines S1 to Sn) corresponds to the second wire 107 of FIG. 2

A clock signal (G_CLK), an inverted clock signal (G_CLKB), a start pulse signal (G_SP), a control signal (WE), and the like are inputted to the first scan line driver circuit 4502. In accordance with these signals, signals selecting pixels are outputted to a first scan line Gi (one of the first scan lines G1 to Gm) of a pixel row to be selected. Note that the signals at this time are pulses outputted in the former half of one horizontal period as shown in a timing chart of FIG. 37. The switches 4508 are controlled to be turned on or off by the control signal (WE), thereby the pulse output circuit 4506 and the scan lines G1 to Gm can be electrically connected or disconnected.

A clock signal (R_CLK), an inverted clock signal (R_CLKB), a start pulse signal (R_SP), a control signal (WE'), and the like are inputted to the second scan line driver circuit 4505. In accordance with these signals, signals are outputted to a second scan line Ri (one of the second scan lines R1 to Rm) of a pixel row to be selected. Note that the signals at this time are pulses outputted in the latter half of one horizontal period as shown in the timing chart of FIG. 37. The switches 4509 are controlled to be turned on or off by the control signal (WE'), thereby the pulse output circuit 4507 and the scan lines Gi to Gm can be electrically connected or disconnected. Note that when one of the switches 4508 and the switches 4509 are electrically connected, the other is electrically disconnected.

A clock signal (S_CLK), an inverted clock signal (S_CLKB), a start pulse signal (S_SP), a video signal (Digital Video Data), a control signal (WE), and the like are inputted to the signal line driver circuit 4501. In accordance with these signals, a video signal corresponding to pixels of each row is outputted to each of the signal lines S1 to Sn.

Therefore, the video signal inputted to the signal lines Si to Sn is written to the pixel 4504 of each column in the row selected by a signal inputted to the scan line Gi (one of the scan lines G1 to Gm) from the first scan line driver circuit 4502. Then, each pixel row is selected through each of the scan lines G1 to Gm, thereby video signals corresponding to each of the pixels 4504 are inputted to all the pixels 4504. Each of the pixels 4504 holds the data of the written video signal for a certain period. Then, each of the pixels 4504 can keep a light emitting state or a non-light emitting state by holding the data of the video signal for a certain period.

Further, a signal (also referred to as erasing signal) for making a pixel emit no light is written from the signal lines S1 to Sn to the pixel 4504 of each column in the row selected by a signal inputted to the scan line Gi (one of the scan lines G1 to Gm) from the second scan line driver circuit 4505. Then, each pixel row is selected by each of the scan lines G1 to Gm, thereby setting a non-light emitting period. For example, when the pixel in an i-th row is selected by the signal inputted from the second scan line driver circuit 4505 to the scan line Gi, the potentials of the signal lines S1 to Sn are the same as that of the fourth wire 109 in the pixel of FIG. 2. Note that the signal lines Si to Sn may be in a floating state at this time.

Therefore, by using a display device of the invention, in the case of focusing on a certain pixel row, when a signal inputted to the certain pixel row is the same as that to be inputted, the signal can be prevented from being inputted to the pixel row, which leads to reduction in the number of times charging and discharging the scan line or the signal line are performed. As a result, power consumption can be lowered.

Embodiment Mode 6

In this embodiment mode, description is made with reference to FIGS. 22A and 22B of the structures of a display panel having the pixel structure described in Embodiment Modes 1 to 3.

It is to be noted that FIG. 22A is a top plan view of the display panel and FIG. 22B is a cross sectional diagram along a line A-A' of FIG. 22A. The display panel includes a signal line driver circuit 2201, a pixel portion 2202, a first scan line driver circuit 2203, and a second scan line driver circuit 2206, which are shown by dotted lines. Further, a sealing substrate 2204 and a sealing material 2205 are provided. A portion surrounded by the sealing material 2205 is a space 2207.

It is to be noted that a wire 2208 is a wire for transmitting a signal inputted to the first scan line driver circuit 2203, the second scan line driver circuit 2206, and the signal line driver circuit 2201 and receives a video signal, a clock signal, a start signal, and the like from an FPC (Flexible Printed Circuit) 2209 functioning as an external input terminal. An IC chip (semiconductor chip including memory circuit, buffer circuit, and the like) 2219 is mounted over a connecting portion of the FPC 2209 and the display panel by COG (Chip On Glass) or the like. It is to be noted that only the FPC 2209 is shown here; however, a printed wiring board (PWB) may be attached to the FPC 2209. The display device in this specification includes not only a main body of the display panel but one with an FPC or a PWB attached thereto and one on which an IC chip or the like is mounted.

Next, description is made with reference to FIG. 22B of a cross-sectional structure. The pixel portion 2202 and peripheral driver circuits (the first scan line driver circuit 2203, the second scan line driver circuit 2206, and the signal line driver circuit 2201) are formed over a substrate 2210. Here, the signal line driver circuit 2201 and the pixel portion 2202 are shown.

It is to be noted that the signal line driver circuit 2201 is formed of unipolar transistors such as n-channel TFTs 2220 and 2221. As for a pixel structure, a pixel can be formed of a unipolar transistor by applying the pixel structure of FIG. 2, 13, 14, or 15. Accordingly, the peripheral driver circuits are formed of n-channel transistors, thereby a unipolar display panel can be manufactured. Needless to say, a CMOS circuit may be formed of a p-channel transistor as well as a unipolar transistor. Further, in this embodiment mode, a display panel in which the peripheral driver circuits are formed over the same substrate is shown; however, the invention is not limited to this. All or some of the peripheral driver circuits may be formed into an IC chip or the like and mounted by COG or the like. In this case, the driver circuit is not required to be unipolar and can be formed in combination with a p-channel transistor.

Further, the pixel portion 2202 includes TFTs 2211 and 2212. It is to be noted that a source electrode of the TFT 2212 is connected to a first electrode (pixel electrode) 2213. An insulator 2214 is formed so as to cover end portions of the first electrode 2213. Here, a positive photosensitive acrylic resin film is used for the insulator 2214.

In order to obtain favorable coverage, the insulator 2214 is formed so that a curved surface having a curvature is formed at a top end portion or a bottom end portion of the insulator 2214. For example, in the case of using a positive photosensitive acrylic as a material for the insulator 2214, it is preferable that only the top end portion of the insulator 2214 have a curved surface having a curvature radius (0.2 to 3 μm). Moreover, either a negative photosensitive acrylic which becomes insoluble in etchant by light or a positive photosensitive acrylic which becomes soluble in etchant by light can be used as the insulator 2214.

A layer 2216 containing an organic compound and a second electrode (opposed electrode) 2217 are formed over the first electrode 2213. Here, it is preferable to use a material having a high work function as a material used for the first electrode 2213 which functions as an anode. For example, a single layer of an ITO (indium tin oxide) film, an indium zinc oxide (IZO) film, a titanium nitride film, a chromium film, a tungsten film, a Zn film, a Pt film, or the like, a stacked layer of a titanium nitride film and a film containing aluminum as a main component, a three-layer structure of a titanium nitride film, a film containing aluminum as a main component, and a titanium nitride film, or the like can be used. It is to be noted that with a stacked layer structure, resistance as a wire is low, favorable ohmic contact can be obtained, and a function as an anode can be obtained.

The layer 2216 containing an organic compound is formed by vapor deposition using a deposition mask, or ink-jet. A metal complex belonging to group 4 of the periodic table of elements is used for a part of the layer 2216 containing an organic compound. Besides, a low molecular material or a high molecular material may be used in combination as well. Further, as a material used for the layer 2216 containing an organic compound, a single layer or a stacked layer of an organic compound is often used; however, in this embodiment mode, an inorganic compound may be used in a part of a film formed of an organic compound. Moreover, a known triplet material can also be used.

Further, as a material used for the second electrode 2217 which functions as a cathode and is formed over the layer 2216 containing an organic compound, a material having a low work function (Al, Ag, Li, Ca, or an alloy thereof such as MgAg, MgIn, AlLi, $CaF_2$, or $Ca_3N_2$) may be used. In the case where light generated from the layer 2216 containing an organic compound is transmitted through the second electrode 2217, a stacked layer of a metal thin film with a thinner thickness and a light-transmissive conductive film (ITO (indium tin oxide) film), indium oxide zinc oxide alloy ($In_2O_3$—ZnO), zinc oxide (ZnO), or the like) is preferably used.

Further, by attaching the sealing substrate 2204 to the substrate 2210 with the sealing material 2205, a light emitting element 2218 is provided in the space 2207 surrounded by the substrate 2210, the sealing substrate 2204, and the sealing material 2205. It is to be noted that the space 2207 may be filled with the sealing material 2205 as well as an inert gas (nitrogen, argon, or the like).

It is to be noted that an epoxy-based resin is preferably used for the sealing material 2205. Further, it is preferable that these materials should not transmit moisture or oxygen as much as possible. As a material for the sealing substrate 2204, a glass substrate, a quartz substrate, a plastic substrate formed of FRP (Fiberglass-Reinforced Plastics), PVF (polyvinylfluoride), myler, polyester, acrylic, or the like can be used.

As described above, a display panel having a pixel structure of the invention can be obtained. Note that the structure described above is one example, and a structure of a display panel is not limited to this.

As shown in FIGS. 22A and 22B, the cost of the display device can be reduced by forming the signal line driver circuit 2201, the pixel portion 2202, the first scan line driver circuit 2203, and the second scan line driver circuit 2206 over the same substrate. Further, in this case, unipolar transistors are used for the signal line driver circuit 2201, the pixel portion 2202, the first scan line driver circuit 2203, and the second scan line driver circuit 2206, thereby manufacturing steps can be simplified. As a result, further cost reduction can be achieved.

Figure 28A:
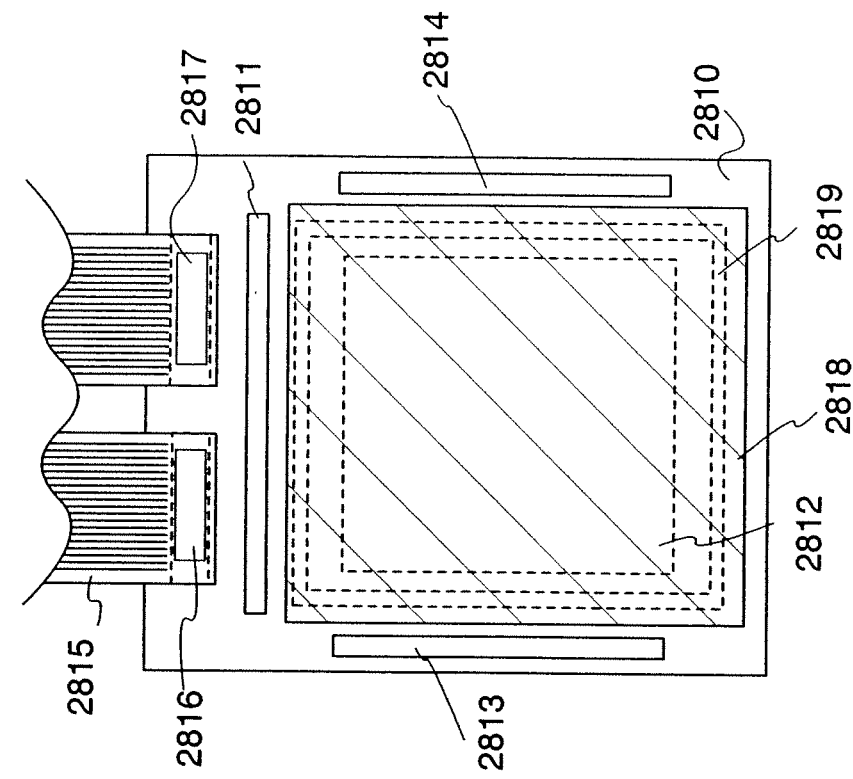
FIGS. 28A and 28B are diagrams showing display panels of the invention.

It is to be noted that the structure of the display panel is not limited to the structure shown in FIG. 22A where the signal line driver circuit 2201, the pixel portion 2202, the first scan line driver circuit 2203, and the second scan line driver circuit 2206 are formed over the same substrate, and a signal line driver circuit 2801 shown in FIG. 28A corresponding to the signal line driver circuit 2201 may be formed into an IC chip and mounted on the display panel by COG, or the like. It is to be noted that a substrate 2800, a pixel portion 2802, a first scan line driver circuit 2803, a second scan line driver circuit 2804, an FPC 2805, IC chips 2806 and 2807, a sealing substrate 2808, and a sealing material 2809 in FIG. 28A correspond to the substrate 2210, the pixel portion 2202, the first scan line driver circuit 2203, the second scan line driver circuit 2206, the FPC 2209, the IC chips 2219 and 2222, the sealing substrate 2204, and the sealing material 2205 in FIG. 22A, respectively.

That is, only the signal line driver circuit which is required to operate at high speed is formed into an IC chip using a CMOS or the like, thereby lower power consumption is achieved. Further, by forming the IC chip into a semiconductor chip formed of a silicon wafer or the like, higher-speed operation and lower power consumption can be realized.

By forming the second scan line driver circuit 2803 and the first scan line driver circuit 2804 over the same substrate as the pixel portion 2802, cost reduction can be achieved. Further, unipolar transistors are used for the second scan line driver circuit 2803, the first scan line driver circuit 2804, and the pixel portion 2802, thereby further cost reduction can be achieved. As for a pixel structure of the pixel portion 2802, the structures described in Embodiment Modes 1 to 4 can be applied.

In this manner, cost reduction of a high definition display device can be realized. Further, by mounting an IC chip including a functional circuit (memory or buffer) at a connecting portion of the FPC 2805 and the substrate 2800, a substrate area can be efficiently utilized.

Figure 28B:
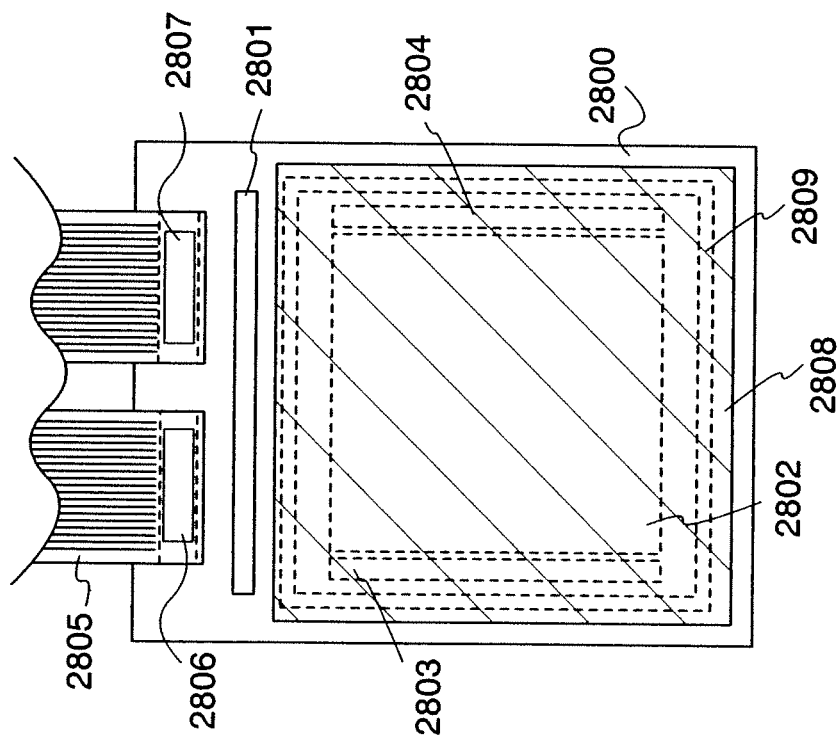

Moreover, a signal line driver circuit 2811, a first scan line driver circuit 2814, and a second scan line driver circuit 2813 shown in FIG. 28B corresponding to the signal line driver circuit 2201, the first scan line driver circuit 2203, and the second scan line driver circuit 2206 shown in FIG. 22A may be formed into an IC chip and mounted on a display panel by COG or the like. In this case, lower power consumption of a high definition display device can be realized. Therefore, in order to obtain a display device with less power consumption, it is preferable to use polysilicon for a semiconductor layer of a transistor used in the pixel portion. It is to be noted that a substrate 2810, a pixel portion 2812, an FPC 2815, IC chips 2816 and 2817, a sealing substrate 2818, and a sealing material 2822 in FIG. 28B correspond to the substrate 2210, the pixel portion 2202, the FPC 2209, the IC chips 2219 and 2222, the sealing substrate 2204, and the sealing material 2205 in FIG. 22A, respectively.

Further, by using amorphous silicon for a semiconductor layer of a transistor of the pixel portion 2812, further cost reduction can be achieved. Moreover, a large display panel can be manufactured.

Further, the second scan line driver circuit, the first scan line driver circuit, and the signal line driver circuit are not necessarily provided in a row direction and a column direction of the pixels. For example, as shown in FIG. 29A, a peripheral driver circuit 2901 formed in an IC chip may have functions of the first scan line driver circuit 2814, the second scan line driver circuit 2813, and the signal line driver circuit 2811 shown in FIG. 28B. It is to be noted that a substrate 2900, a pixel portion 2902, an FPC 2904, IC chips 2905 and 2906, a sealing substrate 2907, and a sealing material 2908 in FIG. 29A correspond to the substrate 2210, the pixel portion 2202, the FPC 2209, the IC chips 2219 and 2222, the sealing substrate 2204, and the sealing material 2205 in FIG. 22A, respectively.

Figure 29B:
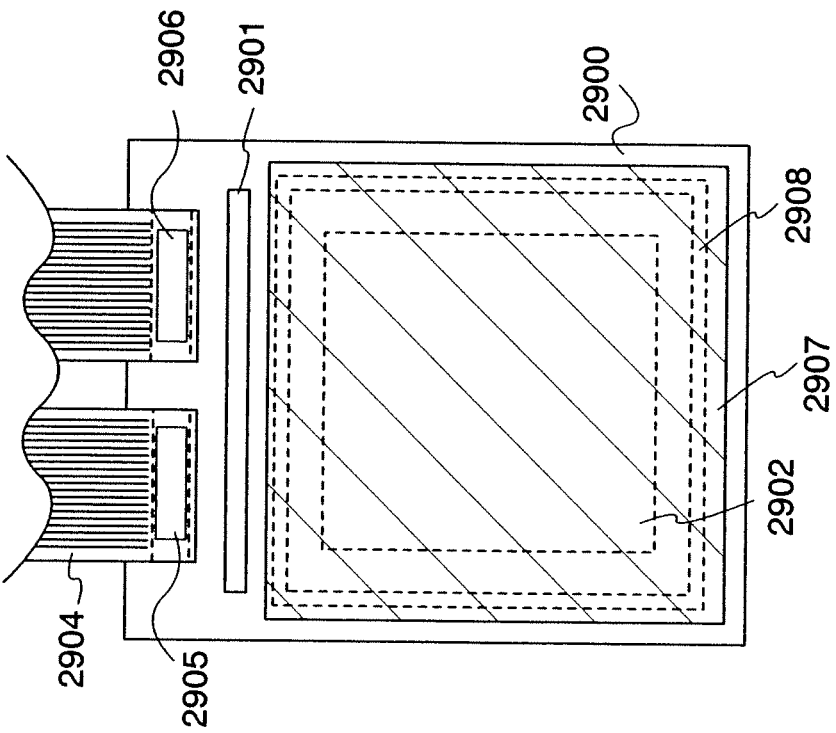
FIGS. 29A and 29B are diagrams showing a display panel of the invention.
Figure 29A:
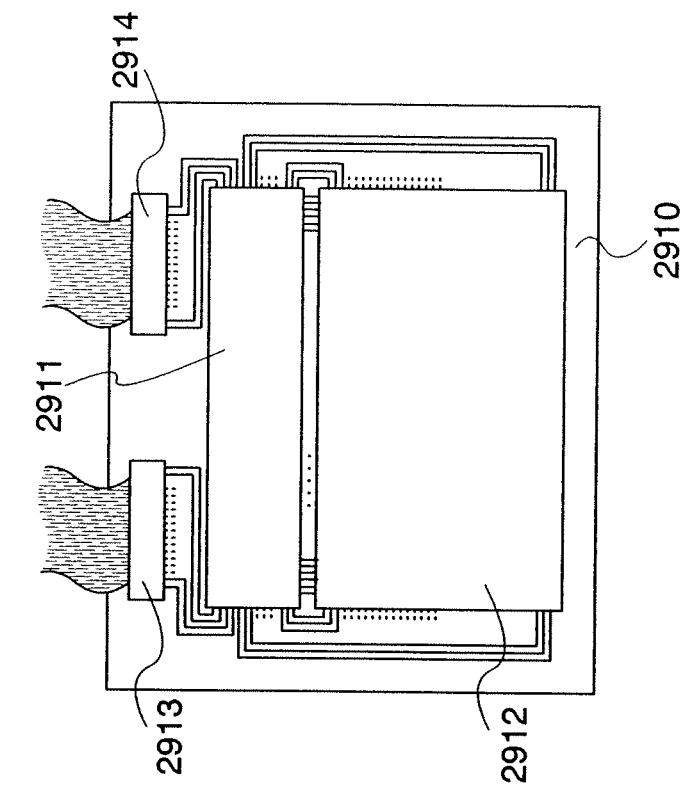

FIG. 29B shows a schematic diagram showing connections of wires of the display device shown in FIG. 29A. A substrate 2910, a peripheral driver circuit 2911, a pixel portion 2912, and FPCs 2913 and 2914 are provided. Signals and a power source potential are externally inputted from the FPC 2913 to the peripheral driver circuit 2911. An output from the peripheral driver circuit 2911 is inputted to wires in the row direction and wires in the column direction, which are connected to the pixels in the pixel portion 2912.

Further, FIGS. 23A and 23B show examples of a light emitting element which can be applied to the light emitting element 2218. That is, description is made with reference to FIGS. 23A and 23B of structures of a light emitting element which can be applied to the pixels described in Embodiment Modes 1 to 4.

In a light emitting element shown in FIG. 23A, an anode 2302, a hole injecting layer 2303 formed of a hole injecting material, a hole transporting layer 2304 formed of a hole transporting material, a light emitting layer 2305, an electron transporting layer 2306 formed of an electron transporting material, an electron injecting layer 2307 formed of an electron injecting material, and a cathode 2308 are stacked over a substrate 2301 in this order. Here, the light emitting layer 2305 may be formed of only one kind of light emitting material; however, it may also be formed of two or more kinds of materials. The structure of the element of the invention is not limited to this.

In addition to the stacked layer structure shown in FIG. 23A where each functional layer is stacked, there are wide variations such as an element formed of a high molecular compound, a high efficiency element which utilizes a triplet light emitting material which emits light from a triplet excitation state in a light emitting layer. It is also possible to apply to a white light emitting element which can be obtained by dividing a light emitting region into two regions by controlling a recombination region of carriers using a hole blocking layer, and the like.

The element of the invention shown in FIG. 23A can be formed by sequentially depositing a hole injecting material, a hole transporting material, and a light emitting material over the substrate 2301 having the anode 2302 (ITO). Next, an electron transporting material and an electron injecting material are deposited, and finally the cathode 2808 is deposited.

Materials suitable for the hole injecting material, the hole transporting material, the electron transporting material, the electron injecting material, and the light emitting material are as follows.

As the hole injecting material, an organic compound such as a porphyrin-based compound, a phthalocyanine (hereinafter referred to as "$H_2Pc$"), copper phthalocyanine (hereinafter referred to as "CuPc"), or the like is effective. Further, a material that has a smaller value of an ionization potential than that of the hole transporting material to be used and has a hole transporting function can also be used as the hole injecting material. There is also a material obtained by chemically doping a conductive high molecular compound, which includes polyaniline and polyethylene dioxythiophene (hereinafter referred to as "PEDOT") doped with polystyrene sulfonate (hereinafter referred to as "PSS"). Also, a high molecular compound of an insulator is effective in terms of planarization of an anode, and polyimide (hereinafter referred to as "PI") is often used. Further, an inorganic compound is also used, which includes an extra-thin film of aluminum oxide (hereinafter referred to as "alumina") in addition to a thin film of a metal such as gold or platinum.

It is an aromatic amine-based (that is, one having a bond of benzene ring-nitrogen) compound that is most widely used as the hole transporting material. A material that is widely used includes 4,4'-bis(diphenylamino)-biphenyl (hereinafter referred to as "TAD"), derivatives thereof such as 4,4'-bis[N-(3-methylphenyl)-N-phenyl-amino]-biphenyl (hereinafter referred to as "TPD"), 4,4'-bis[N-(1-naphthyl)-N-phenyl-amino]-biphenyl (hereinafter referred to as "α-NPD"), and star burst aromatic amine compounds such as 4,4',4"-tris(N, N-diphenyl-amino)-triphenylamine (hereinafter referred to as "TDATA") and 4,4',4"-tris[N-(3-methylphenyl)-N-phenyl-amino]-triphenylamine (hereinafter referred to as "MTDATA").

As the electron transporting material, a metal complex is often used, which includes a metal complex having a quinoline skeleton or a benzoquinoline skeleton such as Alq, BAlq, tris(4-methyl-8-quinolinolato)aluminum (hereinafter referred to as "Almq"), or bis(10-hydroxybenzo[h]-quinolinato)beryllium (hereinafter referred to as "BeBq"), and in addition, a metal complex having an oxazole-based or a thiazole-based ligand such as bis[2-(2-hydroxyphenyl)-benzoxazolato]zinc (hereinafter referred to as "$Zn(BOX)_2$") or bis[2-(2-hydroxyphenyl)-benzothiazolato]zinc (hereinafter referred to as "$Zn(BTZ)_2$"). Further, in addition to the metal complexes, oxadiazole derivatives such as 2-(4-biphenylyl)-5-(4-tert-butylphenyl)-1,3,4-oxadiazole (hereinafter referred to as "PBD") and OXD-7, triazole derivatives such as TAZ and 3-(4-tert-butylphenyl)-4-(4-ethylphenyl)-5-(4-biphenylyl)-2,3,4-triazole (hereinafter referred to as "p-EtTAZ"), and phenanthroline derivatives such as bathophenanthroline (hereinafter referred to as "BPhen") and BCP have an electron transporting property.

As the electron injecting material, the above-mentioned electron transporting materials can be used. In addition, an extra-thin film of an insulator, for example, metal halide such as calcium fluoride, lithium fluoride, or cesium fluoride, alkali metal oxide such as lithium oxide, or the like is often used. Further, an alkali metal complex such as lithium acetyl acetonate (hereinafter referred to as "Li(acac)") or 8-quinolinolato-lithium (hereinafter referred to as "Liq") is also effective.

As the light emitting material, in addition to the above-mentioned metal complexes such as Alq, Almq, BeBq, BAlq, Zn(BOX)$_2$, and Zn(BTZ)$_2$, various fluorescent pigments are effective. The fluorescent pigments include 4,4'-bis(2,2-diphenyl-vinyl)-biphenyl, which is blue, and 4-(dicyanomethylene)-2-methyl-6-(p-dimethylaminostyryl)-4H-pyran, which is red-orange, and the like. Also, a triplet light emitting material is available, which mainly includes a complex with platinum or iridium as a central metal. As the triplet light emitting material, tris(2-phenylpyridine)iridium, bis(2-(4'-tryl)pyridinato-N,C$^{2'}$)acetylacetonato iridium (hereinafter referred to as "acacIr(tpy)$_2$"), 2,3,7,8,12,13,17,18-octaethyl-21H,23Hporphyrin-platinum, and the like are known.

By using the materials each having a function as described above in combination, a highly reliable light emitting element can be formed.

In the case of the pixel of FIG. 11, which is described in Embodiment Mode 3, a light emitting element in which layers are formed in a reverse order to that of FIG. 23A can be used as shown in FIG. 23B. That is, a cathode 2318, an electron injecting layer 2317 formed of an electron injecting material, an electron transporting layer 2316 formed of an electron transporting material, a light emitting layer 2315, a hole transporting layer 2314 formed of a hole transporting material, a hole injecting layer 2313 formed of a hole injecting material, and an anode 2312 are stacked in this order over a substrate 2311.

In addition, in order to extract light emission of a light emitting element, at least one of an anode and a cathode is required to transmit light. A TFT and a light emitting element are formed over a substrate; and there are light emitting elements having a top emission structure where light emission is taken out through a surface opposite to the substrate, having a bottom emission structure where light emission is taken out through a surface on the substrate side, and having a dual emission structure where light emission is taken out through a surface opposite to the substrate and a surface on the substrate side respectively. The pixel structure of the invention can be applied to the light emitting element having any emission structure.

Description is made with reference to FIG. 24A of a light emitting element with a top emission structure.

A driving TFT 2401 is formed over a substrate 2400 and a first electrode 2402 is formed in contact with a source electrode of the driving TFT 2401, over which a layer 2403 containing an organic compound and a second electrode 2404 are formed.

Further, the first electrode 2402 is an anode of a light emitting element. The second electrode 2404 is a cathode of the light emitting element. That is, a region where the layer 2403 containing an organic compound is interposed between the first electrode 2402 and the second electrode 2404 corresponds to the light emitting element.

Further, as a material used for the first electrode 2402 which functions as an anode, a material having a high work function is preferably used. For example, a single layer of a titanium nitride film, a chromium film, a tungsten film, a Zn film, a Pt film, or the like, a stacked layer of a titanium nitride film and a film containing aluminum as a main component, a stacked layer of three layers of a titanium nitride film, a film containing aluminum as a main component, and a titanium nitride film, or the like can be used. With a stacked layer structure, the resistance as a wire is low, a preferable ohmic contact can be obtained, and further a function as an anode can be obtained. By using a metal film which reflects light, an anode which does not transmit light can be formed.

As a material used for the second electrode 2404 which functions as a cathode, a stacked layer of a metal thin film formed of a material having a low work function (Al, Ag, Li, Ca, or an alloy thereof such as MgAg, MgIn, AlLi, CaF$_2$, or Ca$_3$N$_2$) and a light-transmissive conductive film (of ITO (indium tin oxide), indium zinc oxide (IZO), zinc oxide (ZnO), or the like) is preferably used. By using a metal thin film and a light-transmissive conductive film in this manner, a cathode which can transmit light can be formed.

In this manner, light from the light emitting element can be extracted to the top surface as shown by an arrow in FIG. 24A. That is, in the case of applying to the display panel shown in FIG. 22A, light is emitted to the sealing substrate 2204 side. Therefore, in the case of using a light emitting element with a top emission structure to a display device, a substrate which transmits light is used as the sealing substrate 2204.

In the case of providing an optical film, an optical film may be provided over the sealing substrate 2204.

In the case of the pixel structure shown in FIG. 11 of Embodiment Mode 3, a metal film formed of a material which functions as a cathode and has a low work function, such as MgAg, MgIn, or AlLi can be used for the first electrode 2402. For the second electrode 2404, a light-transmissive film such as an ITO (indium tin oxide) film or an indium zinc oxide (IZO) film can be used. Accordingly, with this structure, the transmittance of the top light emission can be improved.

Further, description is made with reference to FIG. 24B of a light emitting element with a bottom emission structure. The same reference numerals as those in FIG. 24A are used since the structures are the same except for the light emission structure.

Here, as a material used for the first electrode 2402 which functions as an anode, a material having a high work function is preferably used. For example, a light-transmissive film such as an ITO (indium tin oxide) film or an indium zinc oxide (IZO) film can be used. By using a light-transmissive conductive film, an anode which can transmit light can be formed.

As a material used for the second electrode 2404 which functions as a cathode, a metal film formed of a material having a low work function (Al, Ag, Li, Ca, or an alloy thereof such as MgAg, MgIn, AlLi, CaF$_2$, or Ca$_3$N$_2$) can be used. By using a metal film which reflects light, a cathode which does not transmit light can be formed.

In this manner, light from the light emitting element can be extracted to a bottom surface as shown by an arrow in FIG. 24B. That is, in the case of applying to the display panel shown in FIGS. 22A and 22B, light is emitted to the substrate 2210 side. Therefore, in the case of using a light emitting element with a bottom emission structure to a display device, a substrate which transmits light is used as the substrate 2210.

In the case of providing an optical film, an optical film may be provided over the substrate 2210.

Description is made with reference to FIG. 24C of a light emitting element with a dual emission structure. The same reference numerals as those in FIG. 24A are used since the structures are the same except for the light emission structure.

Here, as a material used for the first electrode 2402 which functions as an anode, a material having a high work function is preferably used. For example, a light-transmissive film such as an ITO (indium tin oxide) film or an indium zinc oxide (IZO) film can be used. By using a light-transmissive conductive film, an anode which can transmit light can be formed.

As a material used for the second electrode 2404 which functions as a cathode, a stacked layer of a metal thin film formed of a material having a low work function (Al, Ag, Li, Ca, or an alloy thereof such as MgAg, MgIn, AlLi, $CaF_2$, or $Ca_3N_2$), and a light-transmissive conductive film (ITO (indium tin oxide), indium oxide zinc oxide ($In_2O_3$—ZnO) alloy, zinc oxide (ZnO), or the like) is preferably used. By using a metal thin film and a light-transmissive conductive film in this manner, a cathode which can transmit light can be formed.

In this manner, light from the light emitting element can be extracted to the both surfaces as shown by arrows of FIG. 24C. That is, in the case of applying to the display panel shown in FIGS. 22A and 22B, light is emitted to the substrate 2210 side and the sealing substrate 2204 side. Therefore, in the case of applying a light emitting element with a dual emission structure to a display device, a substrate which transmits light is used as the substrate 2210 and the sealing substrate 2204.

In the case of providing an optical film, optical films may be provided over both the substrate 2210 and the sealing substrate 2204.

The invention can also be applied to a display device which realizes full color display by using a white light emitting element and a color filter.

Figure 25:
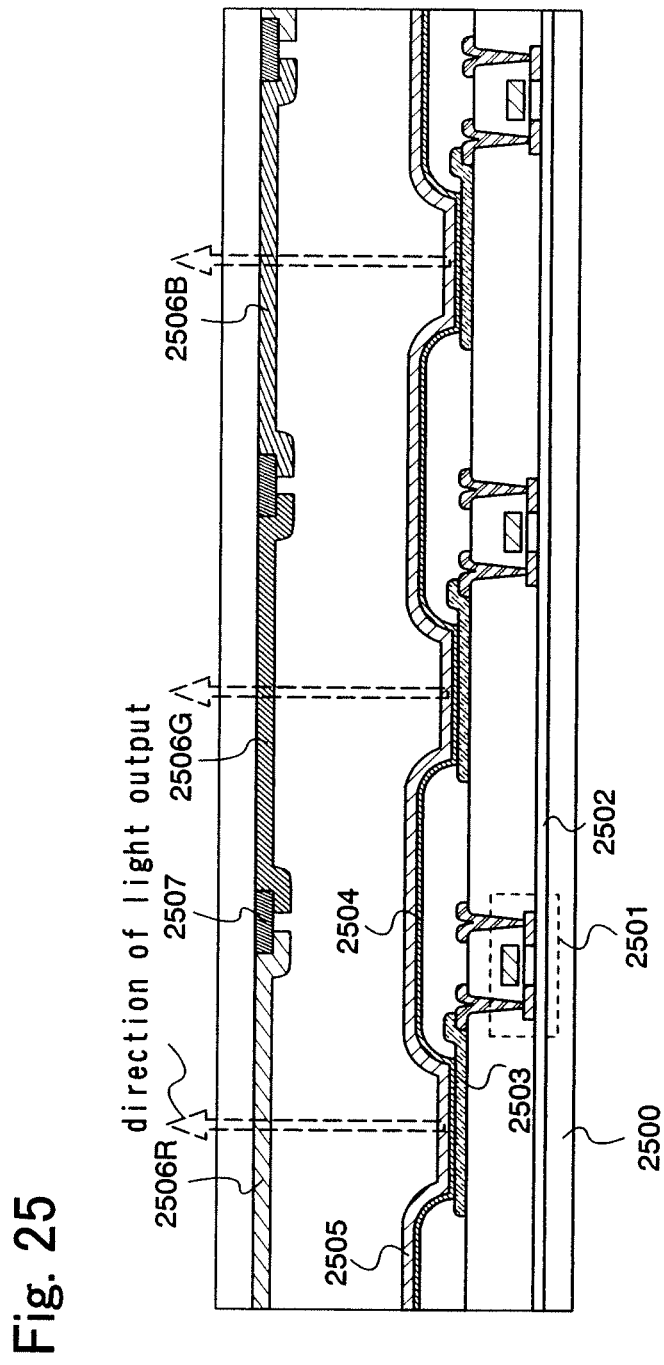
FIG. 25 is a diagram showing a display panel of the invention.

As shown in FIG. 25, a base film 2502 is formed over a substrate 2500 and a driving TFT 2501 is formed thereover. A first electrode 2503 is formed in contact with a source electrode of the driving TFT 2501 and a layer 2504 containing an organic compound and a second electrode 2505 are formed thereover.

The first electrode 2503 is an anode of a light emitting element. The second electrode 2505 is a cathode of the light emitting element. That is, a region where the layer 2504 containing an organic compound is interposed between the first electrode 2503 and the second electrode 2505 corresponds to the light emitting element. In the structure shown in FIG. 25, white light is emitted. A red color filter 2506R, a green color filter 2506G and a blue color filter 2506B are provided over the light emitting element, thereby full color display can be performed. Further, a black matrix (also referred to as BM) 2507 for separating these color filters is provided.

The aforementioned structures of the light emitting element can be used in combination and can be appropriately used for the display device having the pixel structure of the invention. The structures of the display panel and the light emitting elements which are described above are examples and it is needless to say that the pixel structure of the invention can be applied to display devices having other structures.

Next, a partial cross-sectional view of a pixel portion of a display panel is described.

First, description is made with reference to FIGS. 26A and 26B and FIGS. 27A and 27B of the case of using a crystalline semiconductor film (polysilicon (p-Si:H) film) as a semiconductor layer of a transistor.

Here, the semiconductor layer is obtained by, for example, forming an amorphous silicon (a-Si) film over a substrate by a known film deposition method. Note that the semiconductor film is not limited to the amorphous silicon film, and any semiconductor film having an amorphous structure (including a microcrystalline semiconductor film) may be used.

Further, a compound semiconductor film having an amorphous structure, such as an amorphous silicon germanium film may be used.

Then, the amorphous silicon film is crystallized by laser crystallization, thermal crystallization using RTA or an annealing furnace, thermal crystallization using a metal element which promotes crystallization, or the like. Needless to say, such crystallization may be performed in combination.

As a result of the aforementioned crystallization, a crystallized region is formed in a part of the amorphous semiconductor film.

In addition, the crystalline semiconductor film having a partially increased crystallinity is patterned into a desired shape, and an island-shaped semiconductor film (each of the films that are formed by separating one semiconductor film) is formed with the crystallized region. This semiconductor film is used as the semiconductor layer of the transistor. Note that patterning is to process a film shape, which means forming a film pattern by a photolithography technique (including forming contact hole in photosensitive acrylic and processing photosensitive acrylic so as to be a spacer), forming a mask pattern by a photolithography technique and etching with the use of the mask pattern, or the like.

As shown in FIG. 26A, a base film 26102 is formed over a substrate 26101, and a semiconductor layer is formed thereover. The semiconductor layer includes a channel forming region 26103 and an impurity region 26105 functioning as a source or drain region, which are in a driving transistor 26118, and a channel forming region 26106, a low concentration impurity region 26107, and an impurity region 26108 functioning as a lower electrode, which are in a capacitor 26119. Note that channel doping may be performed to the channel forming regions 26103 and 26106.

As the substrate, a glass substrate, a quartz substrate, a ceramic substrate, a plastic substrate, or the like can be used. The base film 26102 can be formed using a single layer of aluminum nitride (AlN), silicon oxide ($SiO_2$), silicon oxynitride ($SiO_xN_y$), or the like, or stacked layers thereof.

A gate electrode 26110 and an upper electrode 26111 of the capacitor are formed over the semiconductor layer with a gate insulating film 26109 interposed therebetween.

An interlayer insulating film 26112 is formed so as to cover the driving transistor 26118 and the capacitor 26119. Then, a contact hole is formed in the interlayer insulating film 26112, through which a wire 26113 is in contact with the impurity region 26105. A pixel electrode 26114 is formed in contact with the wire 26113, and an interlayer insulator 26115 is formed so as to cover end portions of the pixel electrode 26114 and the wire 26113. Here, the interlayer insulator 26115 is formed with a positive photosensitive acrylic resin film. Then, a layer 26116 containing an organic compound and an opposed electrode 26117 are formed over the pixel electrode 26114. Thus, a light emitting element 26120 corresponds to a region where the layer 26116 containing an organic compound is interposed between the pixel electrode 26114 and the opposed electrode 26117.

In addition, as shown in FIG. 26B, a low concentration impurity region 26202 may be provided so as to overlap the upper electrode 26111 in the low concentration impurity region 26107 which form a part of the lower electrode of the capacitor 26119. That is, the lower electrode of the capacitor 26119 is formed with a channel forming region 26201, the low concentration impurity regions 26202 and 26107, and an impurity region 26108. Note that common portions to those in FIG. 26A are denoted by the same reference numerals, and description thereof is omitted.

In addition, as shown in FIG. 27A, a second upper electrode 26301 may be provided, which is formed in the same layer as the wire 26113 in contact with the impurity region 26105 of the driving transistor 26118. Note that common portions to those in FIG. 26A are denoted by the same reference numerals, and description thereof is omitted. A second capacitor is formed by interposing the interlayer insulating film 26112 between the second upper electrode 26301 and the upper electrode 26111. In addition, since the second upper electrode 26301 is in contact with the impurity region 26108, a first capacitor having such a structure that the gate insulating film 26109 is interposed between the upper electrode 26111 and the channel forming region 26106, and the second capacitor having such a structure that the interlayer insulating film 26112 is interposed between the upper electrode 26111 and the second upper electrode 26301 are connected in parallel, so that a capacitor 26302 having the first and second capacitors is obtained. Since the capacitor 26302 has a total capacitance of those of the first and second capacitors, the capacitor having a large capacitance can be formed in a small area. That is, using the capacitor in the pixel structure of the invention will lead to a further improved aperture ratio.

Alternatively, a structure of a capacitor as shown in FIG. 27B may be adopted. A base film 27102 is formed over a substrate 27101, and a semiconductor layer is formed thereover. The semiconductor layer includes a channel forming region 27103 and an impurity region 27105 to function as a source or drain region of a driving transistor 27118. Note that channel doping may be performed to the channel forming region 27103.

As the substrate, a glass substrate, a quartz substrate, a ceramic substrate, a plastic substrate, or the like can be used. The base film 27102 can be formed using a single layer of aluminum nitride (AlN), silicon oxide ($SiO_2$), silicon oxynitride ($SiO_xN_y$), or the like or stacked layers thereof.

A gate electrode 27107 and a first electrode 27108 are formed over the semiconductor layer with a gate insulating film 27106 interposed therebetween.

A first interlayer insulating film 27109 is formed so as to cover the driving transistor 27118 and the first electrode 27108. Then, a contact hole is formed in the first interlayer insulating film 27109, through which a wire 27110 is in contact with the impurity region 27105. In addition, a second electrode 27111 is formed in the same layer and with the same material as the wire 27110.

Furthermore, a second interlayer insulating film 27112 is formed so as to cover the wire 27110 and the second electrode 27111. Then, a contact hole is formed in the second interlayer insulating film 27112, through which a pixel electrode 27113 is formed in contact with the wire 27110. A third electrode 27114 is formed in the same layer and with the same material as the pixel electrode 27113. Here, a capacitor 27119 is formed of the first electrode 27108, the second electrode 27111, and the third electrode 27114.

An insulator 27115 is formed so as to cover an end portion of the pixel electrode 27113 and the third electrode 27114, over which a layer 27116 containing an organic compound and an opposed electrode 27117 are formed. Then, a light emitting element 27120 corresponds to a region where the layer 27116 containing an organic compound is interposed between the pixel electrode 27113 and the opposed electrode 27117.

As described above, each of the structures shown in FIGS. 26A and 26B and FIGS. 27A and 27B can be given as a structure of a transistor using a crystalline semiconductor film for its semiconductor layer. Note that the transistors having the structures shown in FIGS. 26A and 26B and FIGS. 27A and 27B are examples of transistors with a top-gate structure. That is, the transistor may be either a p-channel transistor or an n-channel transistor. In the case where the transistor is an n-channel transistor, the LDD region may be formed either so as to overlap the gate electrode or not to overlap, or a part of the LDD region may be formed so as to overlap the gate electrode. Further, the gate electrode may have a tapered shape and the LDD region may be provided below the tapered portion of the gate electrode in a self-aligned manner. In addition, the number of gate electrodes is not limited to two, and a multi-gate structure with three or more gate electrodes may be employed, or a single gate structure may also be employed.

By using a crystalline semiconductor film for a semiconductor layer (channel forming region, source region, drain region, or the like) of a transistor included in the pixel of the invention, for example, it becomes easier to form the scan line driver circuit 402 and the signal line driver circuit 401 over the same substrate as the pixel portion 403 in FIG. 4.

Next, as a structure of a transistor which uses polysilicon (p-Si) for its semiconductor layer, FIG. 30A shows a partial cross-sectional view of a display panel using a transistor which has a structure where a gate electrode is interposed between a substrate and a semiconductor layer, that is, a transistor with a bottom-gate structure where a gate electrode is located below a semiconductor layer.

A base film 3002 is formed over a substrate 3001. Then, a gate electrode 3003 is formed over the base film 3002. A first electrode 3004 is formed in the same layer and with the same material as the gate electrode. As a material of the gate electrode 3003, polycrystalline silicon to which phosphorus is added can be used. Besides polycrystalline silicon, silicide which is a compound of metal and silicon may be used.

Then, a gate insulating film 3005 is formed so as to cover the gate electrode 3003 and the first electrode 3004. As the gate insulating film 3005, a silicon oxide film, a silicon nitride film, or the like is used.

A semiconductor layer is formed over the gate insulating film 3005. The semiconductor layer includes a channel forming region 3006, an LDD region 3007, and an impurity region 3008 functioning as a source or drain region, which are in a driving transistor 3022, and a channel forming region 3009, an LDD region 3010, and an impurity region 3011, which function as a second electrode of a capacitor 3023. Note that channel doping may be performed to the channel forming regions 3006 and 3009.

As the substrate, a glass substrate, a quartz substrate, a ceramic substrate, a plastic substrate, or the like can be used. The base film 3002 can be formed using a single layer of aluminum nitride (AlN), silicon oxide ($SiO_2$), silicon oxynitride ($SiO_xN_y$), or the like or stacked layers thereof.

A first interlayer insulating film 3012 is formed so as to cover the semiconductor layer. Then, a contact hole is formed in the first interlayer insulating film 3012, through which a wire 3013 is in contact with the impurity region 3008. A third electrode 3014 is formed in the same layer and with the same material as the wire 3013. The capacitor 3023 is formed with the first electrode 3004, the second electrode, and the third electrode 3014.

In addition, an opening portion 3015 is formed in the first interlayer insulating film 3012. A second interlayer insulating film 3016 is formed so as to cover the driving transistor 3022, the capacitor 3023, and the opening portion 3015. Then, a contact hole is formed in the second interlayer insulating film 3016, through which a pixel electrode 3017 is formed. Then, an insulator 3018 is formed so as to cover end portions of the pixel electrode 3017. For example, a positive photosensitive acrylic resin film can be used. Subsequently, a layer 3019 containing an organic compound and an opposed electrode 3020 are formed over the pixel electrode 3017. Thus, a light emitting element 3021 corresponds to a region where the layer 3019 containing an organic compound is interposed between the pixel electrode 3017 and the opposed electrode 3020. The opening portion 3015 is located below the light emitting element 3021. That is, in the case where light emitted from the light emitting element 3021 is extracted from the substrate side, the transmittance can be improved due to the existence of the opening portion 3015.

Furthermore, a fourth electrode 3024 may be formed in the same layer and with the same material as the pixel electrode 3017 in FIG. 30A so as to obtain a structure shown in FIG. 30B. In this case, a capacitor 3025 can be formed with the first electrode 3004, the second electrode, the third electrode 3014, and the fourth electrode 3024.

Next, description is made of the case of using an amorphous silicon (a-Si:H) film as a semiconductor layer of a transistor. FIGS. 31A and 31B show cases of a top-gate transistor, and FIGS. 32A, 32B, 30A, and 30B show cases of a bottom-gate transistor.

FIG. 31A shows a cross sectional view of a transistor having a forward staggered structure, which uses amorphous silicon for its semiconductor layer. A base film 3102 is formed over a substrate 3101. Further, a pixel electrode 3103 is formed over the base film 3102. In addition, a first electrode 3104 is formed in the same layer and with the same material as the pixel electrode 3103.

As the substrate, a glass substrate, a quartz substrate, a ceramic substrate, a plastic substrate, or the like can be used. The base film 3102 can be formed using a single layer of aluminum nitride (AlN), silicon oxide ($SiO_2$), silicon oxynitride ($SiO_xN_y$), or the like or stacked layers thereof.

Wires 3105 and 3106 are formed over the base film 3102, and an end portion of the pixel electrode 3103 is covered with the wire 3105. N-type semiconductor layers 3107 and 3108 each having N-type conductivity are formed over the wires 3105 and 3106 respectively. In addition, a semiconductor layer 3109 is formed between the wires 3105 and 3106 and over the base film 3102, which is partially extended so as to cover the N-type semiconductor layers 3107 and 3108. Note that this semiconductor layer is formed with an amorphous semiconductor film such as an amorphous silicon (a-Si:H) film or a microcrystalline semiconductor (μ-Si:H) film. Then, a gate insulating film 3110 is formed over the semiconductor layer 3109, and an insulating film 3111 is formed in the same layer and with the same material as the gate insulating film 3110, and also over the first electrode 3104. Note that as the gate insulating film 3110, a silicon oxide film, a silicon nitride film, or the like is used.

A gate electrode 3112 is formed over the gate insulating film 3110. In addition, a second electrode 3113 is formed in the same layer and with the same material as the gate electrode, and over the first electrode 3104 with the insulating film 3111 interposed therebetween. A capacitor 3119 corresponds to a region where the insulating film 3111 is interposed between the first electrode 3104 and the second electrode 3113. An insulator 3114 is formed so as to cover end portions of the pixel electrode 3103, the driving transistor 3118, and the capacitor 3119.

A layer 3115 containing an organic compound and an opposed electrode 3116 are formed over the insulator 3114 and the pixel electrode 3103 located in an opening portion of the insulator 3114. Thus, a light emitting element 3117 corresponds to a region where the layer 3115 containing an organic compound is interposed between the pixel electrode 3103 and the opposed electrode 3116.

The first electrode 3104 shown in FIG. 31A may be formed like a first electrode 3120 as shown in FIG. 31B. The first electrode 3120 is formed in the same layer and with the same material as the wires 3105 and 3106.

FIGS. 32A and 32B are partial cross-sectional views of a display panel having a bottom-gate transistor which uses amorphous silicon as its semiconductor layer.

A base film 3202 is formed over a substrate 3201. A gate electrode 3203 and a first electrode 3204 formed in the same layer and with the same material over the base film 3202. As a material of the gate electrode 3203, polycrystalline silicon to which phosphorus is added can be used. Besides polycrystalline silicon, silicide which is a compound of metal and silicon may be used.

Then, a gate insulating film 3205 is formed so as to cover the gate electrode 3203 and the first electrode 3204. As the gate insulating film 3205, a silicon oxide film, a silicon nitride film, or the like is used.

A semiconductor layer 3206 is formed over the gate insulating film 3205. In addition, a semiconductor layer 3207 is formed in the same layer and with the same material as the semiconductor layer 3206.

As the substrate, a glass substrate, a quartz substrate, a ceramic substrate, a plastic substrate, or the like can be used. The base film 3202 can be formed using a single layer of aluminum nitride (AlN), silicon oxide ($SiO_2$), silicon oxynitride ($SiO_xN_y$), or the like or stacked layers thereof.

N-type semiconductor layers 3208 and 3209 having N-type conductivity are formed over the semiconductor layer 3206, and an N-type semiconductor layer 3210 is formed over the semiconductor layer 3207.

Wires 3211 and 3212 are formed over the N-type semiconductor layers 3208 and 3209 respectively, and a conductive layer 3213 is formed in the same layer and with the same material as the wires 3211 and 3212, over the N-type semiconductor layer 3210.

Thus, a second electrode is formed with the semiconductor layer 3207, the N-type semiconductor layer 3210, and the conductive layer 3213. Note that a capacitor 3220 having a structure where the gate insulating film 3205 is interposed between the second electrode and the first electrode 3204 is formed.

One end portion of the wire 3211 is extended, and a pixel electrode 3214 is formed so as to be in contact with an upper portion of the extended wire 3211.

In addition, an insulator 3215 is formed so as to cover end portions of the pixel electrode 3214, a driving transistor 3219, and the capacitor 3220.

Then, a layer 3216 containing an organic compound and an opposed electrode 3217 are formed over the pixel electrode 3214 and the insulator 3215. A light emitting element 3218 corresponds to a region where the layer 3216 containing an organic compound is interposed between the pixel electrode 3214 and the opposed electrode 3217.

The semiconductor layer 3207 and the N-type semiconductor layer 3210 to be a part of the second electrode of the capacitor are not necessarily required. That is, the second electrode may be the conductive layer 3213, so that the capacitor may have such a structure that the gate insulating film is interposed between the first electrode 3204 and the conductive layer 3213.

Note that the pixel electrode 3214 is formed before forming the wire 3211 in FIG. 32A, thereby a capacitor 3222 as shown in FIG. 32B can be obtained, which has a structure where the gate insulating film 3205 is interposed between the first electrode 3204 and a second electrode 3221 formed of the pixel electrode 3214.

Although FIGS. 32A and 32B show inverted staggered channel-etched transistors, a channel-protective transistor may be used. Description of channel-protective transistors is made with reference to FIGS. 33A and 33B.

Figure 33A:
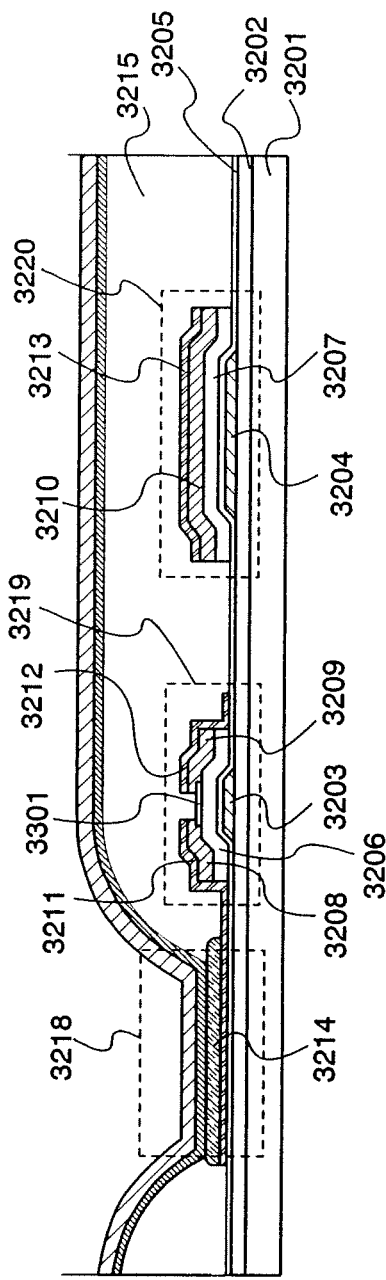
FIGS. 33A and 33B are diagrams showing structures of a transistor and a capacitor applicable to a pixel of the invention.

A channel-protective transistor shown in FIG. 33A is different from the channel-etched driving transistor 3219 shown in FIG. 32A in that an insulator 3301 functioning as an etching mask is provided over the channel forming region in the semiconductor layer 3206. Common portions except that point are denoted by the same reference numerals.

Figure 33B:
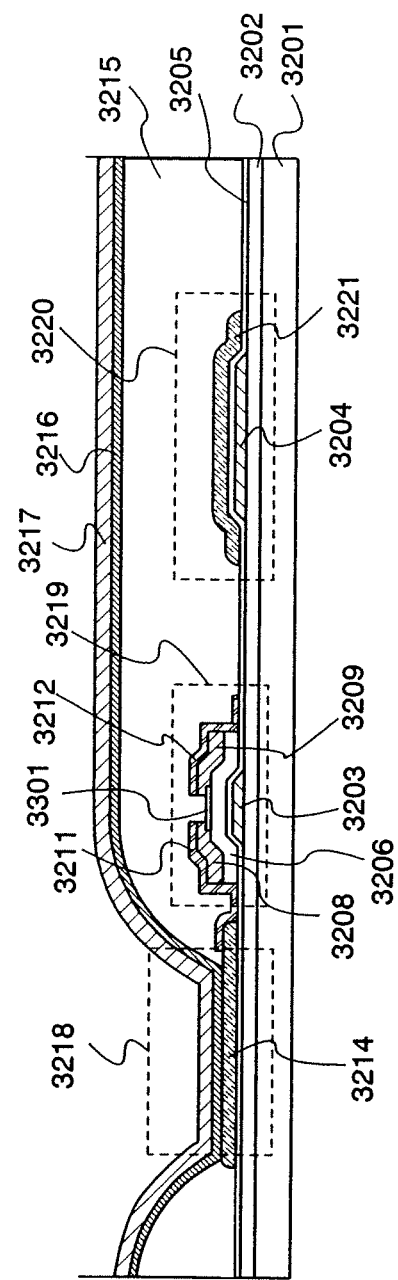

Similarly, a channel-protective transistor shown in FIG. 33B is different from the channel-etched driving transistor 3219 shown in FIG. 32B in that the insulator 3301 functioning as an etching mask is provided over the channel forming region in the semiconductor layer 3206. Common portions except that point are denoted by the same reference numerals.

By using an amorphous semiconductor film as a semiconductor layer (channel forming region, source region, drain region, and the like) of a transistor included in the pixel of the invention, the manufacturing cost can be reduced. For example, an amorphous semiconductor film can be applied by using the pixel structure shown in FIG. 2, Note that structures of the transistors and capacitors to which the pixel structure of the invention can be applied are not limited to those described above, and various structures of transistors and capacitors can be used.

Embodiment Mode 7

The display device of the invention can be applied to various electronic appliances, specifically a display portion of electronic appliances. The electronic appliances include cameras such as a video camera and a digital camera, a goggle-type display, a navigation system, an audio reproducing device (car audio component stereo, audio component stereo, or the like), a computer, a game machine, a portable information terminal (mobile computer, mobile phone, mobile game machine, electronic book, or the like), an image reproducing device having a recording medium (specifically, a device for reproducing a recording medium such as a digital versatile disc (DVD) and having a display for displaying the reproduced image) and the like.

FIG. 34A shows a display which includes a housing 34001, a supporting base 34002, a display portion 34003, a speaker portion 34004, a video inputting terminal 34005, and the like. A display device having the pixel structure of the invention can be used for the display portion 34003. Note that the display includes all display devices for displaying information such as for a personal computer, receiving television broadcasting, and displaying an advertisement. A display using the display device having the pixel structure of the invention for the display portion 34003 can reduce power consumption and prevent a display defect. Further, cost reduction can be achieved.

In recent years, the need to grow in size of a display has been increased. In accordance with the enlargement of a display, rise in price becomes a problem. Therefore, it is an object to reduce the manufacturing cost as much as possible and a high quality product is provided at as low price as possible.

For example, by applying the pixel structure of FIG. 2, FIG. 11, or the like to a pixel portion of a display panel, a display panel formed with unipolar transistors can be provided. Therefore, manufacturing steps can be reduced, which leads to reduction in the manufacturing cost.

In addition, by forming the pixel portion and the peripheral driver circuit over the same substrate as shown in FIG. 22A, the display panel can be constituted by circuits including unipolar transistors.

In addition, by using an amorphous semiconductor (such as amorphous silicon (a-Si:H)) as a semiconductor layer of a transistor in a circuit constituting the pixel portion, manufacturing steps can be simplified and further cost reduction can be realized. In this case, it is preferable that a driver circuit in the periphery of the pixel portion be formed into an IC chip and mounted on the display panel by COG or the like as shown in FIGS. 28B and 29A. In this manner, by using an amorphous semiconductor, it becomes easy to grow in size of the display.

FIG. 34B shows a camera which includes a main body 34101, a display portion 34102, an image receiving portion 34103, operating keys 34104, an external connection port 34105, a shutter 34106, and the like.

In recent years, in accordance with advance in performance of a digital camera and the like, competitive manufacturing thereof has been intensified. Thus, it is important to provide a higher-performance product at as low price as possible. A digital camera using a display device having a pixel structure of the invention for the display portion 34102 can reduce power consumption and prevent a display defect. Further, cost reduction can be achieved.

By using the pixel structure of FIG. 2 or FIG. 11 for the pixel portion, the pixel portion can be constituted by unipolar transistors. In addition, as shown in FIG. 28A, by forming a signal line driver circuit whose operating speed is high into an IC chip, and forming a scan line driver circuit whose operating speed is relatively low with a circuit constituted by unipolar transistors over the same substrate as the pixel portion, higher performance can be realized and cost reduction can be achieved. In addition, by using an amorphous semiconductor such as amorphous silicon for a semiconductor layer of a transistor in the pixel portion and the scan line driver circuit formed over the same substrate as the pixel portion, further cost reduction can be achieved.

FIG. 34C shows a computer which includes a main body 34201, a housing 34202, a display portion 34203, a keyboard 34204, an external connection port 34205, a pointing mouse 34206, and the like. A computer using a display device having the pixel structure of the invention for the display portion 34203 can reduce power consumption and prevent a display defect. Further, cost reduction can be achieved.

FIG. 34D shows a mobile computer which includes a main body 34301, a display portion 34302, a switch 34303, operating keys 34304, an infrared port 34305, and the like. A mobile computer using a display device having a pixel structure of the invention for the display portion 34302 can reduce power consumption and prevent a display defect. Further, cost reduction can be achieved.

FIG. 34E shows a portable image reproducing device having a recording medium (specifically, a DVD reproducing device), which includes a main body 34401, a housing 34402, a display portion A 34403, a display portion B 34404, a recording medium (DVD or the like) reading portion 34405, an operating key 34406, a speaker portion 34407, and the like. The display portion A 34403 mainly displays image data and the display portion B 34404 mainly displays text data. An image reproducing device using a display device having a pixel structure of the invention for the display portions A 34403 and B 34404 can reduce power consumption and prevent a display defect. Further, cost reduction can be achieved.

FIG. 34F shows a goggle-type display which includes a main body 34501, a display portion 34502, and an arm portion 34503. A goggle type display using a display device having a pixel structure of the invention for the display portion 34502 can reduce power consumption and prevent a display defect. Further, cost reduction can be achieved.

FIG. 34G shows a video camera which includes a main body 34601, a display portion 34602, a housing 34603, an external connection port 34604, a remote control receiving portion 34605, an image receiving portion 34606, a battery 34607, an audio input portion 34608, operating keys 34609, an eye piece portion 34610, and the like. A video camera using a display device having a pixel structure of the invention for the display portion 34602 can reduce power consumption and prevent a display defect. Further, cost reduction can be achieved.

FIG. 34H shows a mobile phone which includes a main body 34701, a housing 34702, a display portion 34703, an audio inputting portion 34704, an audio outputting portion 34705, operating keys 34706, an external connection port 34707, an antenna 34708, and the like.

In recent years, a mobile phone has been provided with a game function, a camera function, an electronic money function, or the like, and the need of a high-value added mobile phone has been increased. Further, a high-definition display has been demanded. A mobile phone using a display device having the pixel structure of the invention for the display portion 34703 can reduce power consumption and prevent a display defect. Further, an aperture ratio of a pixel is increased, and high definition display can be performed. In addition, cost reduction can be achieved.

For example, by applying the pixel structure of FIG. 2 for the pixel portion, an aperture ratio of a pixel can be improved. Specifically, by using an n-channel transistor as a driving transistor for driving a light emitting element, the aperture ratio of the pixel is improved. Consequently, a mobile phone having a high-definition display portion can be provided.

In addition, since the aperture ratio is improved, a high-value added mobile phone having a high-definition display portion can be provided by using the display device having a dual emission structure as shown in FIG. 24C for the display portion.

While a mobile phone has been multifunctional and frequency of use thereof has been increased, the life per charge has been required to be long.

For example, by forming a peripheral driver circuit into an IC chip as shown in FIG. 28B and FIG. 29A and using a CMOS or the like, power consumption can be reduced.

Thus, the invention can be applied to various electronic appliances.

Embodiment Mode 8

Figure 37:
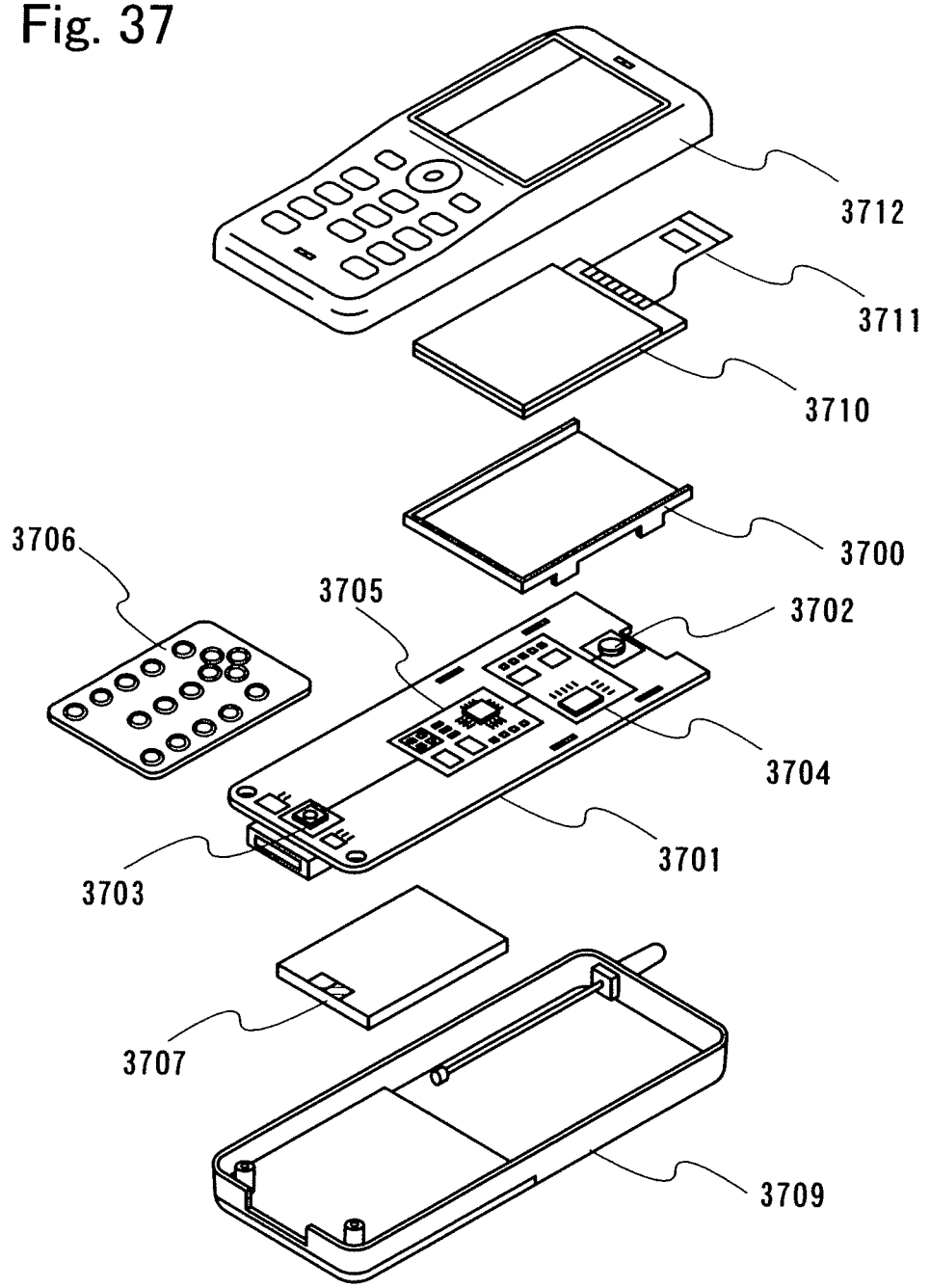
FIG. 37 is a view showing an example of a structure of a mobile phone.

In this embodiment mode, description is made with reference to FIG. 37 of an example of a structure of a mobile phone which has a display portion having a display device using a pixel structure of the invention.

A display panel 3710 is incorporated in a housing 3700 so as to be freely attached and detached. The shape and size of the housing 3700 can be appropriately changed in accordance with the size of the display panel 3710. The housing 3700 provided with the display panel 3710 is fitted in a printed circuit board 3701 so as to be assembled as a module.

The display panel 3710 is connected to the printed circuit board 3701 through an FPC 3711. A speaker 3702, a microphone 3703, a transmitting and receiving circuit 3704, and a signal processing circuit 3705 including a CPU, a controller, and the like are formed over the printed circuit board 3701. Such a module, an inputting means 3706, and a battery 3707 are combined, which is stored in a housing 3709. A pixel portion of the display panel 3710 is disposed so as to be seen from an opening window formed in the housing 3709.

The display panel 3710 may be formed by forming a pixel portion and a part of peripheral driver circuits (a driver circuit whose operation frequency is low among a plurality of driver circuits) using TFTs over the same substrate; forming a part of the peripheral driver circuits (a driver circuit whose operation frequency is high among the plurality of driver circuits) into an IC chip; and mounting the IC chip on the display panel 3710 by COG (Chip On Glass). The IC chip may be, alternatively, connected to a glass substrate by using TAB (Tape Automated Bonding) or a printed circuit board. It is to be noted that FIG. 28A shows an example of structure of such a display panel that a part of peripheral driver circuits is formed over the same substrate as a pixel portion and an IC chip provided with the other part of the peripheral driver circuits is mounted by COG or the like. By employing the above-described structure, power consumption of a display device can be reduced and the life per charge of a mobile phone can be made long. In addition, cost reduction of the mobile phone can be achieved.

To the pixel portion, the pixel structures described in Embodiment Modes 1 to 4 can be appropriately applied.

For example, by applying the pixel structure of FIG. 2 described in Embodiment Mode 1 or the pixel structure of FIG. 11 described in Embodiment Mode 3, the manufacturing steps can be reduced. That is to say, the pixel portion and the peripheral driver circuit formed over the same substrate as the pixel portion are constituted by unipolar transistors in order to achieve cost reduction.

In addition, in order to further reduce the power consumption, the pixel portion may be formed using TFTs over a substrate, all of the peripheral driver circuits may be formed into an IC chip, and the IC chip may be mounted on the display panel by COG (Chip On Glass) or the like as shown in FIGS. 28B and 29A. The pixel structure of FIG. 2 is used for the pixel portion and an amorphous semiconductor film is used for a semiconductor layer of a transistor, thereby reducing manufacturing cost.

It is to be noted that the structure described in this embodiment mode is an example of a mobile phone, and the pixel structure of the invention can be applied not only to a mobile phone having the above-described constitution but also to mobile phones having various structures.

Embodiment Mode 9

Figure 35:
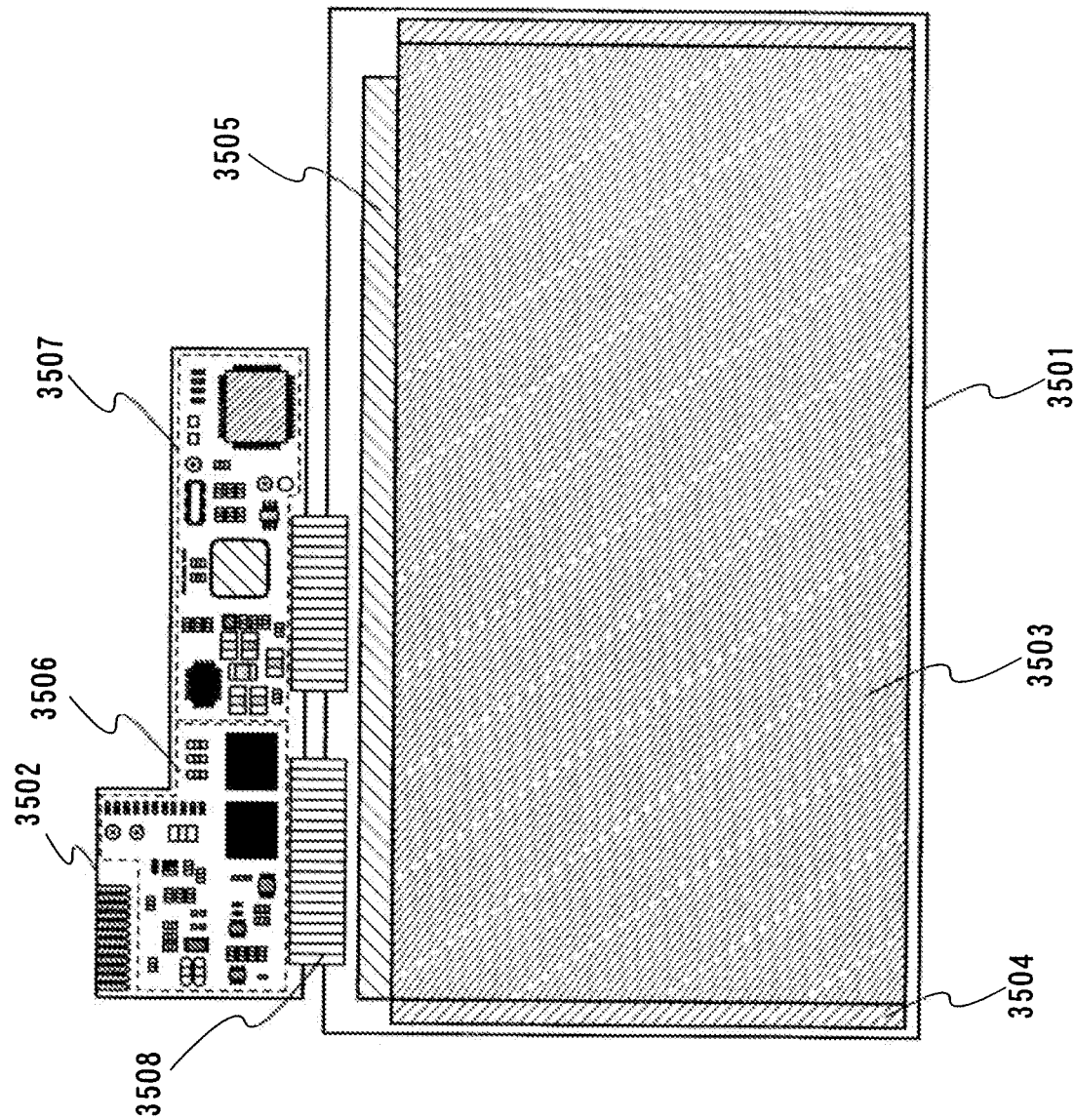
FIG. 35 is a view showing an example of an EL module.

FIG. 35 shows an EL module combining a display panel 3501 and a circuit board 3502. The display panel 3501 includes a pixel portion 3503, a scan line driver circuit 3504, and a signal line driver circuit 3505. A control circuit 3506, a signal dividing circuit 3507, and the like are formed over the circuit board 3502. The display panel 3501 and the circuit board 3502 are connected to each other by a connecting wire 3508. As the connecting wire, an FPC or the like can be used.

The display panel 3501 may be formed by forming a pixel portion and a part of peripheral driver circuits (a driver circuit whose operation frequency is low among a plurality of driver circuits) using TFTs over the same substrate; forming a part of the peripheral driver circuits (a driver circuit whose operation frequency is high among the plurality of driver circuits) into an IC chip; and mounting the IC chip on the display panel 3501 by COG (Chip On Glass) or the like. The IC chip may be, alternatively, mounted on the display panel 3501 by using TAB (Tape Automated Bonding) or a printed circuit board. It is to be noted that FIG. 28A shows an example of structure where a part of peripheral driver circuits is formed over the same substrate as a pixel portion and an IC chip provided with the other part of the peripheral driver circuits is mounted by COG or the like.

In the pixel portion, the pixel structures described in Embodiment Modes 1 to 4 can be appropriately applied.

For example, by applying the pixel structure of FIG. 2 described in Embodiment Mode 1 or the pixel structure of FIG. 11 described in Embodiment Mode 3, the manufacturing steps can be reduced. That is to say, the pixel portion and the peripheral driver circuit formed over the same substrate as the pixel portion are constituted by unipolar transistors in order to achieve cost reduction.

In addition, in order to further reduce the power consumption, the pixel portion may be formed using TFTs over a glass substrate, all of the peripheral driver circuits may be formed into an IC chip, and the IC chip may be mounted on the display panel by COG (Chip On Glass) or the like.

In addition, by applying the pixel structure shown in FIG. 2 of Embodiment Mode 1, pixels can be constituted only by n-channel transistors, so that an amorphous semiconductor (such as amorphous silicon) can be applied to a semiconductor layer of a transistor. That is, a large display device where it is difficult to form an even crystalline semiconductor film can be manufactured. Further, by using an amorphous semiconductor film for a semiconductor layer of a transistor constituting a pixel, the manufacturing steps can be reduced and reduction in the manufacturing cost can be achieved.

It is preferable that, in the case where an amorphous semiconductor film is applied to a semiconductor layer of a transistor constituting a pixel, the pixel portion be formed using TFTs over a substrate, all of the peripheral driver circuits be formed into an IC chip, and the IC chip be mounted on the display panel by COG (Chip On Glass). Note that FIG. 28B shows an example of the structure where a pixel portion is formed over a substrate and an IC chip provided with a peripheral driver circuit is mounted on the substrate by COG or the like.

Figure 36:
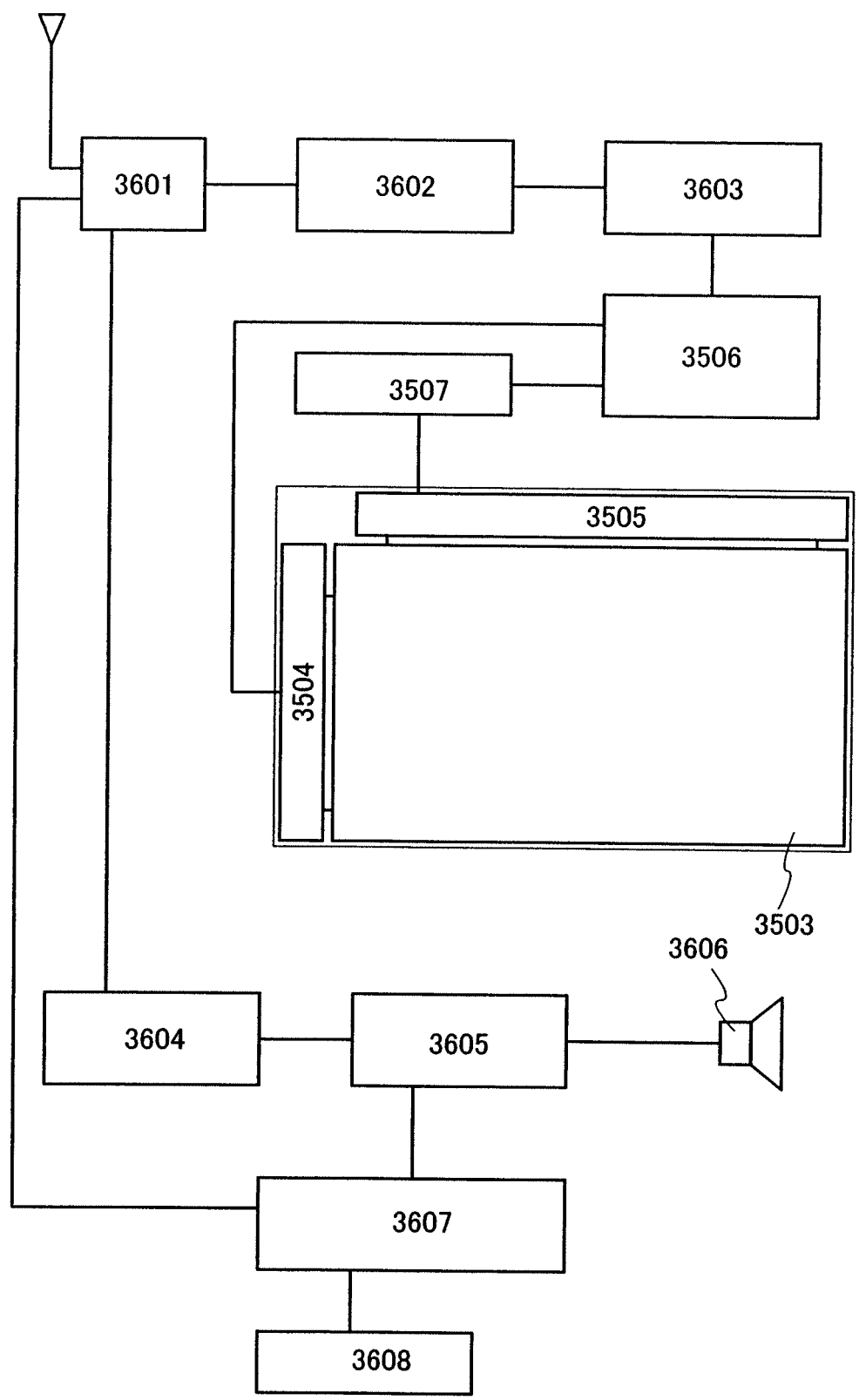
FIG. 36 is a block diagram showing a main structure of an EL television receiver.

An EL television receiver can be completed with the above-described EL module. FIG. 36 is a block diagram showing a main structure of an EL television receiver. A tuner 3601 receives a video signal and an audio signal. The video signals are processed by a video signal amplifier circuit 3602, a video signal processing circuit 3603 for converting a signal outputted from the video signal amplifier circuit 3602 into a color signal corresponding to each color of red, green and blue, and the control circuit 3506 for converting the video signal into the input specification of a driver circuit. The control circuit 3506 outputs a signal to each of the scan line side and the signal line side. In the case of driving in a digital manner, a structure where the signal dividing circuit 3507 is provided on the signal line side to supply an input digital signal by dividing into m signals may be employed.

An audio signal received by the tuner 3601 is transmitted to an audio signal amplifier circuit 3604, an output thereof is supplied to a speaker 3606 through an audio signal processing circuit 3605. A control circuit 3607 receives receiving station (received frequency) and volume control data from an input portion 3608, and transmits signals to the tuner 3601 and the audio signal processing circuit 3605.

By incorporating the EL module shown in FIG. 35 into the housing 34001, a TV receiver can be completed as shown in FIG. 34A. The display portion 34003 is constituted by the EL module. In addition, the speaker portion 34004, the video inputting terminal 34005, and the like are provided appropriately.

It is needless to say that the invention can also be applied to various appliances other than the TV receiver, such as a monitor of a personal computer, and in particular a large display medium such as an information display panel at the station or the airport, and an advertisement board on the street.

This application is based on Japanese Patent Application serial no. 2005-191145 filed in Japan Patent Office on 30 Jun. 2005, the entire contents of which are hereby incorporated by reference.

What is claimed is:
1. A display device comprising:
a light emitting element;
a first transistor;
a second transistor;
a third transistor;
a fourth transistor;
a capacitor;
a first wiring;
a second wiring; and
a third wiring,
wherein one of a source and a drain of the first transistor is directly connected to a pixel electrode of the light emitting element,
wherein the other of the source and the drain of the first transistor is directly connected to the first wiring,
wherein a first electrode of the capacitor is directly connected to a gate of the first transistor,
wherein a second electrode of the capacitor is directly connected to the one of the source and the drain of the first transistor,
wherein one of a source and a drain of the second transistor is directly connected to the gate of the first transistor,
wherein the other of the source and the drain of the second transistor is connected to the second wiring,
wherein one of a source and a drain of the third transistor is directly connected to the light emitting element,
wherein the other of the source and the drain of the third transistor is connected to the third wiring,
wherein one of a source and a drain of the fourth transistor is directly connected to the gate of the first transistor, and
wherein a semiconductor layer comprises a channel formation region of the first transistor and the second electrode of the capacitor.
2. The display device according to claim 1,
wherein the first wiring is a power source line,
wherein the second wiring is a bias line, and
wherein the third wiring is a signal line.

3. The display device according to claim 1,
wherein the other of the source and the drain of the fourth transistor is connected to an opposed electrode of the light emitting element.

4. The display device according to claim 1,
wherein a gate of the second transistor and a gate of the third transistor are connected to a same scan line.

5. The display device according to claim 1,
wherein the other of the source and the drain of the second transistor is directly connected to the second wiring.

6. The display device according to claim 1,
wherein the other of the source and the drain of the third transistor is directly connected to the third wiring.

7. A display device comprising:
a light emitting element;
a first transistor;
a second transistor;
a third transistor;
a fourth transistor;
a capacitor;
a first wiring;
a second wiring; and
a third wiring,
wherein one of a source and a drain of the first transistor is directly connected to a pixel electrode of the light emitting element,
wherein the other of the source and the drain of the first transistor is directly connected to the first wiring,
wherein a first electrode of the capacitor is directly connected to a gate of the first transistor,
wherein a second electrode of the capacitor is directly connected to the one of the source and the drain of the first transistor,
wherein one of a source and a drain of the second transistor is directly connected to the gate of the first transistor,
wherein the other of the source and the drain of the second transistor is connected to the second wiring,
wherein one of a source and a drain of the third transistor is directly connected to the light emitting element,
wherein the other of the source and the drain of the third transistor is connected to the third wiring,
wherein one of a source and a drain of the fourth transistor is directly connected to the gate of the first transistor,
wherein a gate insulating film is over a semiconductor layer,
wherein a gate electrode of the first transistor and the first electrode of the capacitor over the gate insulating film,
wherein an interlayer insulating film is over the gate electrode of the first transistor and the first electrode of the capacitor,
wherein the second electrode of the capacitor is over the interlayer insulating film,
wherein the first electrode of the capacitor overlaps the semiconductor layer, and
wherein the second electrode of the capacitor is in contact with the semiconductor layer.

8. The display device according to claim 7,
wherein the first wiring is a power source line,
wherein the second wiring is a bias line, and
wherein the third wiring is a signal line.

9. The display device according to claim 7,
wherein the other of the source and the drain of the fourth transistor is connected to an opposed electrode of the light emitting element.

10. The display device according to claim 7,
wherein a gate of the second transistor and a gate of the third transistor are connected to a same scan line.

11. The display device according to claim 7,
wherein the other of the source and the drain of the second transistor is directly connected to the second wiring.

12. The display device according to claim 7,
wherein the other of the source and the drain of the third transistor is directly connected to the third wiring.

13. A display device comprising:
a light emitting element;
a first transistor;
a second transistor;
a third transistor;
a fourth transistor;
a capacitor;
a first wiring;
a second wiring; and
a third wiring,
wherein one of a source and a drain of the first transistor is directly connected to a pixel electrode of the light emitting element,
wherein the other of the source and the drain of the first transistor is directly connected to the first wiring,
wherein a first electrode of the capacitor is directly connected to a gate of the first transistor,
wherein a second electrode of the capacitor is directly connected to the one of the source and the drain of the first transistor,
wherein one of a source and a drain of the second transistor is directly connected to the gate of the first transistor,
wherein the other of the source and the drain of the second transistor is connected to the second wiring,
wherein one of a source and a drain of the third transistor is directly connected to the light emitting element,
wherein the other of the source and the drain of the third transistor is connected to the third wiring,
wherein one of a source and a drain of the fourth transistor is directly connected to the gate of the first transistor,
wherein a gate insulating film is over a semiconductor layer,
wherein a gate electrode of the first transistor and the first electrode of the capacitor over the gate insulating film,
wherein an interlayer insulating film is over the gate electrode of the first transistor and the first electrode of the capacitor,
wherein the second electrode of the capacitor is over the interlayer insulating film,
wherein the first electrode of the capacitor overlaps the semiconductor layer, and
wherein the second electrode of the capacitor is in contact with the semiconductor layer,
wherein the capacitor has a first capacitance formed by the first electrode and the second electrode and a second capacitance formed by the first electrode and a part of the semiconductor layer.

14. The display device according to claim 13,
wherein the first wiring is a power source line,
wherein the second wiring is a bias line, and
wherein the third wiring is a signal line.

15. The display device according to claim 13,
wherein the other of the source and the drain of the fourth transistor is connected to an opposed electrode of the light emitting element.

16. The display device according to claim 13,
wherein a gate of the second transistor and a gate of the third transistor are connected to a same scan line.

17. The display device according to claim 13,
wherein the other of the source and the drain of the second transistor is directly connected to the second wiring.

18. The display device according to claim 13,
wherein the other of the source and the drain of the third transistor is directly connected to the third wiring.

\* \* \* \* \*